US012578637B2

(12) United States Patent
Sreenivasan et al.

(10) Patent No.: US 12,578,637 B2
(45) Date of Patent: Mar. 17, 2026

(54) ROLL-TO-ROLL NANOIMPRINT LITHOGRAPHY TOOLS AND PROCESSES

(71) Applicant: Board of Regents, The University of Texas System, Austin, TX (US)

(72) Inventors: Sidlgata V. Sreenivasan, Austin, TX (US); Parth Pandya, Austin, TX (US); Shrawan Singhal, Austin, TX (US); Paras Ajay, Austin, TX (US); Ziam Ghaznavi, Austin, TX (US); Ovadia Abed, Austin, TX (US); Michael Watts, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 725 days.

(21) Appl. No.: 17/611,105

(22) PCT Filed: May 13, 2020

(86) PCT No.: PCT/US2020/032717
§ 371 (c)(1),
(2) Date: Nov. 12, 2021

(87) PCT Pub. No.: WO2020/232150
PCT Pub. Date: Nov. 19, 2020

(65) Prior Publication Data
US 2022/0229361 A1 Jul. 21, 2022

Related U.S. Application Data

(60) Provisional application No. 62/847,690, filed on May 14, 2019, provisional application No. 62/847,193, filed on May 13, 2019.

(51) Int. Cl.
*G03F 7/00* (2006.01)

(52) U.S. Cl.
CPC .......... *G03F 7/0002* (2013.01); *G03F 7/0005* (2013.01)

(58) Field of Classification Search
CPC ............................ G03F 7/0002; G03F 7/0005
See application file for complete search history.

(56) References Cited

U.S. PATENT DOCUMENTS 8,027,086 B2 * 9/2011 Guo ...................... B82Y 10/00
                                                359/485.05
8,187,515 B2 * 5/2012 Sreenivasan .......... G03F 7/0002
                                                425/371
(Continued)

FOREIGN PATENT DOCUMENTS

WO       2018027069 A1   2/2018

OTHER PUBLICATIONS

Dumond et al., "Recent Developments and Design Challenges in Continuous Roller Micro- and Nanoimprinting," Journal of Vacuum Science and Technology: Part B, vol. 30, No. 1, Jan./Feb. 2012, pp. 1-28.
(Continued)

*Primary Examiner* — Seyed Masoud Malekzadeh
(74) *Attorney, Agent, or Firm* — Robert A. Voigt, Jr.; Shackelford, Mckinley & Norton, LLP

(57) ABSTRACT

A method and system for configuring ultraviolet (UV)-based nanoimprint lithography (NIL) for roll-to-roll (R2R) processing, which combines the benefits of inexpensive R2R processing with the precise nanoscale patterning afforded by NIL. Furthermore, an R2R fabrication process is used to create nanoscale copper (Cu) metal mesh electrodes on flexible polycarbonate substrates and rigid quartz substrates employing jet-and-flash nanoimprint lithography (J-FIL), linear ion source etching (LIS) and selective electroless Cu metallization (ECu) using a palladium (Pd) seed layer.

8 Claims, 46 Drawing Sheets

(56) References Cited

U.S. PATENT DOCUMENTS

| | | | | |
|---|---|---|---|---|
| 9,616,614 | B2* | 4/2017 | Choi | B82Y 10/00 |
| 2004/0021254 | A1 | 2/2004 | Sreenivasan et al. | |
| 2009/0243153 | A1* | 10/2009 | Sreenivasan | B82Y 40/00 |
| | | | | 264/293 |
| 2010/0072665 | A1* | 3/2010 | Imai | G11B 5/743 |
| | | | | 264/293 |
| 2010/0121477 | A1 | 5/2010 | Jonas et al. | |
| 2011/0046764 | A1 | 2/2011 | Kan | |
| 2013/0214452 | A1* | 8/2013 | Choi | B82Y 40/00 |
| | | | | 264/293 |
| 2014/0216287 | A1* | 8/2014 | Zwadlo | G03F 7/0002 |
| | | | | 101/483 |
| 2014/0346713 | A1* | 11/2014 | Wada | B29C 59/022 |
| | | | | 264/496 |
| 2016/0077451 | A1* | 3/2016 | Nakagawa | G03F 7/0002 |
| | | | | 425/150 |
| 2017/0106399 | A1* | 4/2017 | Sreenivasan | B29D 11/00865 |
| 2017/0282439 | A1 | 10/2017 | Lu et al. | |
| 2017/0333940 | A1* | 11/2017 | Sreenivasan | B41J 2/01 |
| 2019/0043736 | A1 | 2/2019 | Daitoku et al. | |
| 2019/0361341 | A1* | 11/2019 | Fujimoto | G03F 7/0002 |

OTHER PUBLICATIONS

S. V. Sreenivasan, "Nanimprint Lithography Steppers for Volume Fabrication of Leading-Edge Semiconductor Integrated Circuits," Microsystems & Nanoengineering, Sep. 1, 2017, pp. 1-19.

Partial European Search Report for European Patent Application No. 20 805 567.3 dated May 15, 2023, pp. 1-14.

International Search Report for International Application No. PCT/US2020/032717 dated Oct. 28, 2020, pp. 1-4.

Written Opinion of the International Searching Authority for International Application No. PCT/US2020/032717 dated Oct. 28, 2020, pp. 1-8.

* cited by examiner

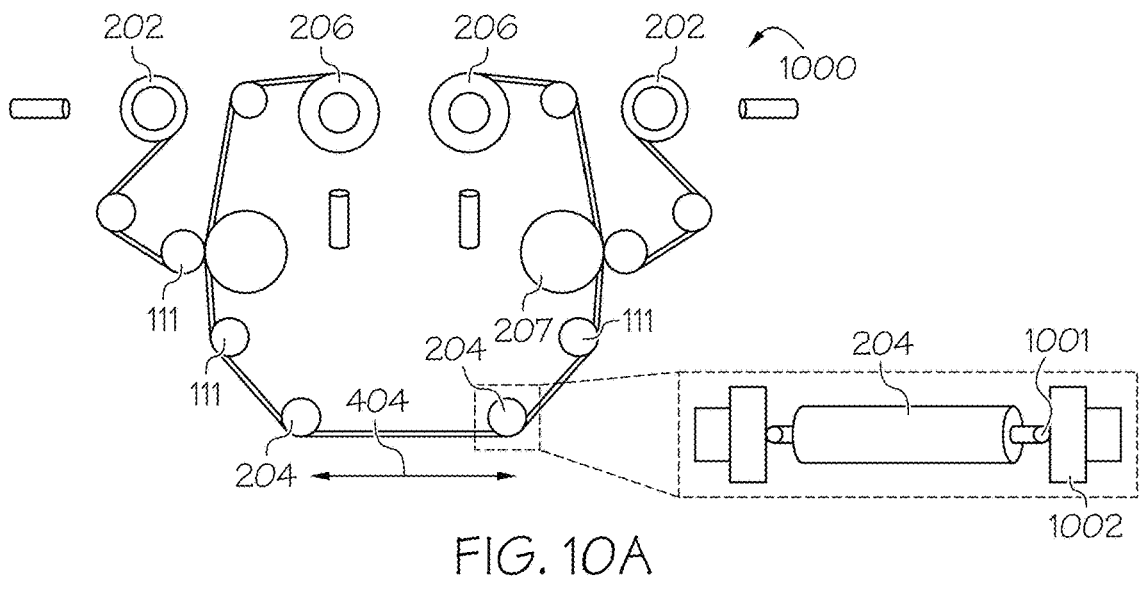
FIG. 10A
FIG. 10B
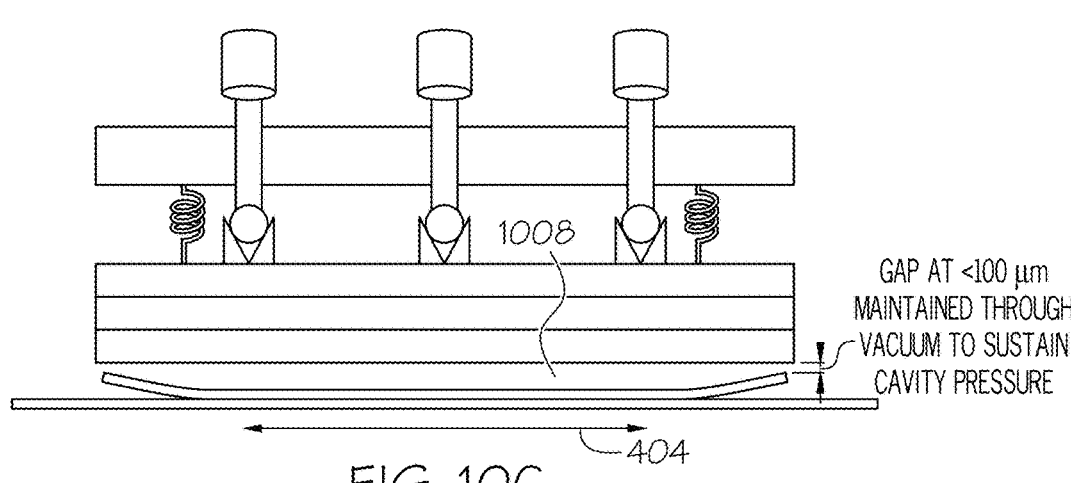
GAP AT <100 μm
MAINTAINED THROUGH
VACUUM TO SUSTAIN
CAVITY PRESSURE
FIG. 10C

1400

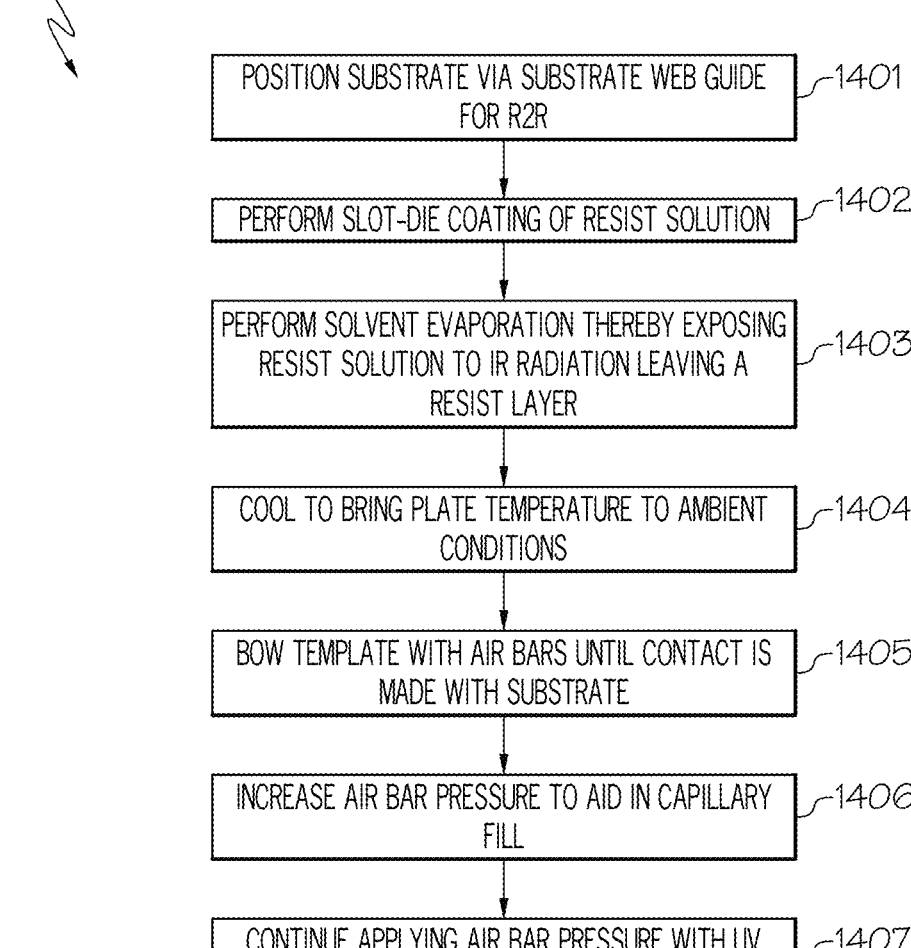

POSITION SUBSTRATE VIA SUBSTRATE WEB GUIDE FOR R2R — 1401

PERFORM SLOT-DIE COATING OF RESIST SOLUTION — 1402

PERFORM SOLVENT EVAPORATION THEREBY EXPOSING RESIST SOLUTION TO IR RADIATION LEAVING A RESIST LAYER — 1403

COOL TO BRING PLATE TEMPERATURE TO AMBIENT CONDITIONS — 1404

BOW TEMPLATE WITH AIR BARS UNTIL CONTACT IS MADE WITH SUBSTRATE — 1405

INCREASE AIR BAR PRESSURE TO AID IN CAPILLARY FILL — 1406

CONTINUE APPLYING AIR BAR PRESSURE WITH UV FLASH — 1407

RECREATE TEMPLATE BOW FOR CONTROLLED DELAMINATION — 1408

UTILIZE INLINE SPECTRAL IMAGING AND SCATTEROMETRY TO CHARACTERIZE AND QUANTIFY DEFECTS — 1409

FIG. 14

$\Delta$ T = T1-T2 (Tension Mismatch)

Tension Mismatch Handling Capability:

| L (mm) | $\Delta$T (N/m) |
|---|---|
| 30 | 750,000 |
| 200 | $5 \times 10^{6}$ |
| 300 | $7.5 \times 10^{6}$ |
| 450 | $11.25 \times 10^{6}$ |

MOIRE' PATTERNS AND ALIGNMENT BARS ON TEMPLATE

MOIRE' PATTERNS AND ALIGNMENT BARS ON SUBSTRATE

DIRECTLY VIEWED COARSE ALIGNMENT BARS

INTERFERENCE FRINGES DUE TO MOIRE' PATTERNS

IMAGE AT MICROSCOPE

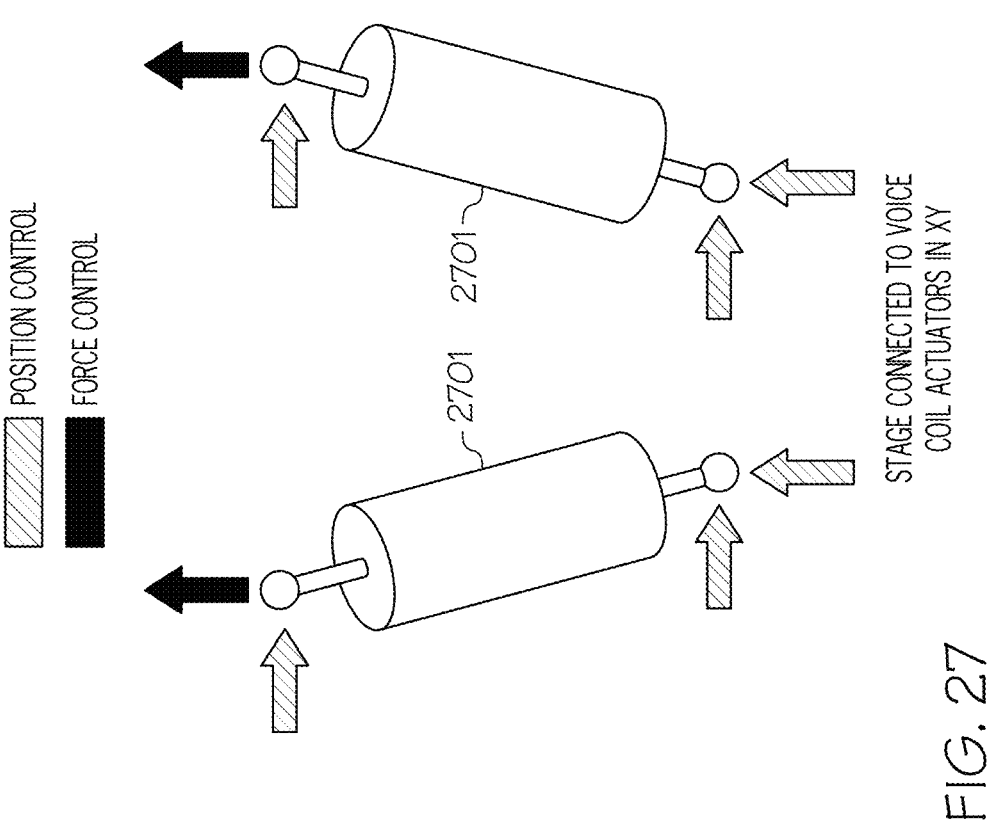
POSITION CONTROL
FORCE CONTROL
2701
2701
STAGE CONNECTED TO VOICE
COIL ACTUATORS IN XY
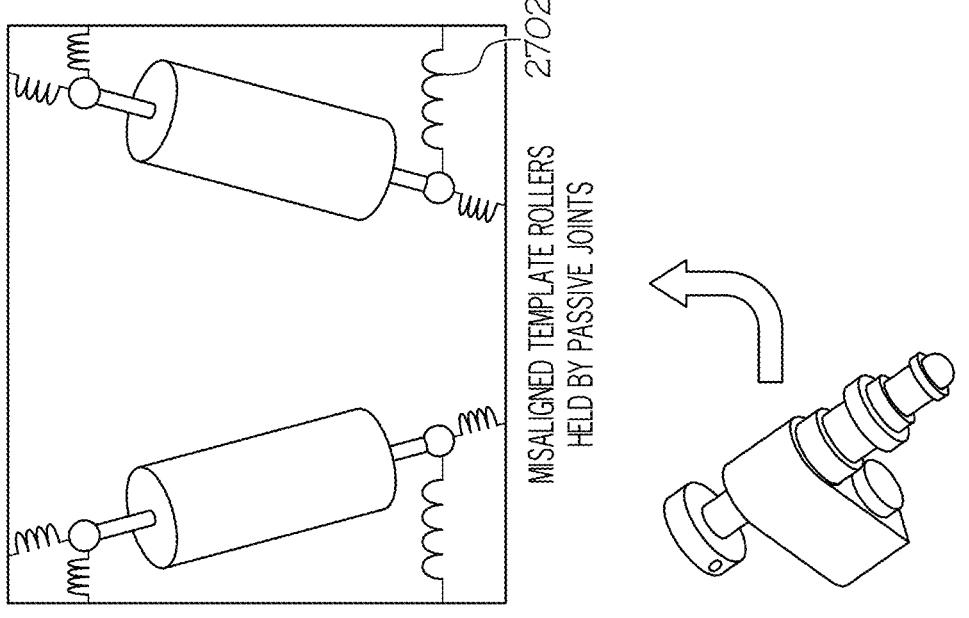
MISALIGNED TEMPLATE ROLLERS
HELD BY PASSIVE JOINTS
2702
FIG. 27

2801

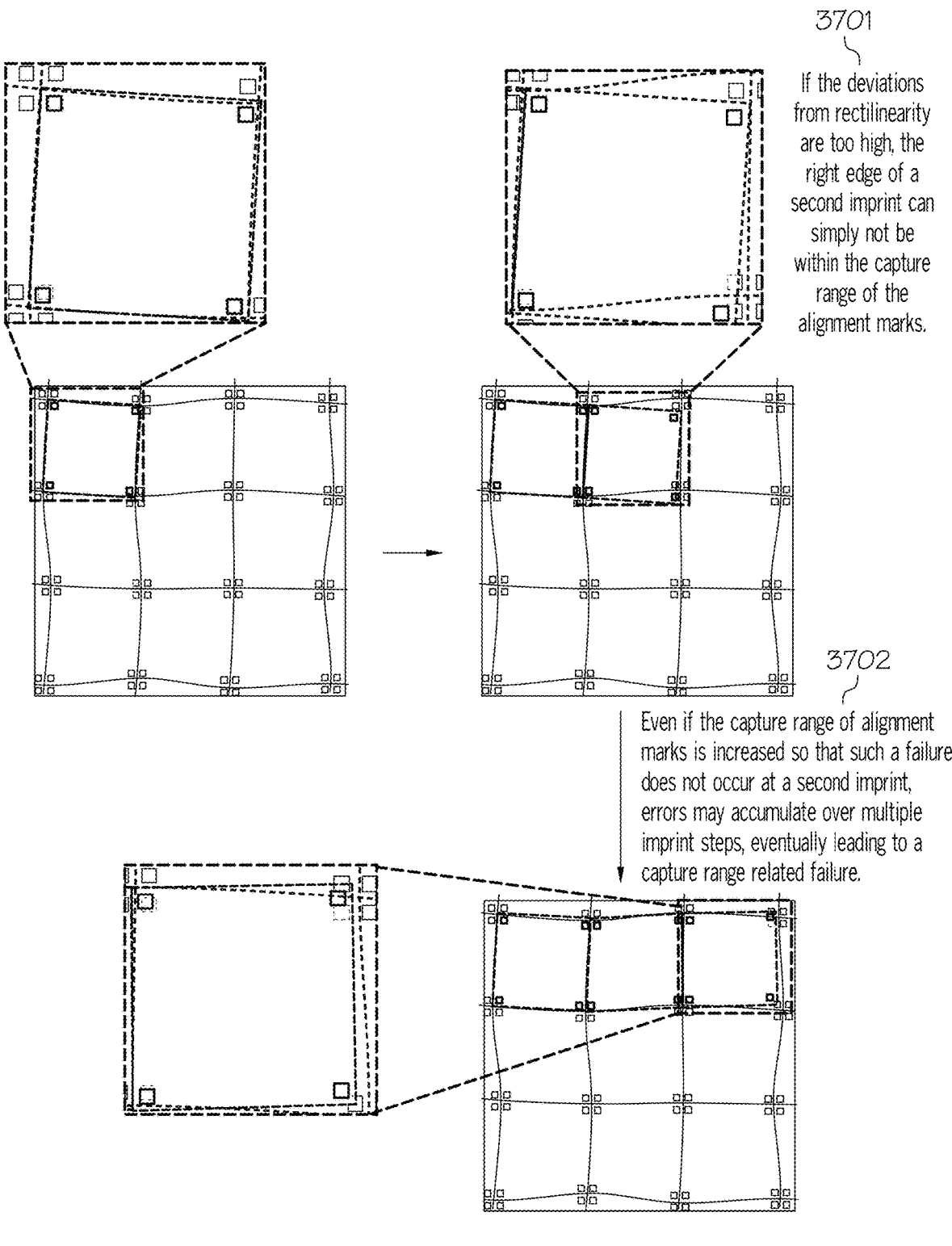

3701

If the deviations from rectilinearity are too high, the right edge of a second imprint can simply not be within the capture range of the alignment marks.

3702

Even if the capture range of alignment marks is increased so that such a failure does not occur at a second imprint, errors may accumulate over multiple imprint steps, eventually leading to a capture range related failure.

FIG. 37

LARGE-AREA SUBSTRATE

PINHOLES SPAN THE
THICKNESS SPACE
OF THE SUBSTRATE
EXCEPT FOR THE
TOP PATTERN LAYER

4102

4101

PINHOLE DIAMETER COULD
BE 10S OF MICROMETERS TO
100S OF MICROMETERS

PINHOLES FILLED WITH
THERMALLY CONDUCTIVE
MATERIAL

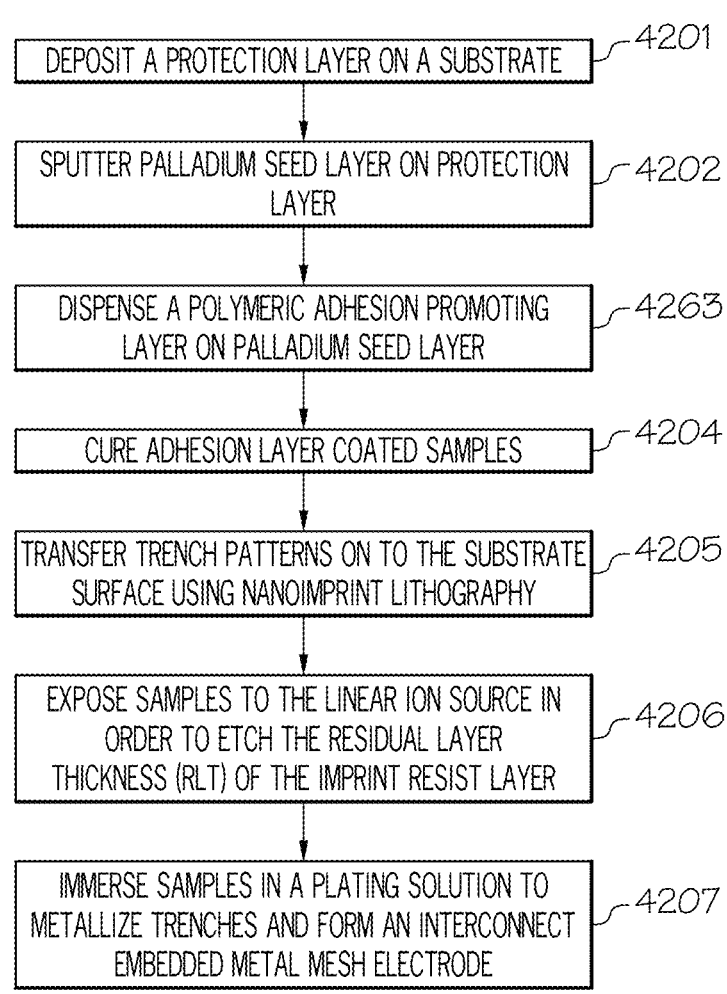

DEPOSIT A PROTECTION LAYER ON A SUBSTRATE — 4201

↓

SPUTTER PALLADIUM SEED LAYER ON PROTECTION LAYER — 4202

↓

DISPENSE A POLYMERIC ADHESION PROMOTING LAYER ON PALLADIUM SEED LAYER — 4263

↓

CURE ADHESION LAYER COATED SAMPLES — 4204

↓

TRANSFER TRENCH PATTERNS ON TO THE SUBSTRATE SURFACE USING NANOIMPRINT LITHOGRAPHY — 4205

↓

EXPOSE SAMPLES TO THE LINEAR ION SOURCE IN ORDER TO ETCH THE RESIDUAL LAYER THICKNESS (RLT) OF THE IMPRINT RESIST LAYER — 4206

↓

IMMERSE SAMPLES IN A PLATING SOLUTION TO METALLIZE TRENCHES AND FORM AN INTERCONNECT EMBEDDED METAL MESH ELECTRODE — 4207

FIG. 42

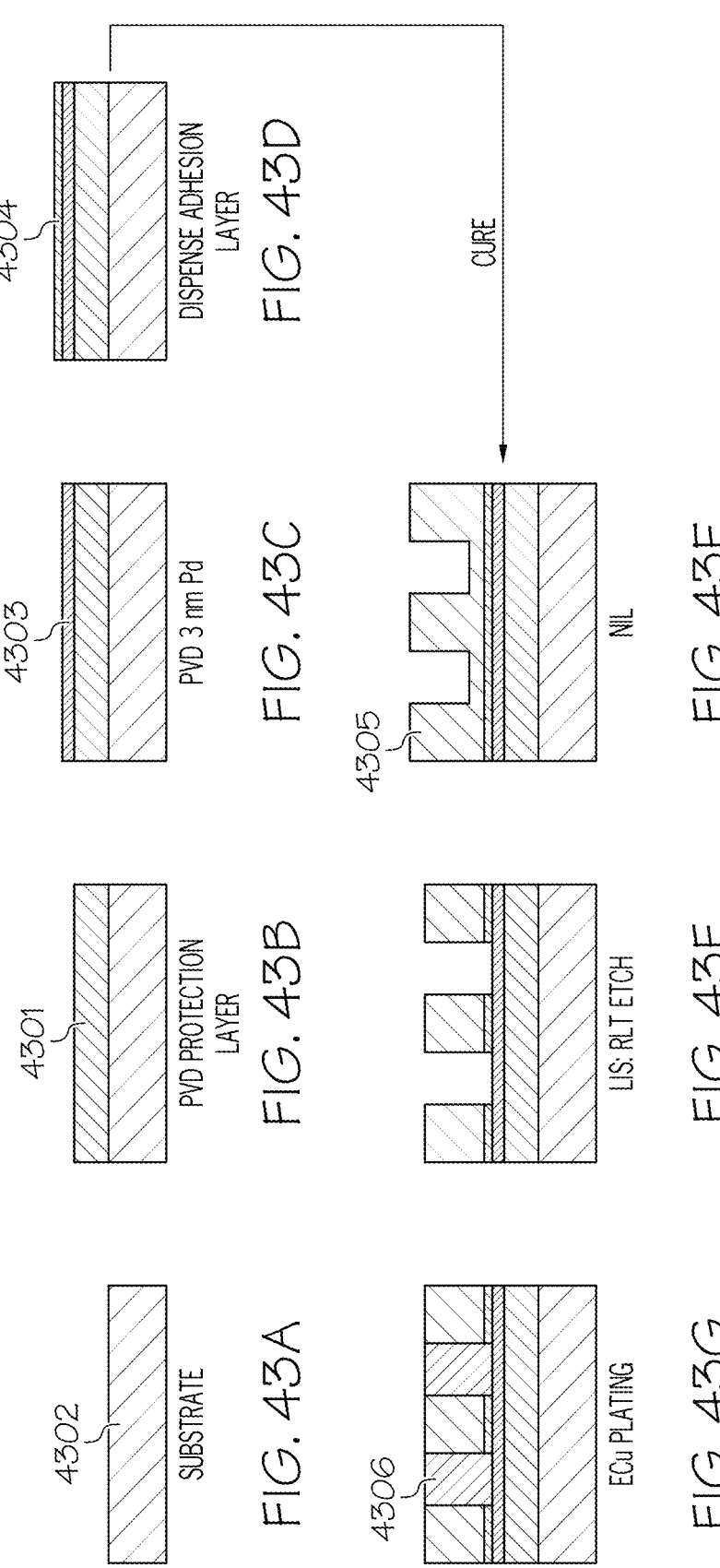
4304 — DISPENSE ADHESION LAYER — FIG. 43D
CURE
4303 — PVD 3 mm Pd — FIG. 43C
4305 — NIL — FIG. 43E
4301 — PVD PROTECTION LAYER — FIG. 43B
LIS: RLT ETCH — FIG. 43F
4302 — SUBSTRATE — FIG. 43A
4306 — ECu PLATING — FIG. 43G

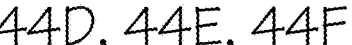
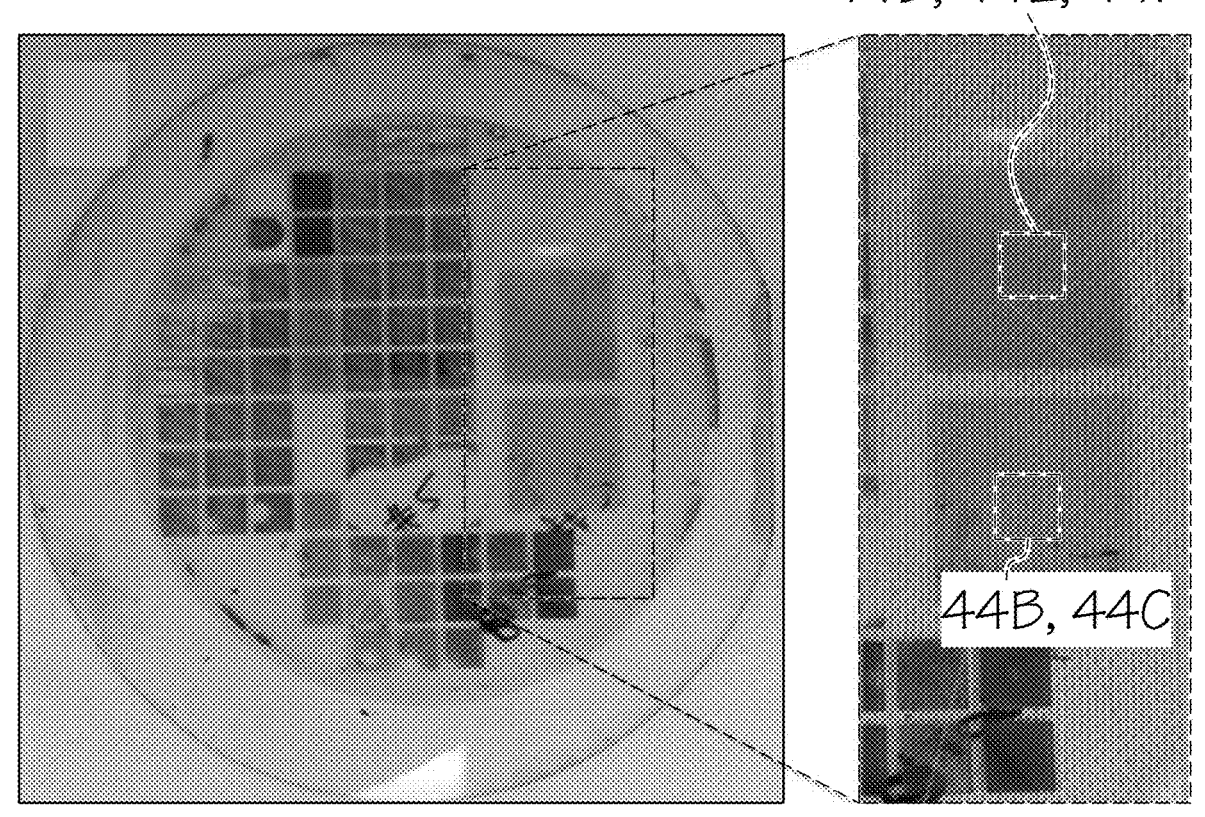
FIG. 44A

ROLL-TO-ROLL NANOIMPRINT LITHOGRAPHY TOOLS AND PROCESSES

CROSS REFERENCE TO RELATED APPLICATIONS

This application claims priority to U.S. Provisional Patent Application Ser. No. 62/847,193 entitled "Nanoscale Replication And Registration Using Roll-To-Roll Template With Precision Alignment," filed on May 13, 2019 and U.S. Provisional Patent Application Ser. No. 62/847,690, entitled "Roll-To-Roll Nanofabrication Process For Flexible Cu Metal Mesh Transparent Conducting Electrodes," filed on May 14, 2019, which are incorporated by reference herein in their entirety.

TECHNICAL FIELD

The present invention relates generally to UV-based nanoimprint lithography, and more particularly to configuring UV-based nanoimprint lithography for roll-to-roll (R2R) processing and a roll-to-roll nanofabrication process for metal mesh transparent conducting electrodes.

BACKGROUND

Nanoimprint lithography (NIL) is a method of fabricating nanometer scale patterns. It is a simple nanolithography process with low cost, high throughput and high resolution. It creates patterns by mechanical deformation of imprint resist and subsequent processes. The imprint resist is typically a monomer or polymer formulation that is cured by heat or ultraviolet (UV) light during the imprinting (UV-based nanoimprint lithography). Adhesion between the resist and the template is controlled to allow proper release.

UV-based nanoimprint lithography (UV-NIL) offers a variety of advantages in the replication of patterns, both uniform and non-uniform, such as by providing precise nanoscale patterning.

In the field of electronic devices, roll-to-roll processing, also known as web processing, reel-to-reel processing or R2R, is the process of creating electronic devices on a roll of flexible plastic or metal foil. In other fields predating this use, it can refer to any process of applying coatings, printing, or performing other processes starting with a roll of a flexible material and re-reeling after the process to create an output roll. These processes, and others, such as sheeting, can be grouped together under the general term converting. When the rolls of material have been coated, laminated or printed they can be subsequently slit to their finished size on a slitter rewinder.

While R2R processing is an inexpensive process, it has not been able to be utilized using precise nanoscale patterning afforded by UV-NIL.

Furthermore, current technologies for realizing optoelectronic devices, such as metal mesh transparent conducting electrodes, wire grid polarizers and light-trapping gratings, are limited to rigid substrates, lack the necessary patterning resolution, involve inefficient metal lift-off/etch process and/or a transfer printing step.

SUMMARY

In one embodiment of the present invention, a plate-to-roll nanoimprint lithography process for creating a roll-based high volume manufacturing template by patterning nanoscale features using a rigid template with nanoscale patterns on to a substrate held in a roll-to-roll configuration, the process comprises coating a film of a solution of resist material on the template. The process further comprises performing in-situ alignment of the template with the substrate. The process additionally comprises initiating a substantially point or line contact between the substrate and the template. Furthermore, the process comprises exercising control over an out-of-plane deflection profile of the substrate or the template. Additionally, the process comprises crosslinking the resist material with UV light while the out-of-plane deflection profile of the substrate matches a surface profile of a top surface of the template. In addition, the process comprises separating the template from the substrate through manipulation of motion of the template or the substrate.

In another embodiment of the present invention, a roll-to-plate nanoimprint lithography process by patterning nanoscale features using a roll-based high volume manufacturing (RHVM) template with nanoscale patterns held in a roll-to-roll configuration on to a substrate, the process comprises coating a film of a solution of nanoimprint resist material on the substrate. The process further comprises performing in-situ alignment of the substrate with the template. The process additionally comprises initiating a substantially point or line contact between the template and the substrate. Furthermore, the process comprises exercising control over an out-of-plane deflection profile of the template or the substrate. Additionally, the process comprises crosslinking the resist material with UV light while the out-of-plane deflection profile of the template matches a surface profile of a top surface of the substrate. In addition, the process comprises separating the template from the substrate through manipulation of motion of the template or the substrate.

In a further embodiment of the present invention, a roll-to-roll nanoimprint lithography process by patterning nanoscale features using a roll-based high volume manufacturing (RHVM) template with nanoscale patterns held in a roll-to-roll (R2R) configuration on to a substrate held in a roll-to-roll configuration, the process comprises driving the template and the substrate to be incoming at substantially a same speed and tension. The process further comprises coating a film of a solution of nanoimprint resist material on the substrate. The process additionally comprises performing an in-situ alignment of the substrate with the template. Furthermore, the process comprises initiating a substantially point or line contact between the incoming template and the incoming substrate. Additionally, the process comprises exercising control over an out-of-plane deflection profile of the substrate or the template. In addition, the process comprises crosslinking the resist material with UV light while the out-of-plane deflection profile of the template matches a surface profile of a top surface of the substrate. The process further comprises separating the template from the substrate through manipulation of the substrate or the template.

In another embodiment of the present invention, a method for nano-precise edge-stitching of large-area templates comprises providing a master template that contains embedded alignment marks along with optical patterns to be imprinted. The method further comprises providing a large-area substrate, which is to be tessellated with master template imprints, that contains embedded alignment marks. The method additionally comprises performing error sensing by measuring a relative displacement between pairs of embedded alignment marks on the master template and the large-area substrate.

In a further embodiment of the present invention, a method for selective electroless copper (Cu) metallization comprises depositing a protection layer on a substrate. The method further comprises depositing a palladium seed layer on the protection layer. The method additionally comprises dispensing a polymeric adhesion promoting layer on the palladium seed layer. Furthermore, the method comprises curing the polymeric adhesion promoting layer. Additionally, the method comprises transferring trench patterns on to a surface of the cured polymeric adhesion promoting layer forming a sample. In addition, the method comprises exposing the sample to a linear ion source in order to etch a residual layer thickness of an imprint resist layer. The method further comprises immersing the sample in a plating solution to metallize trenches of the trench patterns and form an interconnect embedded metal mesh electrode.

In another embodiment of the present invention, a nano-imprint lithography apparatus comprises fixtures for mounting coating systems. The apparatus further comprises an ultraviolet (UV) transparent area. The apparatus additionally comprises a module for control of an out-of-plane deflection profile of a template or a substrate. Furthermore, the apparatus comprises a stage for mounting the template which allows in-plane and out-of-plane motion of the template or a stage for mounting the substrate which allows in-plane and out-of-plane motion of the substrate. Additionally, the apparatus comprises a module for the substrate or the template held in a roll-to-roll configuration configured to ensure a substantially flat zone for imprinting. In addition, the apparatus comprises an evaporation module for evaporating resist material from the template or the substrate.

The foregoing has outlined rather generally the features and technical advantages of one or more embodiments of the present invention in order that the detailed description of the present invention that follows may be better understood. Additional features and advantages of the present invention will be described hereinafter which may form the subject of the claims of the present invention.

BRIEF DESCRIPTION OF THE DRAWINGS

A better understanding of the present invention can be obtained when the following detailed description is considered in conjunction with the following drawings, in which:

FIG. 10A illustrates the precision alignment system of idlers in the imprint zone in accordance with an embodiment of the present invention;

FIG. 10B illustrates the side view of the precision alignment system when the vacuum is off, the bearing air pressure is off, the cavity air pressure is off and the precision alignment system is in the dormant mode in accordance with an embodiment of the present invention;

FIG. 10C illustrates the side view of the precision alignment system when the vacuum is on, the bearing air pressure is on, the cavity air pressure is on and the precision alignment system is in the conveying mode in the R2R configuration in accordance with an embodiment of the present invention;

FIG. 14 is a flowchart of a method of the process steps for R2P-NIL and R2R-NIL in the start-stop configuration in accordance with an embodiment of the present invention;

FIG. 27 illustrates an automated mechanism for orientating idler rollers for the template web in accordance with an embodiment of the present invention;

FIG. 37 illustrates exemplar scenarios where edge-stitching could fail in accordance with an embodiment of the present invention;

FIG. 42 is a flowchart of a method for selective electroless Cu (ECu) metallization in accordance with an embodiment of the present invention;

FIGS. 43A-43G depict the cross-sectional views for selective ECu metallization using the steps described in FIG. 42 in accordance with an embodiment of the present invention;

FIG. 44A illustrates an image of patterned quartz (insert is of fields consisting of trench grids) in accordance of an embodiment of the present invention;

DETAILED DESCRIPTION

As stated in the Background section, UV-based nanoimprint lithography (UV-NIL) offers a variety of advantages in the replication of patterns, both uniform and non-uniform, such as by providing precise nanoscale patterning.

In the field of electronic devices, roll-to-roll processing, also known as web processing, reel-to-reel processing or R2R, is the process of creating electronic devices on a roll of flexible plastic or metal foil. In other fields predating this use, it can refer to any process of applying coatings, printing, or performing other processes starting with a roll of a flexible material and re-reeling after the process to create an output roll. These processes, and others, such as sheeting, can be grouped together under the general term converting. When the rolls of material have been coated, laminated or printed they can be subsequently slit to their finished size on a slitter rewinder.

While R2R processing is an inexpensive process, it has not been able to be utilized using precise nanoscale patterning afforded by UV-NIL.

The principles of the present invention provide the means for configuring UV-NIL for R2R processing, which combines the benefits of inexpensive R2R processing with the precise nanoscale patterning afforded by NIL as discussed herein.

Figure 1:
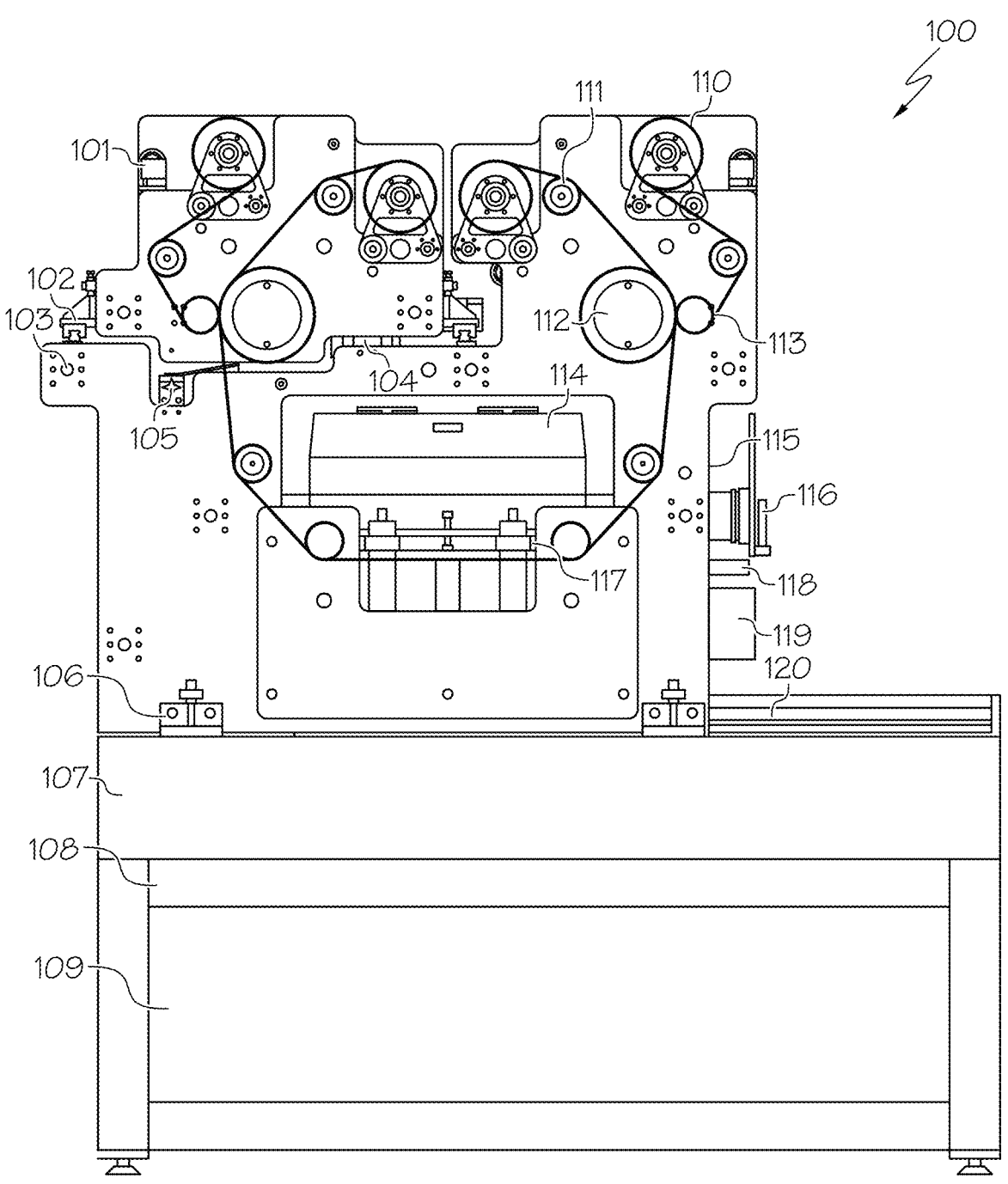
FIG. 1 is a schematic view of the Roll-to-Plate (R2P) NIL tool (also used as Plate-to-Roll (P2R) NIL tool) in accordance with an embodiment of the present invention.
Figure 2:
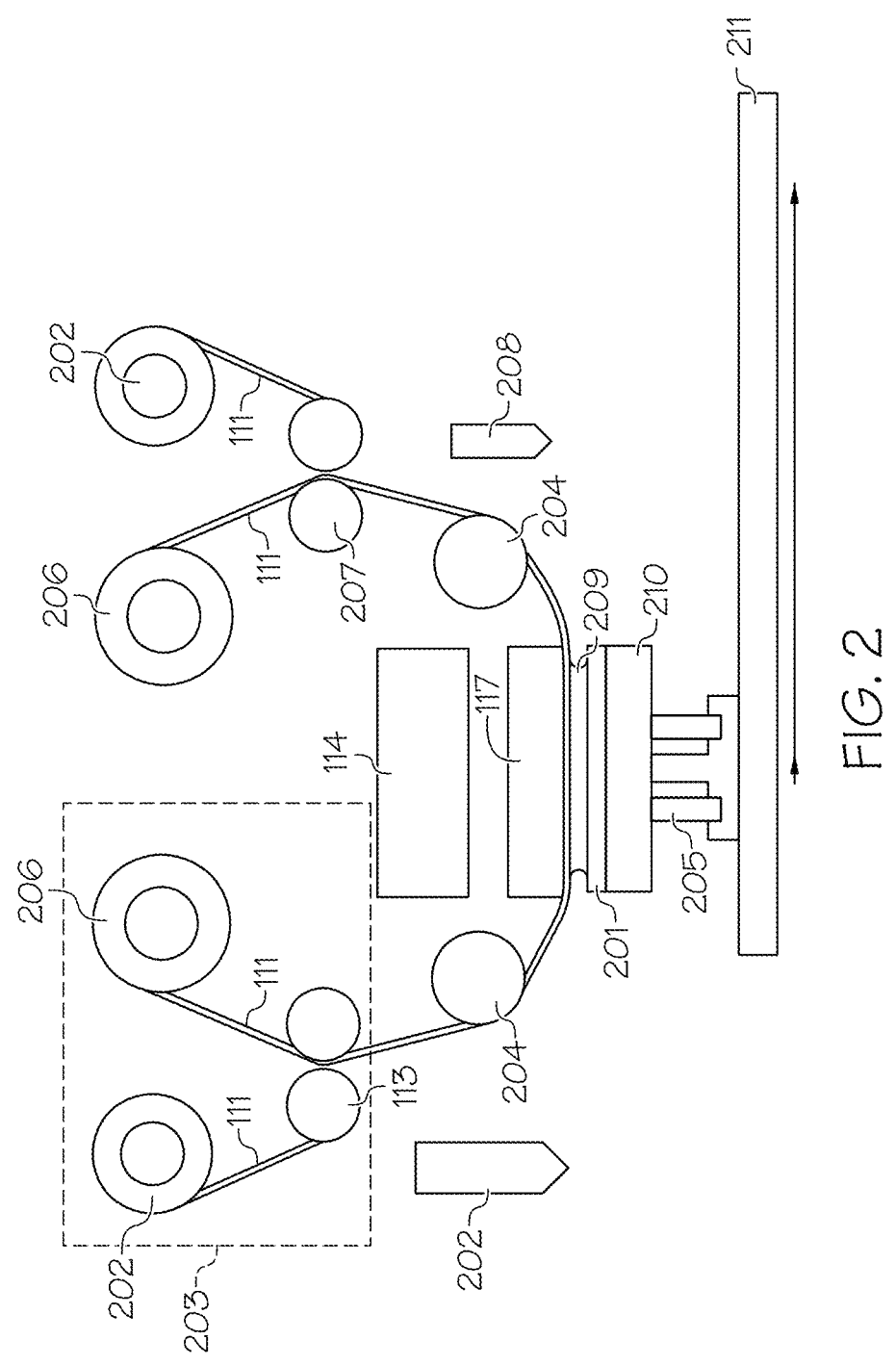
FIG. 2 is a schematic view of the web path in the R2P tool with the nip rollers configuration in accordance with an embodiment of the present invention.

Referring to the Figures in detail, FIG. 1 is a schematic view of the Roll-to-Plate (R2P) NIL tool 100 (also used as a Plate-to-Roll (P2R) NIL tool) in accordance with an embodiment of the present invention. FIG. 2 illustrates a schematic view of the web path in the R2P NIL tool 100 with the nip rollers configuration in accordance with an embodiment of the present invention.

Referring to FIGS. 1 and 2 in combination, R2P NIL tool 100 uses a roll template to imprint on a rigid substrate 201. Tool 100 includes a diameter sensor 101, sidelay linear bearing 102, tie beams 103, sidelay actuator 104, edge sensor 105, machine feet 106, granite slab 107, base support 108, space 109 for electronics, pneumatic controllers, etc., reel chuck assemblies 110, load cell rollers 111, capstan roller 112, nip roller 113, ultraviolet (UV) exposure lamp 114, sidewalls 115, coating assembly 116, UV transparent chuck/conveyer 117, substrate chuck/conveyer 118, vertical-tip-tilt stage 119, and linear stages 120.

In one embodiment, a master template (e.g., a gen 2.5 glass with dimensions 400 mm×500 mm) can be used as a rigid template and to imprint upwards on a flexible roll substrate (e.g., a 500 mm wide web made of polycarbonate, PET, PEN, etc.). This process is called replication. The plate traversing system consists of three stages, a linear XY stage for slot-die coating using a slot-die coater 208 and ink jetting and a vertical, tip and tilt stage 119 to control parallelism and separation of the template from the substrate. A stage (see element 211) with a travel range of 100-10000 mm enables positioning and coating the plate using a slot-die coater 208 and in some embodiments, the inkjet. Vertical stage (see element 119) is driven by actuators, such as piezoelectric elements, and voice coil motors (VCMs) (driven by VCM stage 205 for vertical, tip and tilt motion). One embodiment of the stage provides a vertical displacement of 0.1-50 mm and an angular travel range of 0.1-5 degrees. Another embodiment of the stage provides an increased angular travel range of ~5-30 degrees, albeit it occupies a larger space. Both the stages are mounted on a granite base 107 to dampen vibrations. The template web handling module consists of unwind and rewind rollers, rollers 202 for interleaving and de-interleaving, drive rollers 207, nip rollers 113 for tension control and precision rollers to ensure a flat zone for imprinting. The sidelay module 203 ensures that the web is wound on each other without lateral error (telescoping). The template roll is unwound from a supply roller 206, de-interleaved, and passed through a drive roller 207. Drive roller 207 provides the necessary tension control in the imprinting region. Various embodiments of drive roller 207 are described later herein. Downstream of the imprinting region, the template web is interleaved (via interleaf roller 202) to prevent particle contamination and wound back on take-up roller 206. In one embodiment, every roller in the system is mounted on manual alignment stages for accurate axial orientation. A broadband UV lamp 114 is used to cure imprint resist 209. Imprint actuation is achieved using UV transparent vacuum chucks 117 (see also vacuum pin chuck 210 of FIG. 2) with a central zone of positive air cavity pressure. In one embodiment, the material for components of UV transparent vacuum preloaded air bearings includes UV transmitting acrylic, quartz or cyclic olefin copolymer.

FIG. 2 shows the web path followed by the template web and the interleaf film during removal and application. Tension control is achieved through a nip and drive roller assembly (nip roller 113 and drive rollers 207). Polyurethane rollers are used to apply normal pressure on drive roller 207 which improves friction and allows higher tension limited by motor capacity. In one embodiment, nip roller 113 is axially parallel to drive roller 207. In one embodiment, precision idlers 204 are used to flatten the roll. A UV lamp 114 is placed directly above the imprint zone. The UV transparent vacuum preloaded air bearing is positioned between the template and UV lamp 114. Precision idlers 204 are shown which flatten the web and ensure minimal out of plane errors and in-plane shear errors.

Figure 3:
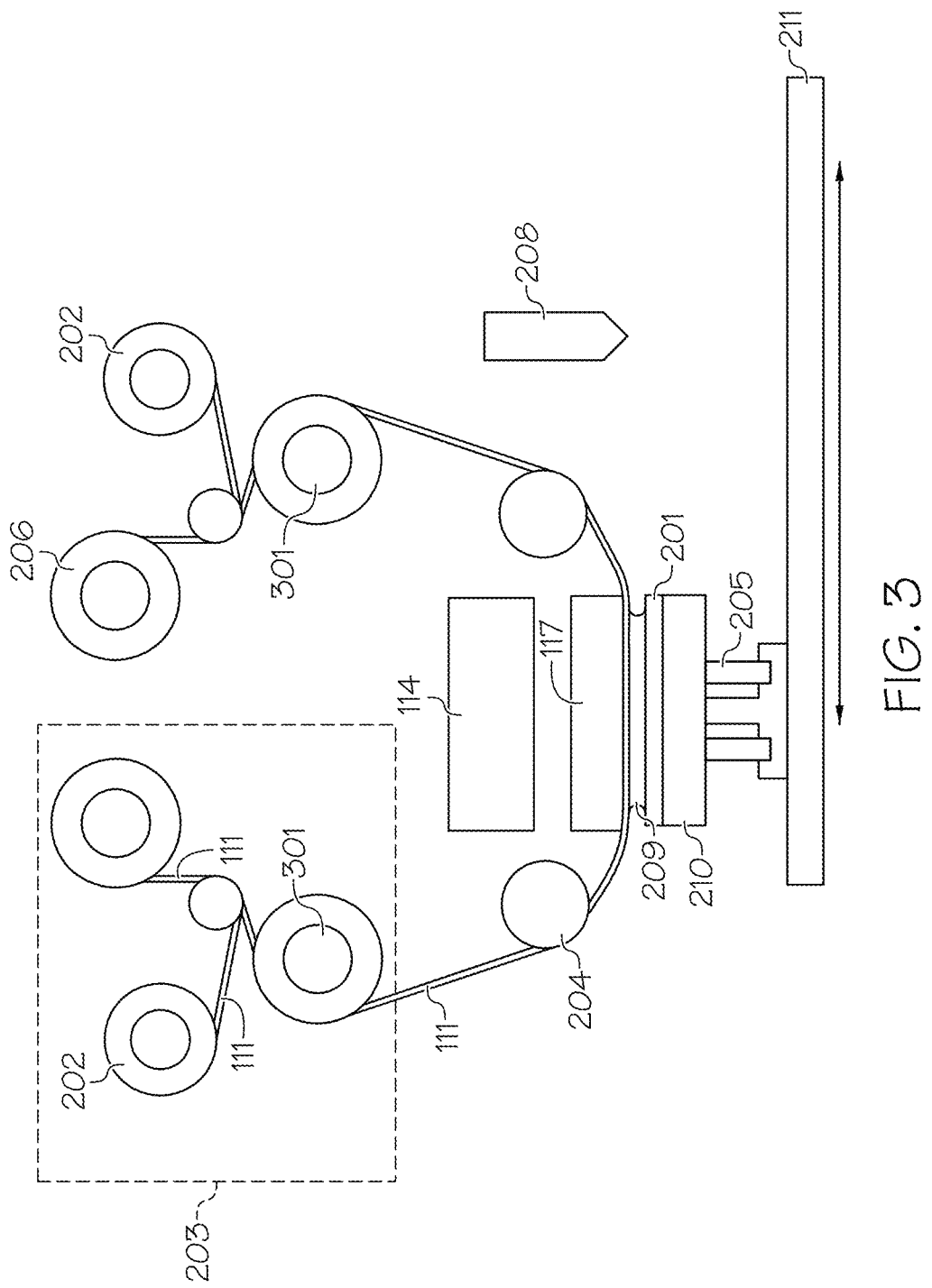
FIG. 3 is a schematic view of the web path in the R2P tool with the vacuum rollers configuration in accordance with an embodiment of the present invention.

FIG. 3 is a schematic view of the web path in R2P tool 100 with the vacuum rollers configuration in accordance with an embodiment of the present invention.

Referring to FIG. 3, a pair of vacuum rollers 301 are used to provide tension to the roll template in the imprinting region. In general, vacuum rollers 301 are useful when dealing with delicate webs or sparse pattern density. Vacuum rollers 301 provide tension without normal compressive force on the patterned side of the roll template. The normal force created by vacuum rollers 301 is sufficient for the desired tension range (~10-5000 N/m).

FIG. 3 further illustrates UV transparent vacuum preloaded air bearing 302.

Figure 4:
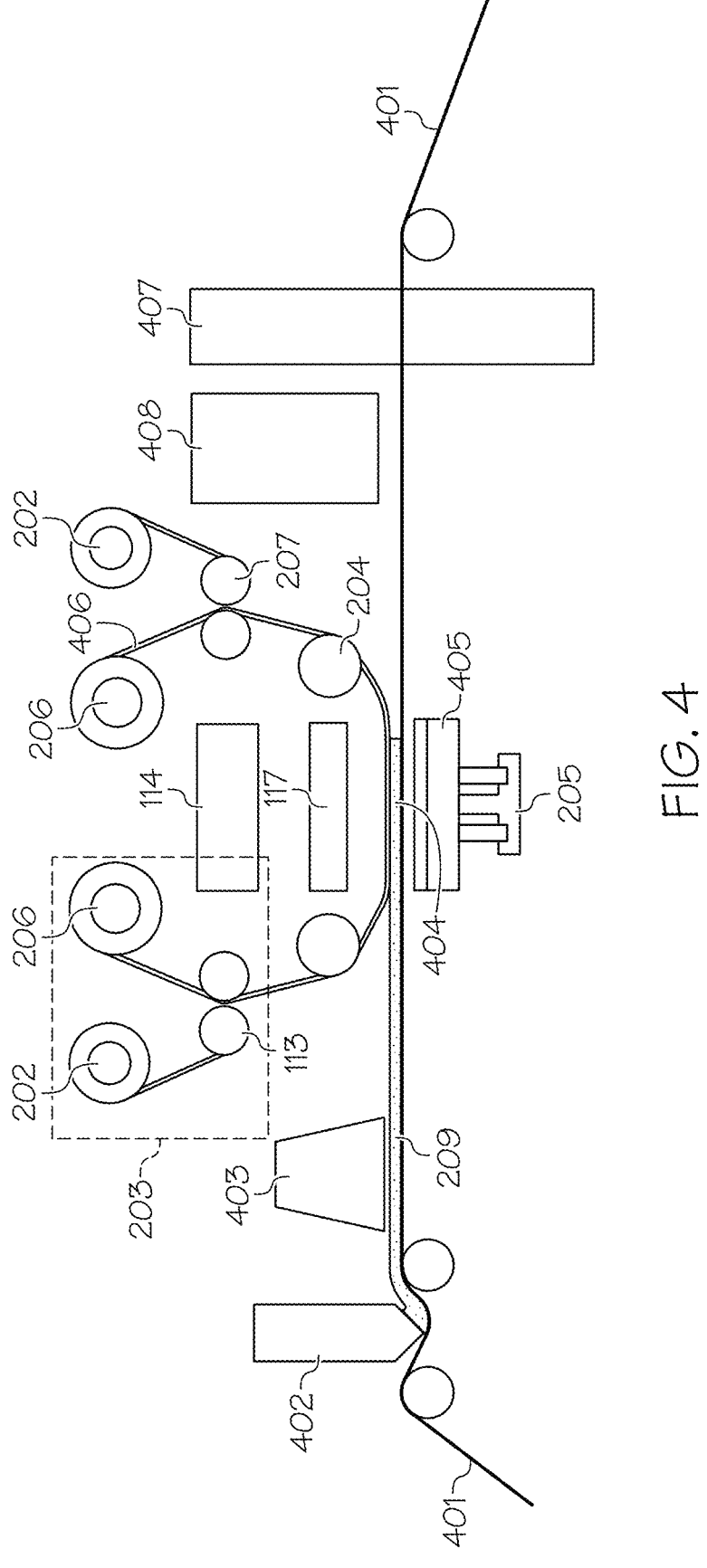
FIG. 4 is a schematic view of the web path in the R2R NIL tool with nip rollers and independent drivers in accordance with an embodiment of the present invention.

FIG. 4 is a schematic view of the Roll-to-Roll (R2R) NIL tool with nip rollers and independent drivers for the substrate and template web in accordance with an embodiment of the present invention.

Referring to FIG. 4, the R2R NIL tool uses a roll template to imprint on a roll substrate in either a start-and-stop discrete manner or a continuous manner. The roll substrate 401 is unwound from a supply roller and de-interleaved. It is then passed through an optional web cleaning module (not shown) which removes particles on the web. In one embodiment, it is followed by a tensioned-web slot die coater 402 which deposits an imprint resist solution, where the thickness of the resist solution can be 50-10,000 nm. Any solvent in the resist can be evaporated using an oven or an infrared (IR) heater 403. In one embodiment, the resist material is coated on the substrate using slot-die coating, tensioned-web slot-die coating, kiss gravure coating, micro-gravure coating, doctor blading, knife-edge coating, ink jetting or a combination thereof to control a film thickness profile of the resist material.

In one embodiment, a film of a solution of resist material is coated on the template. In one embodiment, a film of a solution of nanoimprint resist material is coated on the substrate.

Substrate web 401 then passes through the imprint zone 404 through a vacuum preloaded air bearing 405 used as a contactless conveyer, where it is actuated upon by UV transparent air bars and the template web 406 is brought in contact to it. Several embodiments of the drive and actuation processes are described below. After imprinting and separation, the patterned web 401 passes through a spectral imaging module 407 and scatterometry module 408 to characterize and quantify defects. Following metrology module 407 are the take-up roller 206 (see FIGS. 2-3) and the interleaf roller 202 (see FIGS. 2-3) along with an optional web cleaning module (not shown).

Referring to FIG. 4, a couple of nip rollers 113 are used to drive the web and provide tension control. In one embodiment, substrate web 401 and template web 406 have independent drivers. Speed and tension matching is also carried out in the imprinting region (imprint zone 404)

Figure 5:
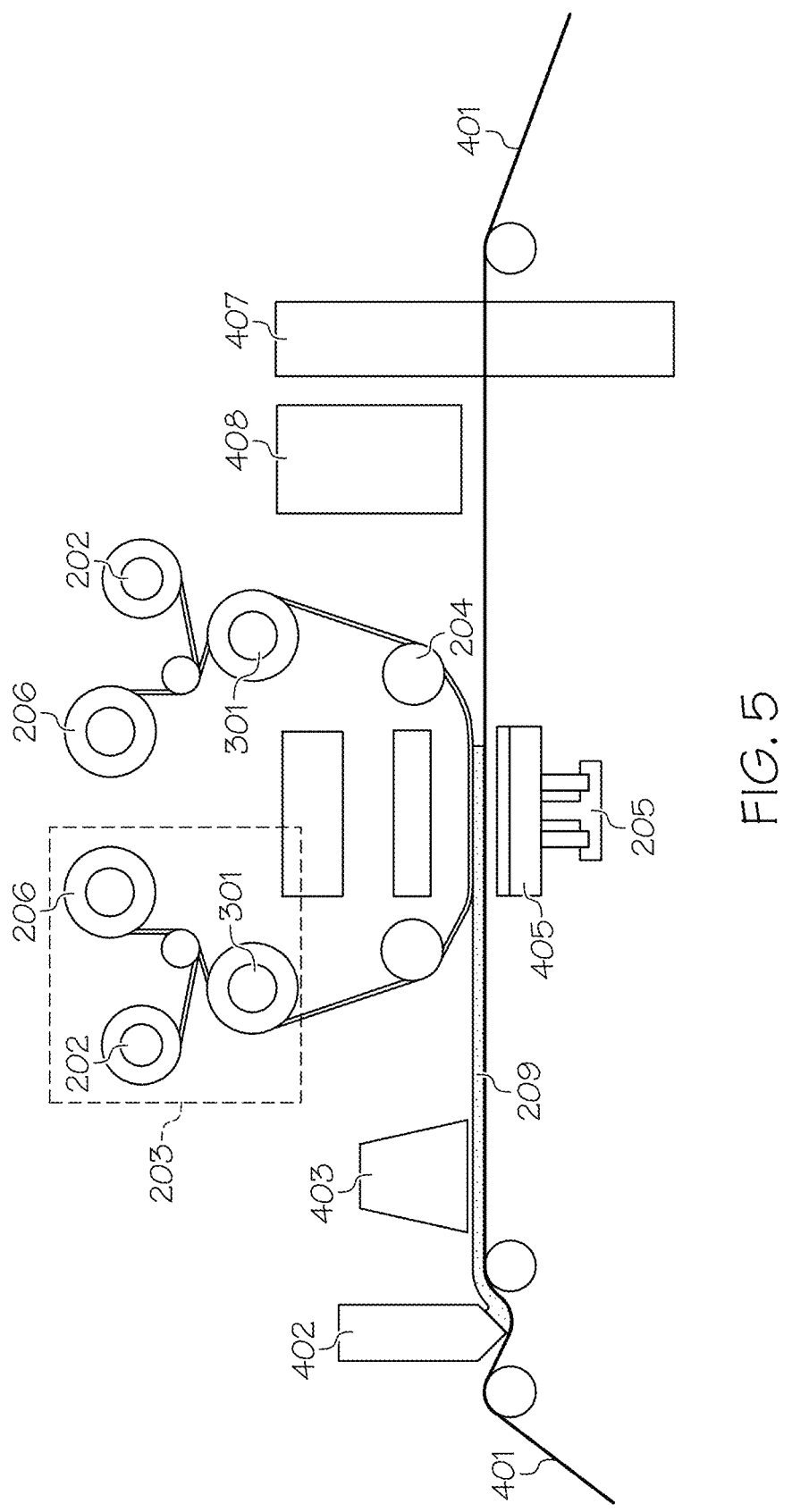
FIG. 5 is a schematic view of the web path in the R2R tool with vacuum rollers and independent drivers for the substrate and template web in accordance with an embodiment of the present invention.

FIG. 5 is a schematic view of the web path in the R2R tool with vacuum rollers 301 (see FIG. 3) and independent drivers for the substrate web 401 and the template web 406 in accordance with an embodiment of the present invention.

As shown in FIG. 5, a pair of vacuum rollers 301 is used to provide tension control.

Figure 6:
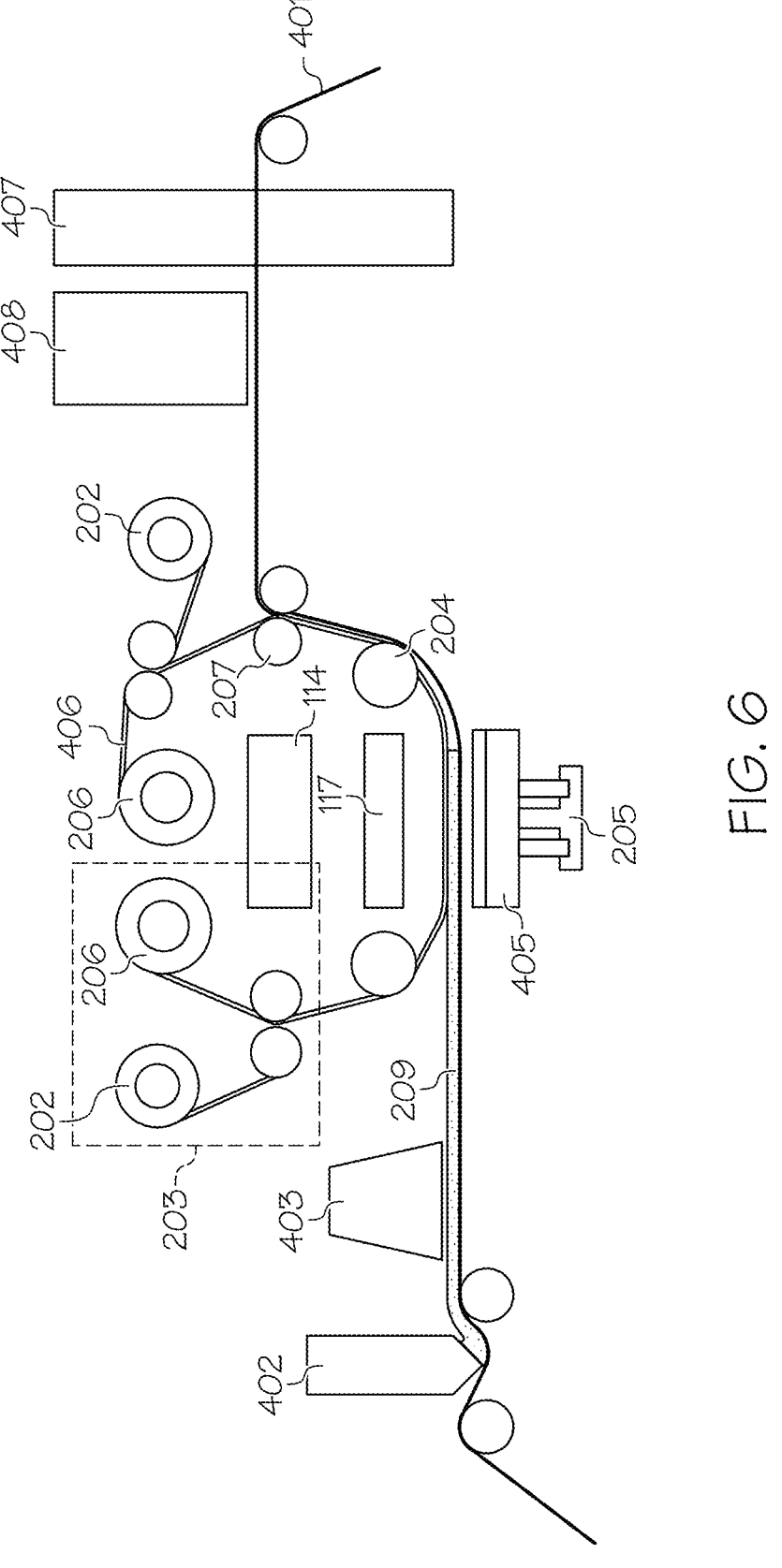
FIG. 6 is a schematic view of the web path in the R2R tool with nip rollers and a single driver for the substrate and template web in accordance with an embodiment of the present invention.

FIG. 6 is a schematic view of the web path in the R2R tool with nip rollers 113 (FIGS. 1-2 and 4) and a single driver for substrate and template web 401, 406 (FIGS. 4-5) in accordance with an embodiment of the present invention.

Referring to FIG. 6, a single nip roller 113 downstream of the imprint region is used to drive both the substrate and template rollers 401, 406. This prevents issues due to mismatching of speed and tension. The oncoming substrate and template web 401, 406 are made to contact each other along a single line through air bearings. The vertical tip tilt stage 119 (FIG. 1) is used to mount the bottom vacuum preloaded air bearing and provide gap control and proper alignment.

Figure 7:
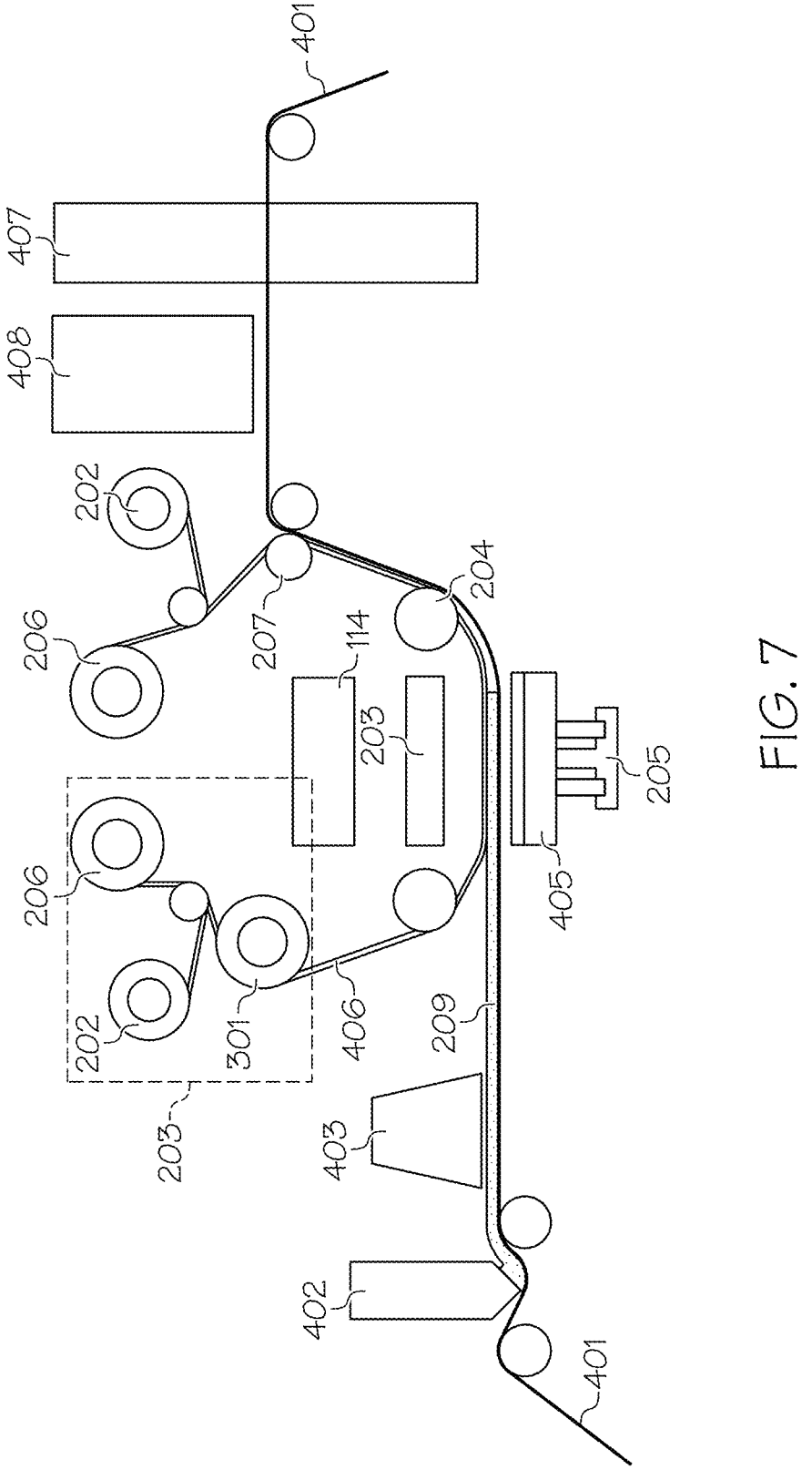
FIG. 7 is a schematic view of the web path in the R2R tool with vacuum rollers and a single driver for the substrate and template web in accordance with an embodiment of the present invention.

FIG. 7 is a schematic view of the web path in the R2R tool with vacuum rollers 301 and a single driver for substrate and template web 401, 402 (FIGS. 4 and 5) in accordance with an embodiment of the present invention.

Figures 8A, 8B, 8C:
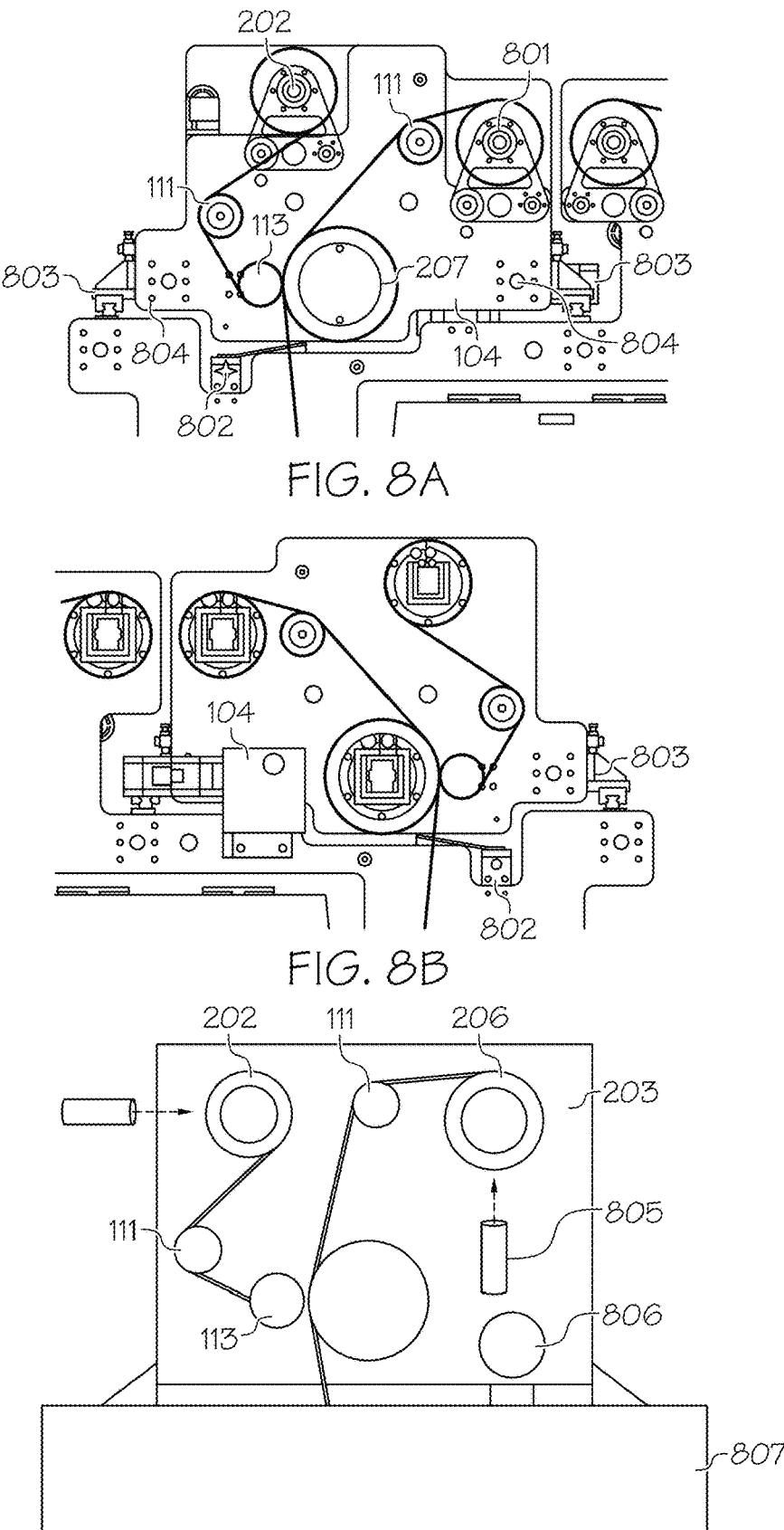
FIGS. 8A-8C illustrate the architecture of the sidelay mechanism in accordance with an embodiment of the present invention.

FIGS. 8A-8C illustrate the architecture of the sidelay module 203 (FIGS. 2-7) in accordance with an embodiment of the present invention. Referring to FIGS. 8A-8C, FIGS.

8A-8C illustrate that sidelay module 203 is used to ensure that the web does not displace laterally due to accumulating errors (telescoping). The unwind roller 801, de-interleaf roller 202, load cell roller 111, nip roller 113 and drive roller 207 are mounted on a carriage than can translate in a perpendicular direction to the web motion. An edge guide sensor 802 is used to locate the lateral position of the roll template along with limit switches to detect the end of the travel range.

FIGS. 8B-8C further illustrate that linear bearings 803 transverse to the web motion, tie beams 804, sidelay actuator 104 (FIG. 1), sensors 805 for reel diameter measurement, and a linear motor moving sidelay module 806 transverse to the web with respect to the stationary frame 807.

Figure 9A:
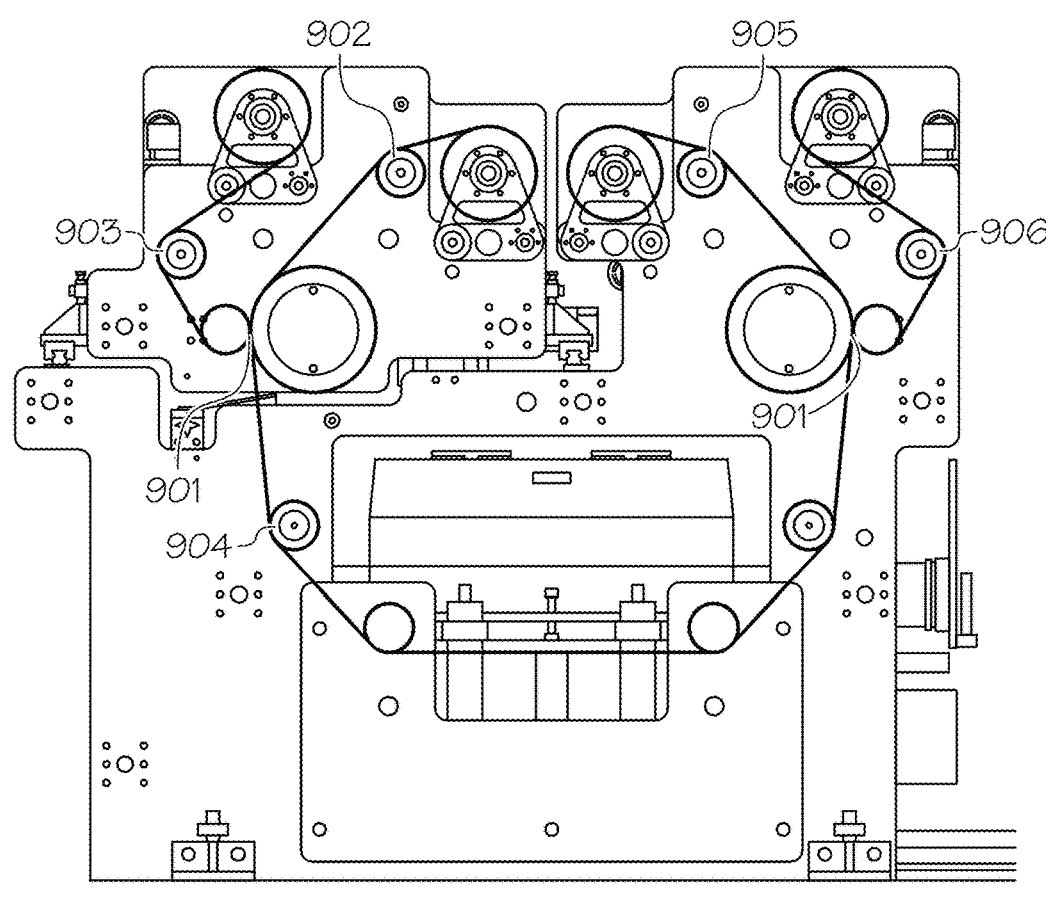
FIGS. 9A-9B illustrate the roll template tension control system in accordance with an embodiment of the present invention.
Figure 9B:
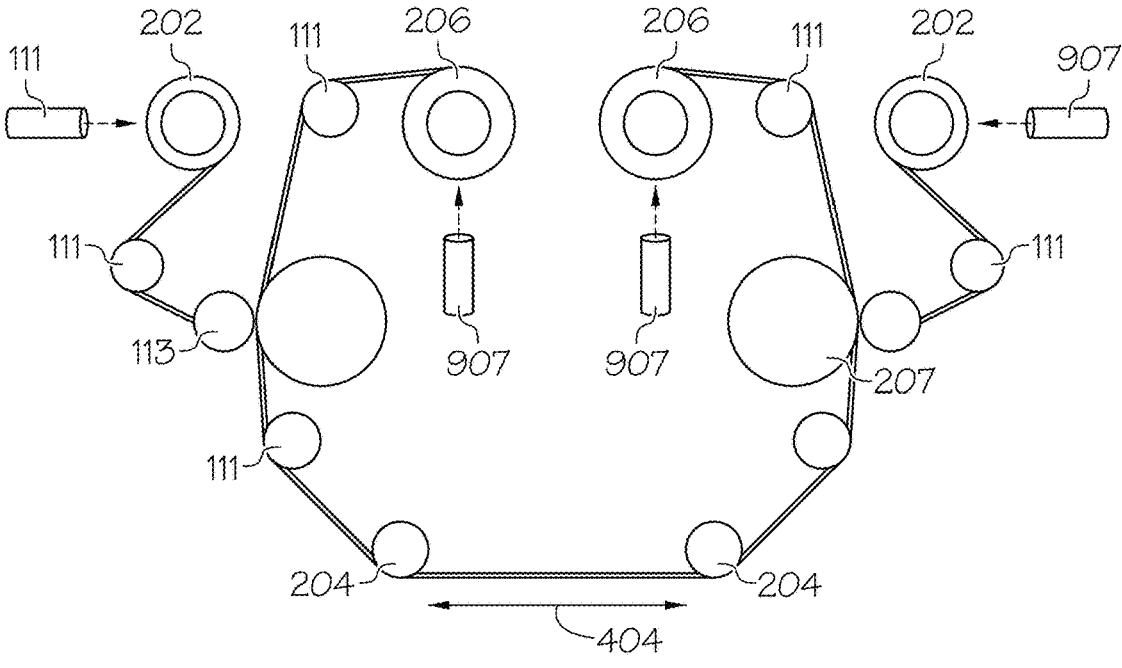

FIGS. 9A-9B illustrate the roll template tension control system in accordance with an embodiment of the present invention. Referring to FIGS. 9A-9B, the tension control is maintained using a nip roller 113 of the nip+drive roller 901 (nip+drive roller includes nip roller 113 and drive roller 207 of FIG. 2) in the imprint module, and unwind and rewind rollers for overall web tension. Load cells 902-906 (load cell for unwind tension 902, load cell for de-interleaf tension 903, load cell for imprinting zone tension 904, load cell for rewind tension 905 and load cell for interleaf tension 906) and diameter measurement sensors 907 are used to calculated tension in each region. These sensor inputs are fed to the motion controller driving the motors and appropriate tension control is achieved.

FIG. 10A illustrates the precision alignment system 1000 of idlers in the imprint zone in accordance with an embodiment of the present invention. Referring to FIG. 10A, mechanism 1000 includes a precision idler 204 mounted on self-aligning bearings 1001. Self-aligning bearings 1001 are themselves mounted on 2-axis stages 1002 (e.g., XY stages) to ensure proper alignment of rollers. The 2-axis stages are located on the sidewalls through line boring. Laser tracking sensors can be used to measure misalignment between any 2 rollers in the system.

FIG. 10B illustrates the side view of precision alignment system 1000 when the vacuum is off, the bearing air pressure is off, the cavity air pressure is off and precision alignment system 1000 is in the dormant mode in accordance with an embodiment of the present invention. In such a mode, micrometer knobs 1003 are mounted to the ball end 1004 glued to the micrometer actuator via micrometer mounts 1005. As shown in FIG. 10B, the ball ends 1004 are protected via a ball sleeve 1006. Additionally, as shown in FIG. 10B, in one embodiment, there may be a stationary plate 1007 to which micrometers are fastened.

FIG. 10C illustrates the side view of precision alignment system 1000 when the vacuum is on, the bearing air pressure is on, the cavity air pressure is on and precision alignment system 1000 is in the conveying mode in the R2R configuration in accordance with an embodiment of the present invention. In such a mode, there exists an air cavity 1008 with a gap of less than 100 micrometers between template web 406 and UV transparent vacuum preloaded air bearing 302 (FIG. 3) is maintained through the vacuum to sustain cavity pressure.

Figure 11A:
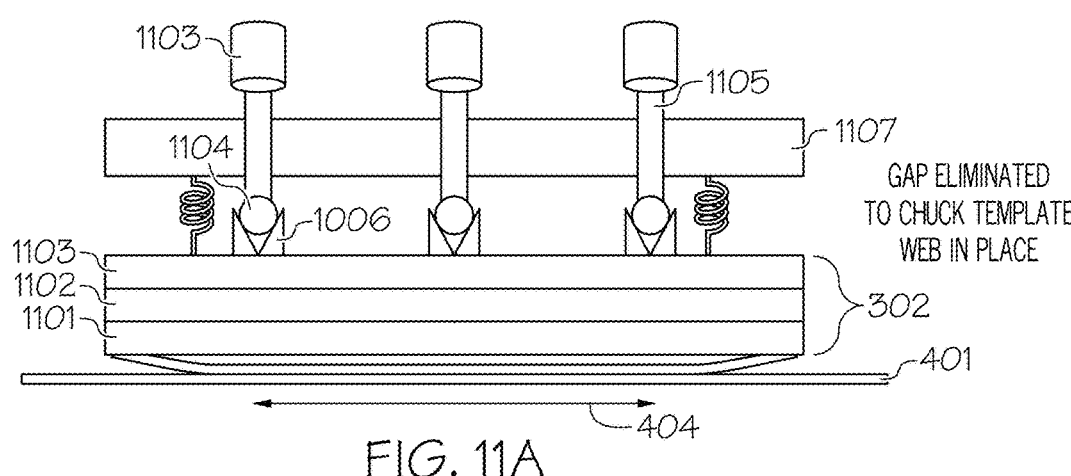
FIGS. 11A-11C illustrates the components of the UV transparent vacuum preloaded air bearing in accordance with an embodiment of the present invention.
Figure 11B:
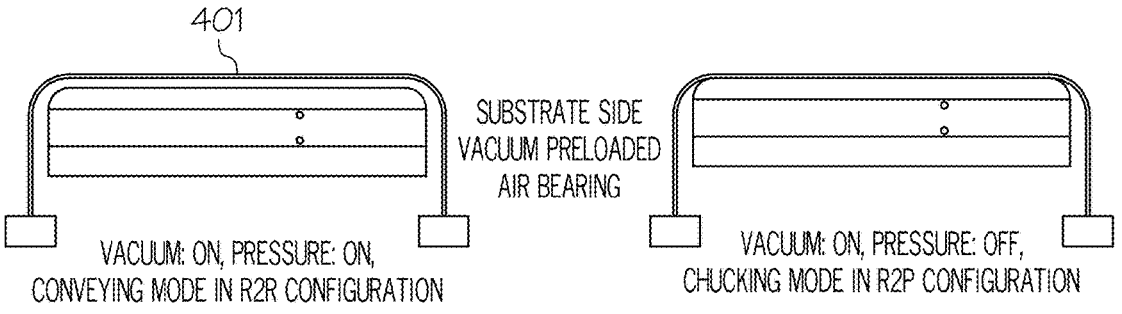
Figure 11C:
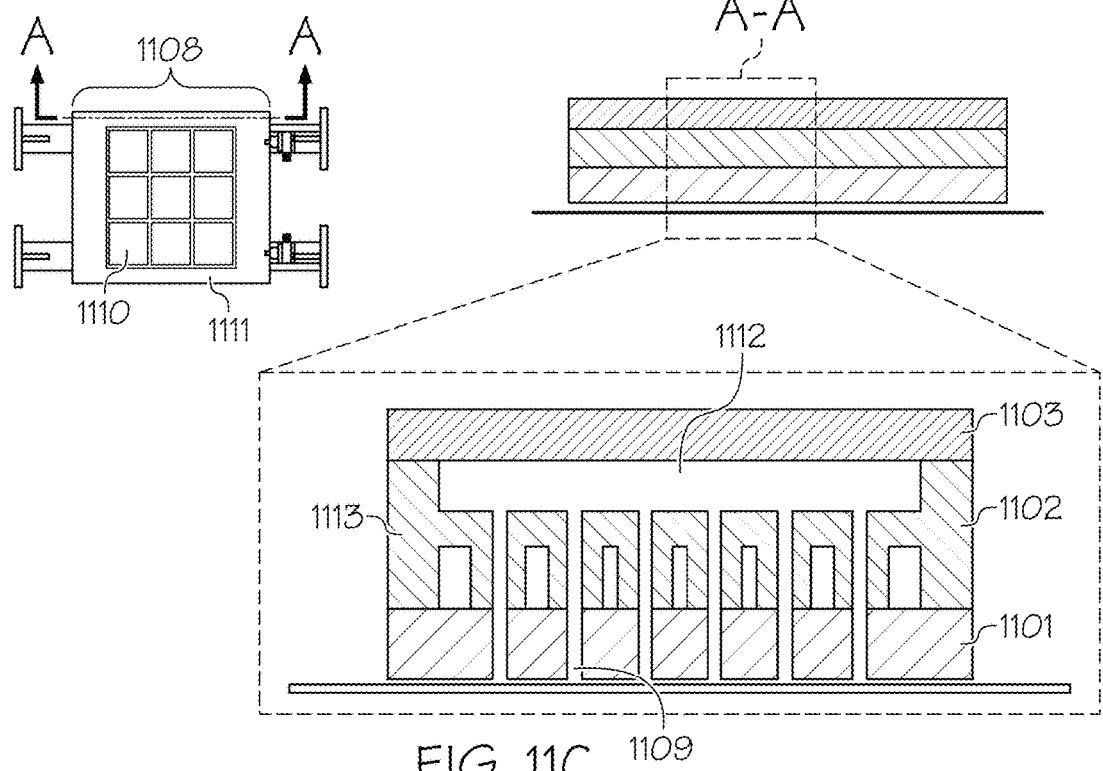

FIGS. 11A-11C illustrates the components of the UV transparent vacuum preloaded air bearing 302 in accordance with an embodiment of the present invention. Referring to FIGS. 11A-11C, FIGS. 11A-11C illustrate that UV transparent vacuum preloaded air bearing assembly 302 consisting of 3 plates, 1101, 1102, 1103. In one embodiment, the bottom plate 1101 (adjacent to substrate web 401) is made of porous ceramic to ensure vacuum chucking of the web with minimal dimples in stop-and-start applications. In continuous applications, vacuum and positive air pressure are both applied to convey the web. In one embodiment, the central zone is UV transparent. Furthermore, in one embodiment, metal plates 1102, 1103 in the middle and away from the web are used to route air and vacuum to the necessary areas of the web. In one embodiment, the three plate assembly sits on kinematic joints that can be manually aligned as needed. Capacitive sensors are incorporated on the edges of the air bearings for alignment correction. In one embodiment, the UV transparent region 1108 is drilled with holes and pathways 1109 to pump air onto the template web to create a curvature as shown in FIG. 11C. This curvature is used to ensure substantially point or line contact with liquid resist on the substrate web. An array of cameras can be optionally mounted on top of the UVT (ultraviolet transmitting) chuck to observe formation of bubbles, if any. In case of any bubble entrapment, extra air can be targeted at the specific location using the pathways in the UV transparent chuck to mitigate the bubble. In one embodiment, image processing is used to detect bubbles and pneumatic controllers are automatically activated. A similar assembly is used below the substrate web in the conveyer/ chuck mode. The substrate chuck assembly may not have a UV transparent part because the UV lamp is situated above the template. However, in some embodiments, this configuration may be reversed.

FIG. 11B shows the substrate side of the vacuum preloaded air bearing 302 for two different modes. In one of the modes (left side), the vacuum is on, the air pressure is on and the mode is the conveying mode in the R2R configuration. In the other mode (right side), the vacuum is on, the air pressure is off and the mode is the chucking mode in the R2P configuration.

FIG. 11C shows the side section view of vacuum preloaded air bearing 302, which includes the UVT (ultraviolet transmitting) acrylic plate 1110 and the porous region 1111 with through holes 1109 on edges to the chuck/convey web as shown in the bottom view of UV transparent preloaded air bearing showing the UV transparent region. FIG. 11C further illustrates vacuum supply 1112 and bearing 1113 with positive pressure supply.

Figure 12A:
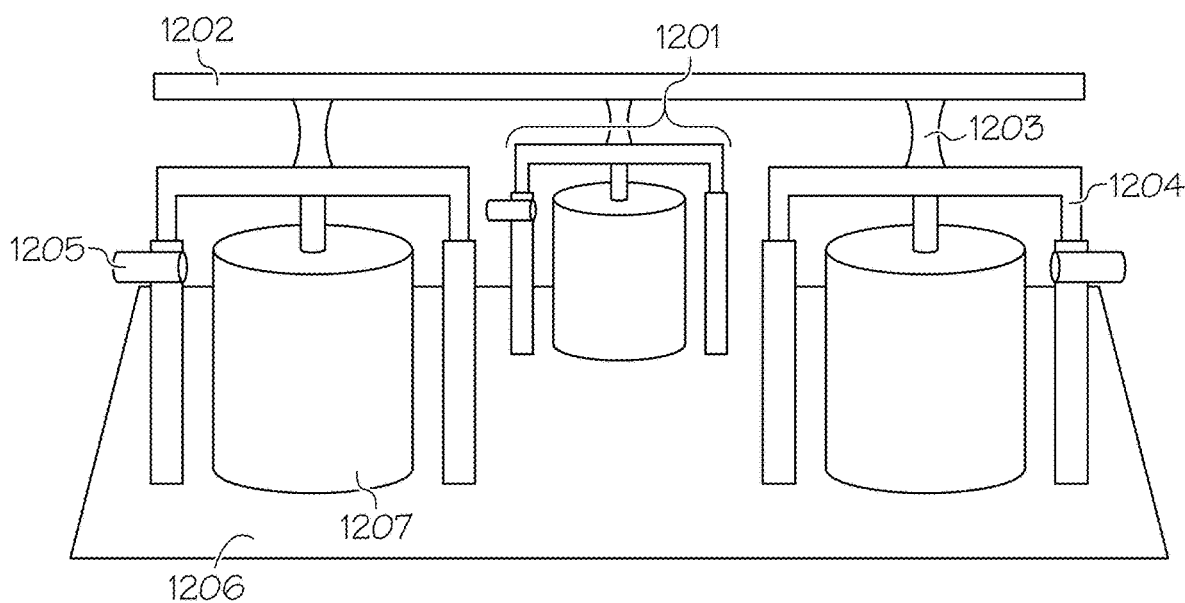
FIGS. 12A-12C illustrate the vertical-tip-tilt motion stage in accordance with an embodiment of the present invention.
Figure 12B:
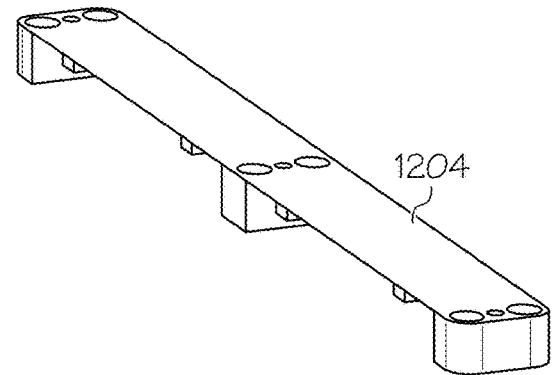
Figure 12C:
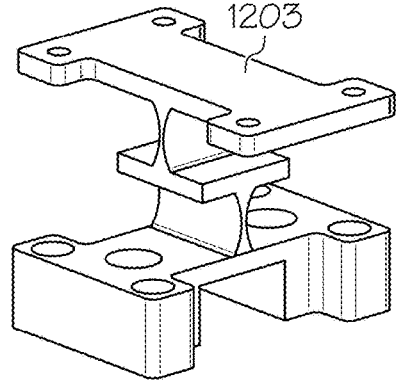

FIGS. 12A-12C illustrate the vertical-tip-tilt motion stage 119 (FIG. 1) in accordance with an embodiment of the present invention.

Referring to FIGS. 12A-12C, FIGS. 12A-12C describe the stage for vertical motion and tip and tilt alignment. Three actuators 1201 are mounted vertically on a base plate 1202 as shown in FIG. 12A. The vertical motion of the actuators is defined by the compliant translational joints that are designed to increase range of motion while maintaining high stiffness. Limit switches and mechanical hard stops are added to sense the end of the travel range and avoid damage to the motors and bearings.

In particular, FIG. 12A illustrates a flexural universal bearing 1203 (FIG. 12C includes a detailed drawing of flexural universal bearing 1203) connected to base plate 1202 and translational flexure bearing 1204 (FIG. 12B includes a detailed drawing of translational flexure bearing 1204). In one embodiment, a displacement sensor 1205 is placed on translational flexure bearing 1204 connected to stationary chassis 1206. Additionally, as shown in FIG. 12A, each actuator 1201 includes a voice coil motor 1207.

Figure 13B:
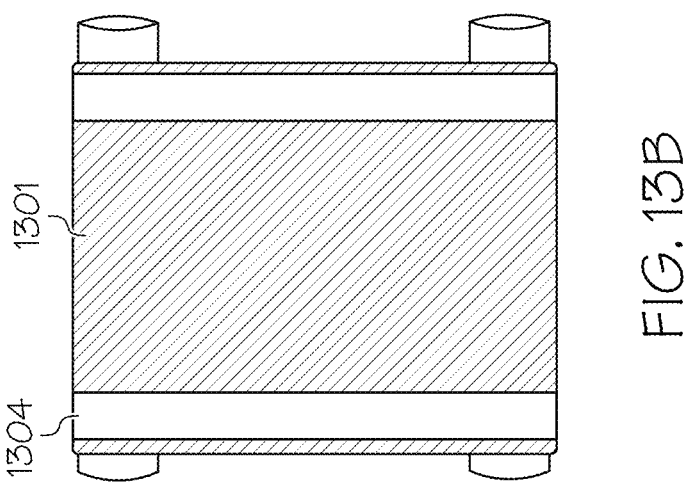
FIGS. 13A-13B illustrate the at-line mechanism for template and substrate parallelism in accordance with an embodiment of the present invention.
Figure 13A:
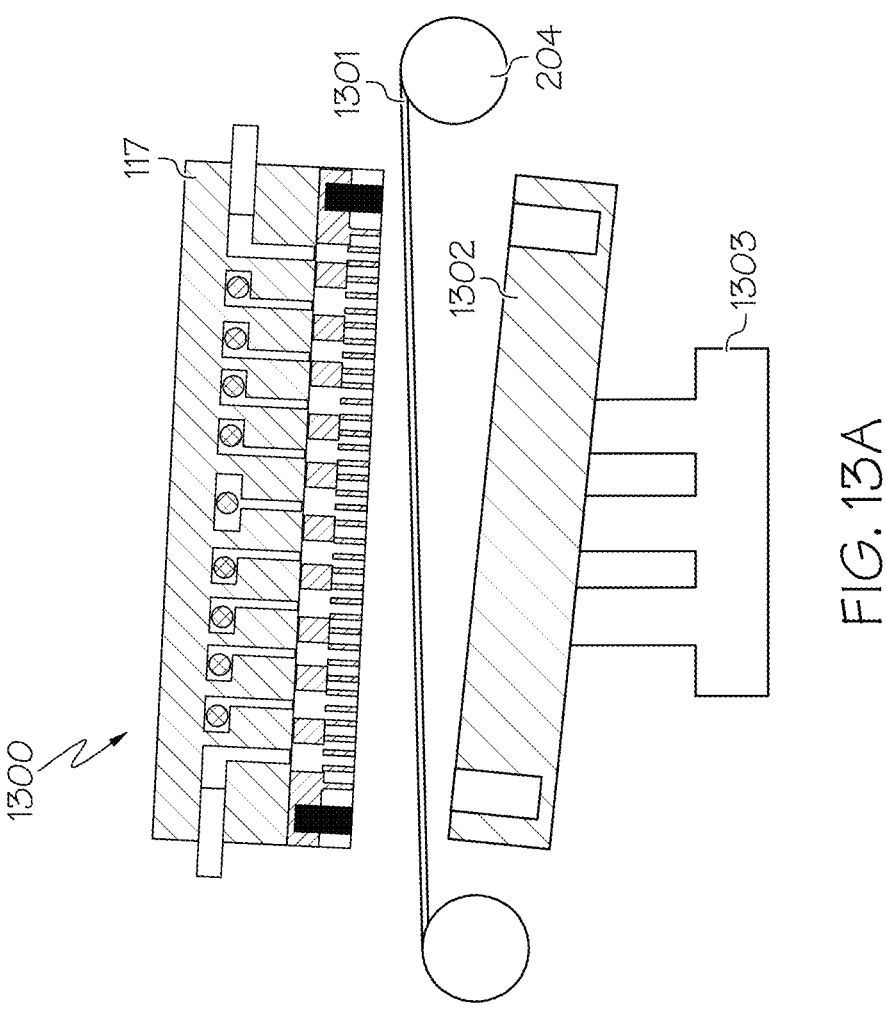

FIGS. 13A-13B illustrate a precision alignment mechanism 1300 for plates and webs in accordance with an embodiment of the present invention. As shown in FIG. 13A, mechanism 1300 includes a UV transparent chuck 117 with incorporated capacitance sensors. Mechanism 1300 further includes a roll template 1301 on precision idlers 204, a pin chuck 1302 with incorporated capacitance sensors, and a VCM stage 1303 for vertical, tip and tilt motion. As shown in FIG. 13B, metal 1304 is deposited on the edges of roll template 1301 to measure parallelism.

As shown in FIG. 13A, mechanism 1300 is deployed to ensure parallelism between UV transparent chuck 1107, the template web precision idlers 204 and the substrate chuck (or substrate air bearing). In one embodiment, vertical-tip-tilt motion stage 119 (FIG. 1) is automatically controlled. In one embodiment, the vacuum chuck (not shown) mounted on vertical-tip-tilt motion stage 119 is incorporated with capacitive sensors. In one embodiment, UV transparent vacuum preloaded air bearing's pitch and roll angle is manually adjusted by mounting the air bearing on a kinematic joint. The metallic template web (or any material responsive to displacement measurement sensors) traverses through precision idlers 204 mounted on manual alignment stages. As a result, parallelism can be maintained between the three bodies with an accuracy of less than 0.1 radians.

FIGS. 14 and 15A-15H illustrate the process steps involved in the R2P-NIL and R2R-NIL in the start-stop configuration. FIG. 14 is a flowchart of a method 1400 of the process steps for R2P-NIL and R2R-NIL in the start-stop configuration in accordance with an embodiment of the present invention. FIGS. 15A-15H depict the cross-sectional views of the process steps for R2P-NIL and R2R-NIL in the start-stop configuration using the steps described in FIG. 14 in accordance with an embodiment of the present invention.

Figures 15A, 15B, 15C, 15D, 15E, 15F, 15G, 15H:
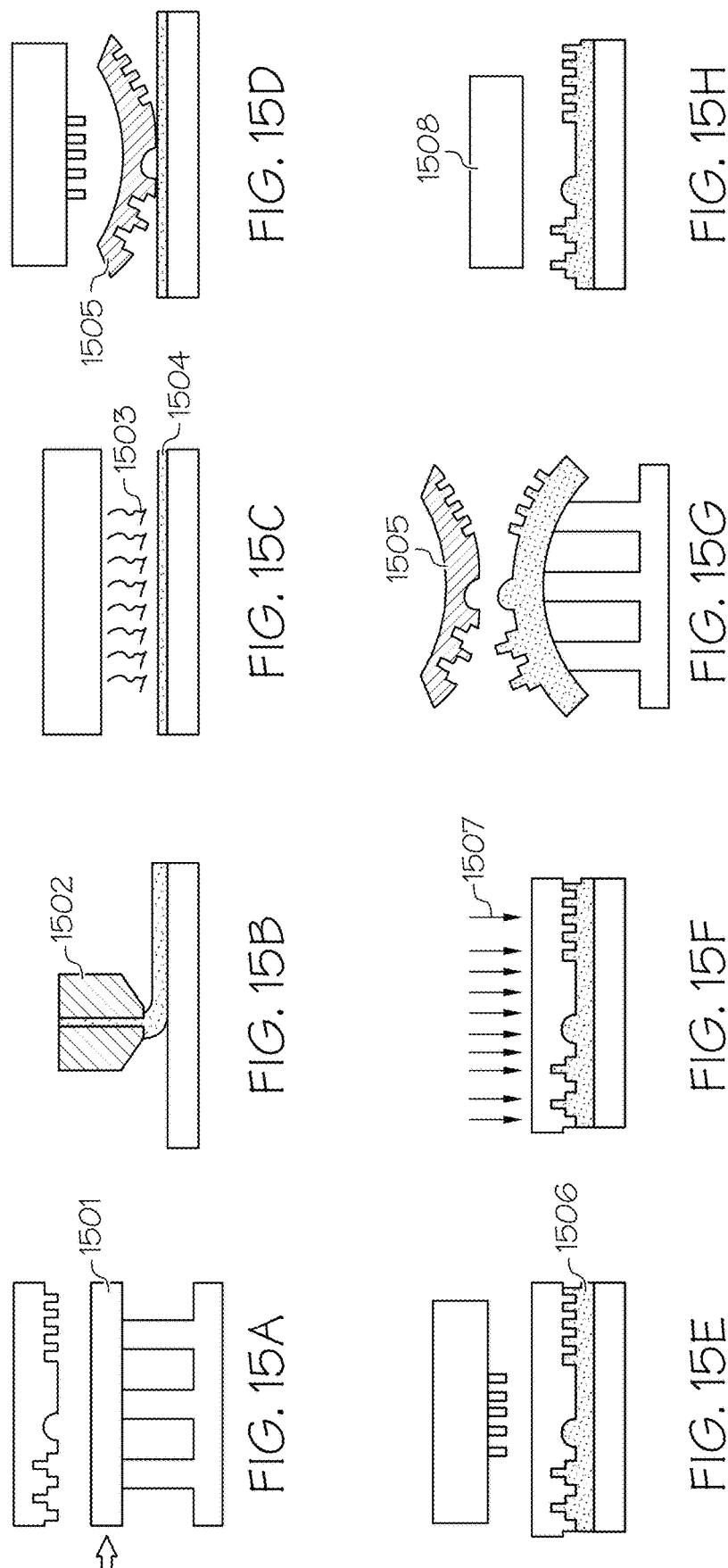
FIGS. 15A-15H depict the cross-sectional views of the process steps for R2P-NIL and R2R-NIL in the start-stop configuration using the steps described in FIG. 14 in accordance with an embodiment of the present invention.

Referring to FIG. 14, in conjunction with FIGS. 15A-15H, in step 1401, substrate 1501 is positioned via a substrate web guide for R2R as shown in FIG. 15A.

In step 1402, a slot-die coating of resist solution 1502 is performed as shown in FIG. 15B. In one embodiment, a ~10% resist solution 1502 is deposited on substrate 1501.

In step 1403, solvent evaporation is performed thereby exposing resist solution 1502 to IR radiation 1503 leaving a resist layer 1504 as shown in FIG. 15C. In one embodiment, by IR drying, the 90% solvent evaporates leaving a 10-1000 nm resist layer 1504 (or 25 nm BT20 adhesive layer).

In step 1404, the plate temperature is cooled to ambient conditions.

In step 1405, template 1505 is bowed until contact is made with substrate 1501 as shown in FIG. 15D. In one embodiment, roll template 1505 is bowed using the UV transparent vacuum preloaded air bearings 302 (FIG. 3). In one embodiment, bowing is utilized for bubble mitigation. In one embodiment, web deflection is substantially higher than the flatness of the substrate to ensure single point or single line contact.

Once contact is made, capillary forces are allowed to take over and air bar pressure is increased in step 1406 to aid in capillary fill 1506 as shown in FIG. 15E.

In step 1407, air bar pressure is continued to be applied with UV flash 1507 as shown in FIG. 15F. In one embodiment, a broadband UV lamp is used to cure resist 1504.

In step 1408, UV transparent vacuum preloaded air bearing cavity pressure is reduced to recreate the bow of template 1505 for controlled delamination as shown in FIG. 15G. In one embodiment, template 1505 is bowed to ensure proper peeling in order to prevent pattern shear with template separation. The vertical-tip-tilt stage can also be used to aid the process of template separation. The UVT (ultraviolet transmitting) vacuum preloaded air bearing can also be used to maintain the web position by chucking the web along its edges. Cameras mounted on the top-side of the UV transparent vacuum preloaded air bearing 302 are used to observe bubble entrapment, if any. In one embodiment, the cavity air pressure used for bowing can be appropriately corrected to mitigate the bubble.

In step 1409, inline spectral imaging and scatterometry 1508 are utilized to characterize and quantify defects as shown in FIG. 15H.

Figure 16:
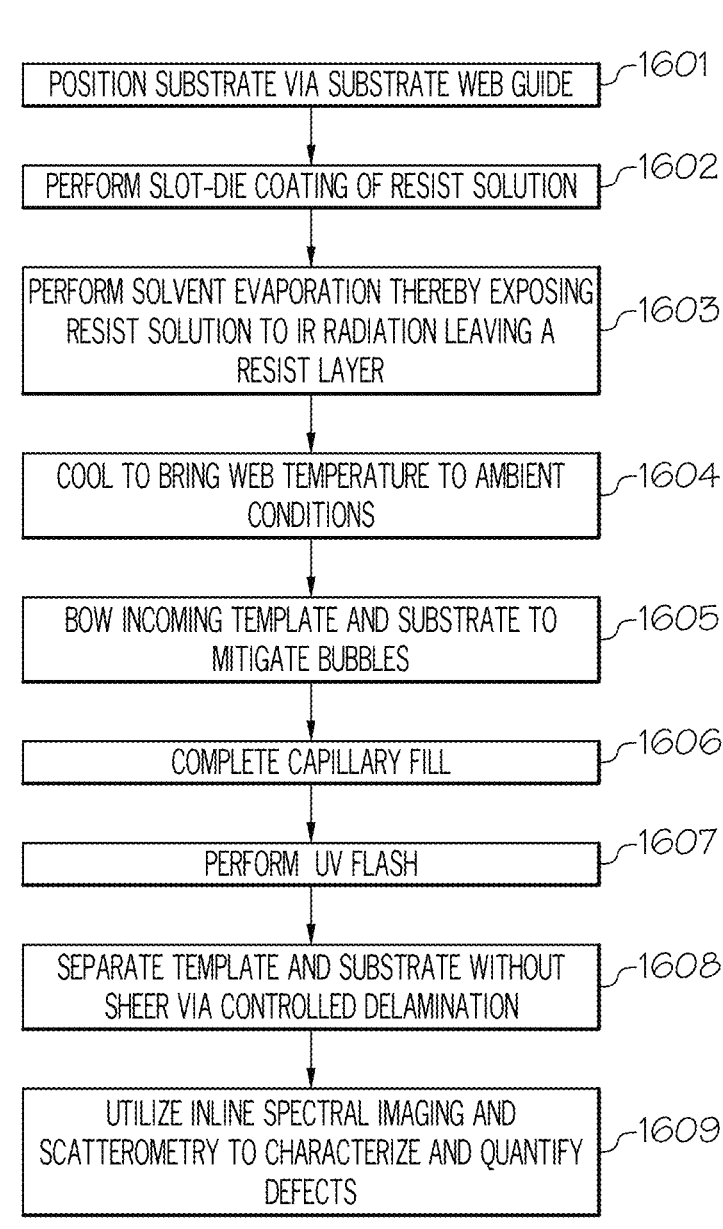
FIG. 16 is a flowchart of a method of the process steps in the continuous R2R-NIL configuration in accordance with an embodiment of the present invention.

FIGS. 16 and 17A-17H illustrate the process steps involved in the continuous R2R-NIL configuration. FIG. 16 is a flowchart of a method 1600 of the process steps in the continuous R2R-NIL configuration in accordance with an embodiment of the present invention. FIGS. 17A-17H depict the cross-sectional views of the process steps in the continuous R2R-NIL configuration using the steps described in FIG. 16 in accordance with an embodiment of the present invention.

Figures 17A, 17B, 17C, 17D, 17E, 17F, 17G, 17H:
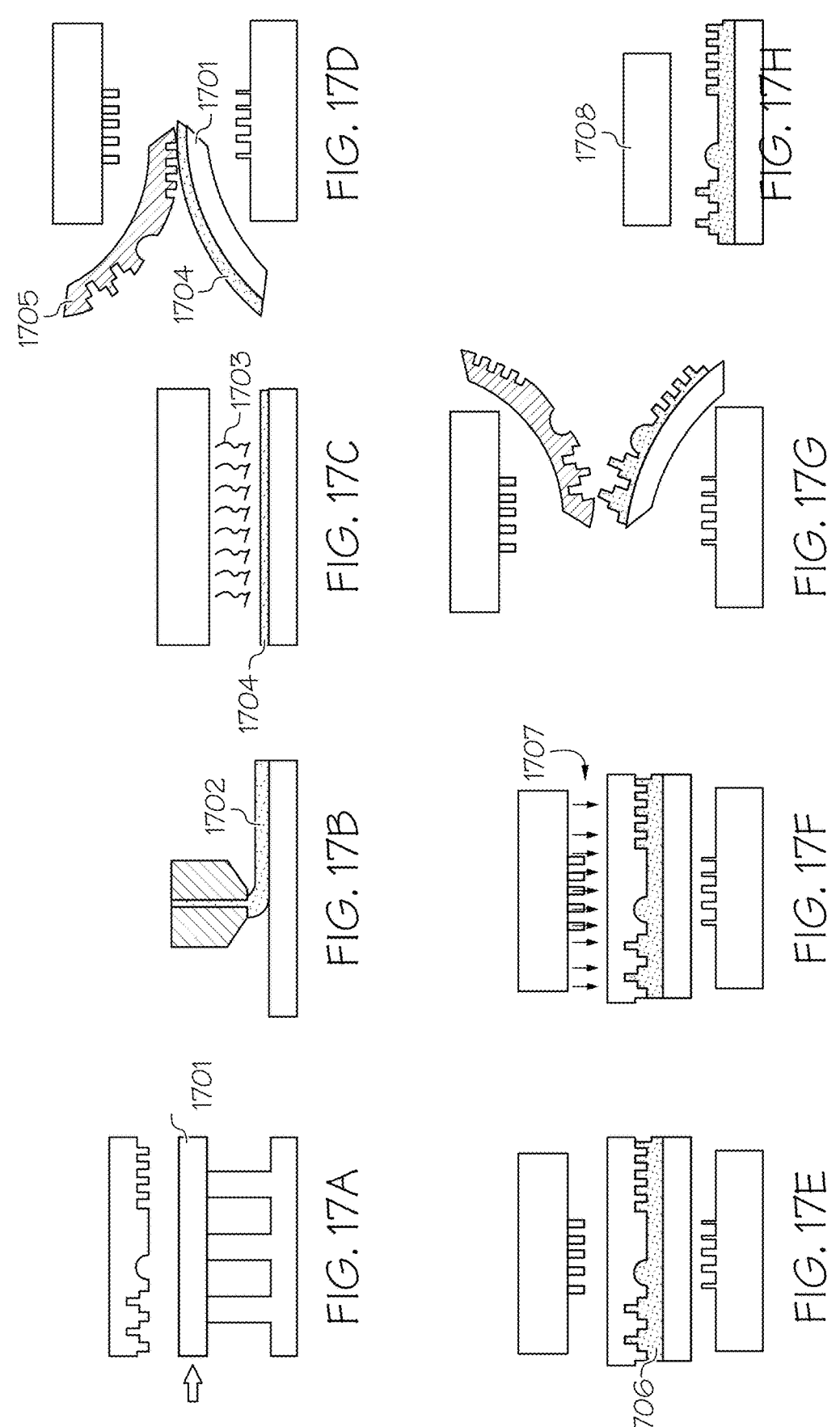
FIGS. 17A-17H depict the cross-sectional views of the process steps in the continuous R2R-NIL configuration using the steps described in FIG. 16 in accordance with an embodiment of the present invention.

Referring to FIG. 16, in conjunction with FIGS. 17A-17H, in step 1601, substrate 1701 is positioned via a substrate web guide as shown in FIG. 17A. In one embodiment, a web guide with a 1, 10, 100 or 1,000 micrometer accuracy is used to maintain roll alignment and prevent telescoping over the entire process.

In step 1602, a slot-die coating of resist solution 1702 is performed as shown in FIG. 17B. In one embodiment, a ~10% resist solution 1702 is deposited on substrate 1701. In one embodiment, slot-die coating is preceded with de-interleaving and web cleaning.

In step 1603, solvent evaporation is performed thereby exposing resist solution 1702 to IR radiation 1703 leaving a resist layer 1704 as shown in FIG. 17C. In one embodiment, by IR drying, the 90% solvent evaporates leaving a 10-1,000 nm resist layer 1804 (or 25 nm BT20 adhesive layer).

In step 1604, the web temperature is cooled to bring the web temperature to ambient conditions.

In step 1605, incoming template 1705 and substrate 1701 with resist layer 1704 are bowed to mitigate bubbles as shown in FIG. 17D. In one embodiment, template 1705 and substrate 1701 are maintained at the same tension and are traversing at the same speed. The amount of speed and tension mismatch the patterns can handle without shearing is discussed further below.

As template 1705 and substrate 1701 approach the imprint area, the vacuum preloaded air bearings on the top and bottom induce a curvature by applying positive pressure. This curvature induces a line contact and mitigates bubbles. Downstream of the curvature zone, template 1705 and substrate 1701 are in complete contact which allows capillary fill 1706 in step 1606 as shown in FIG. 17E. Cameras mounted on the top-side of UV transparent vacuum preloaded air bearing 302 (FIG. 3) are used to observe bubble entrapment, if any. The positive air pressure can be appropriately corrected to mitigate the bubble In step 1607, UV flash 1707 is performed as shown in FIG. 17F.

In step 1608, template 1705 and substrate 1701 are separated without sheer via controlled delamination as shown in FIG. 17G. For controlled separation, the curvature induced downstream of the imprinting zone leads to a single line separation and proper peeling. In one embodiment, it is ensured that the gap between the web and vacuum preloaded air bearing 302 is small enough (<100 μm) by increasing the vacuum pressure at the edges. Due to this, curvature in the web due to cavity in the pressure is produced faster.

In step 1609, inline spectral imaging and scatterometry 1708 are utilized to characterize and quantify defects as shown in FIG. 17H.

Figures 18A, 18B, 18C:
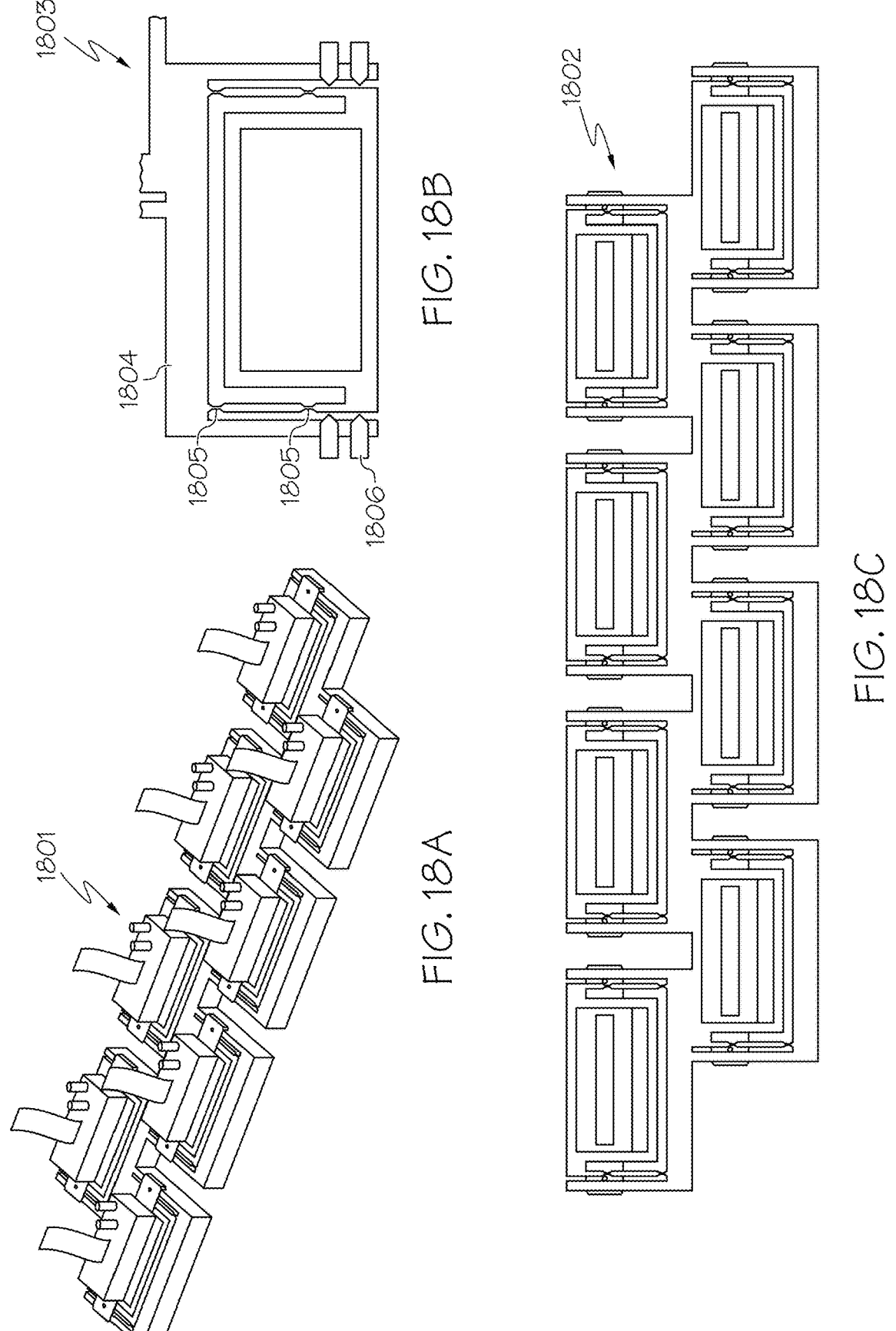
FIGS. 18A-18C illustrate an ink-jet assembly and fixture for large width ink-jetting in accordance with an embodiment of the present invention.

FIGS. 18A-18C illustrate an ink-jet assembly and fixture for large width ink-jetting in accordance with an embodiment of the present invention. Referring to FIGS. 18A-18C, FIG. 18A illustrates the top view 1801 and FIG. 18B illustrates the bottom view 1802 of the large width inkjet assembly. FIG. 18C further illustrates the compliant mechanism 1803 that includes the fixed body 1804, compliant revolute joints 1805, and manual actuators 1806.

In one embodiment, inkjet drops are deposited uniformly with an accuracy of 1-200 micrometers over a large width (500 mm). In another embodiment, an inkjet head is mounted on a stage with compliant bearings allowing motion in Y and θ. Combining one or more such inkjet stages provides a fixture with the necessary degrees of freedoms and sufficient range of motions to dispense drops uniformly.

Figure 19:
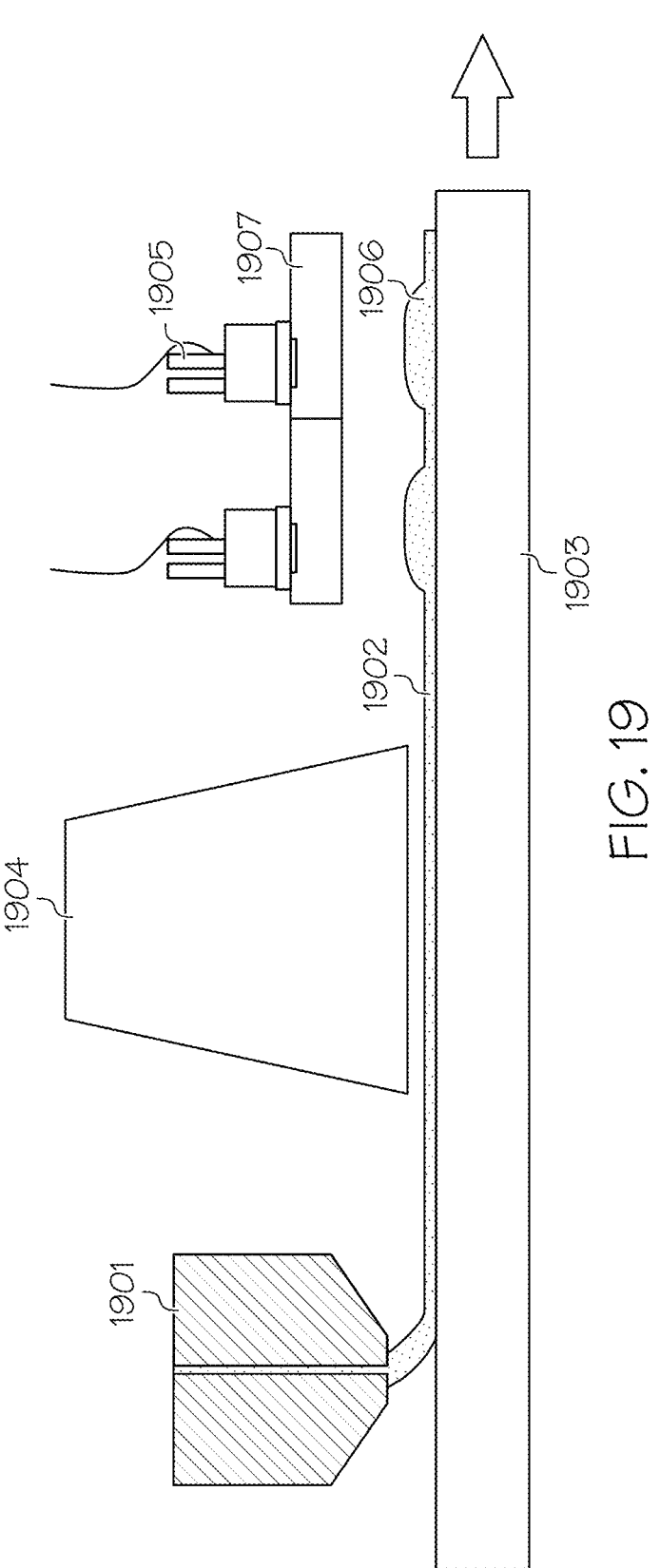
FIG. 19 is a schematic view of the use of inkjets in conjunction with slot-die coating to obtain non-uniform film profiles as required for non-uniform nano-patterning in accordance with an embodiment of the present invention.

FIG. 19 is a schematic view of the use of inkjets in conjunction with slot-die coating to obtain non-uniform film profiles as required for non-uniform nano-patterning in accordance with an embodiment of the present invention.

As shown in FIG. 19, slot-die coater 1901 deposits a resist solution 1902 on substrate 1903, where the solvent in resist solution 1902 is evaporated via IR heater 1904. As also shown in FIG. 19, inkjet heads 1905 are used to deposit inkjet drops 1906 using inkjet fixture 1907.

Inkjet deposition of resist on slot-die coated films allows local control of the film thickness for better residual layer control assuming there are systematic non-uniformities in the system. The inkjetting can be done prior to the patterning step, and after evaporation by dispensing a formulation of the resist without the solvent. The determination of locations and volumes of inkjetted drops on the slot-die coated films can be done based on the pattern information on the template as well as the measurement of film thickness on the substrate.

In general, the determination of the locations of inkjetted drops, and initial alignment and contact between the template and the substrate requires robust metrology of the incoming film as well as the outgoing pattern. This metrology needs to be in-situ and can be coupled automatically with process control with the machine in the loop or with the help of reduced-order, physical, statistical or empirical models of various unit steps in the process. Based on this metrology, the process can be adjusted to ensure that all tolerances are substantially met during the initial start-up phase during which it is expected that the metrology would be the rate-limiting step. Following this initial start-up, the system can be run with minimal metrology sampled intelligently across the process in a feedforward "blind" manner until there is an anomaly that is detected.

It has been reported that exceeding the coating window at higher traversing speeds in slot-die coating leads to bead breakup and air entrainment leading to non-uniform coating. Consequently, although average film thickness decreases, it also leads to ribbing, i.e., waviness along cross web direction. By modelling air flow into slot gap, an exact description of the film thickness variation would be predicted. In one embodiment, non-uniformities in film thickness due to ribbing is compensated by inkjet dispense through a feed forward control system. This method would be used to coat films with high throughput. The slot-die coater can also be equipped with a vacuum box near the upstream lip to stabilize the bead and prevent air entrainment in the slot.

In one embodiment, an ex-situ metrology setup to measure film thickness variation due to air entrainment involves an array of reflectometers (or a microscope). Once film thickness variation has been mapped, the inkjet dispenser is used to dispense resist drops on the substrate at locations of lower thicknesses.

A fluid-template interaction model is used to calculate the effect of capillary forces on a tensioned web, particularly to check if the web collapses under capillary forces. A quantified relation between applied tension and film thickness variation is also found. Based on the lubrication theory which characterize thin film flows, the following partial differential equations (PDEs) govern the physics of the fluid-web interaction.

$$\frac{\partial h}{\partial t} = \frac{\partial}{\partial x}\left\{\frac{h_s^2}{12\mu}\frac{\partial P_j}{\partial x}\right\}; \, P_f - P_a = -T_0\frac{\partial^2 h_1}{\partial x^2}; \, -P_a = T_0\frac{\partial^2 h_2}{\partial x^2}$$

where $h_1$=resist film thickness, $h_2$=gap of the template web from the substrate web in the region not containing resist, $P_f$=fluid pressure, $P_a$=pressure from air bearings, $T_0$=applied web tension. A solution is assumed of the below format.

$$h_1 = a_0 + a_1 x + a_2 x^2 + a_3 x^3 + \sum_{i=1}^{amax} A_i(t)\cos\left(\frac{l\pi x}{c}\right); \, h_2 = b_0 + b_1 x + b_2 x^2;$$

Using continuity, differentiability and capillary pressure difference boundary conditions at the fluid-air interface and symmetry elsewhere, the equations can be solved numerically.

Figure 20:
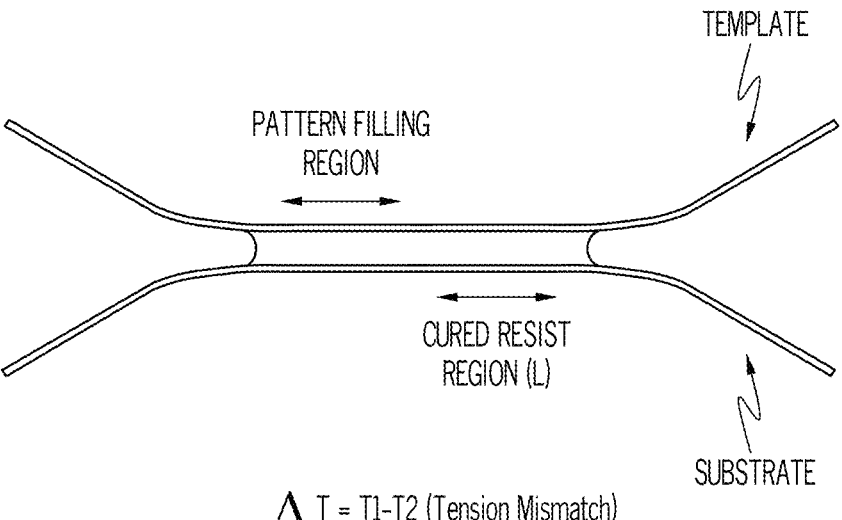
FIG. 20 illustrates the tension and speed mismatch allowance in the template and substrate web to avoid shearing of nano-patterns in accordance with an embodiment of the present invention.

FIG. 20 illustrates the tension and speed mismatch allowance in the template and substrate web to avoid shearing of nano-patterns in accordance with an embodiment of the present invention.

Process control in slot-die coating can be done by monitoring the bead location and liquid pressure. Pressure below a threshold leads to air entrainment leading to defects. Bead contact with the lips of the slot-die also indicates onset of air entrainment.

Reflectometers can be used to measure the imprint resist film thickness along a width. Any anomaly in film thickness can be used as a sensor to trigger changes in flow conditions.

The following equation describes wet film thickness in Tensioned Web Over Slot Die (TWOSD). T (tension), coating speed (V), and Pac (exit pressure) can be adjusted on the fly to minimize film thicknesses. Parameters, such as wrapping angle, slot gap and height, can be varied offline to achieve minimization. It is to be noted that larger wrapping angles are indirectly proportional to wet film thicknesses.

$$\frac{h}{l} = \phi\left(\frac{\mu V}{T}\right)^b\left(\frac{P_{ac}WH}{(D/L)\theta^2}\right)^c\left(\frac{l}{(\sigma/\rho g)^{0.5}}\right)^d.$$

This correlation was first applied to experimental data for Die A, and the numerical constants obtained by least-square fitting were found to be:
Φ=0.982
b=0.50
c=0.36
d=1.38.

Figure 21:
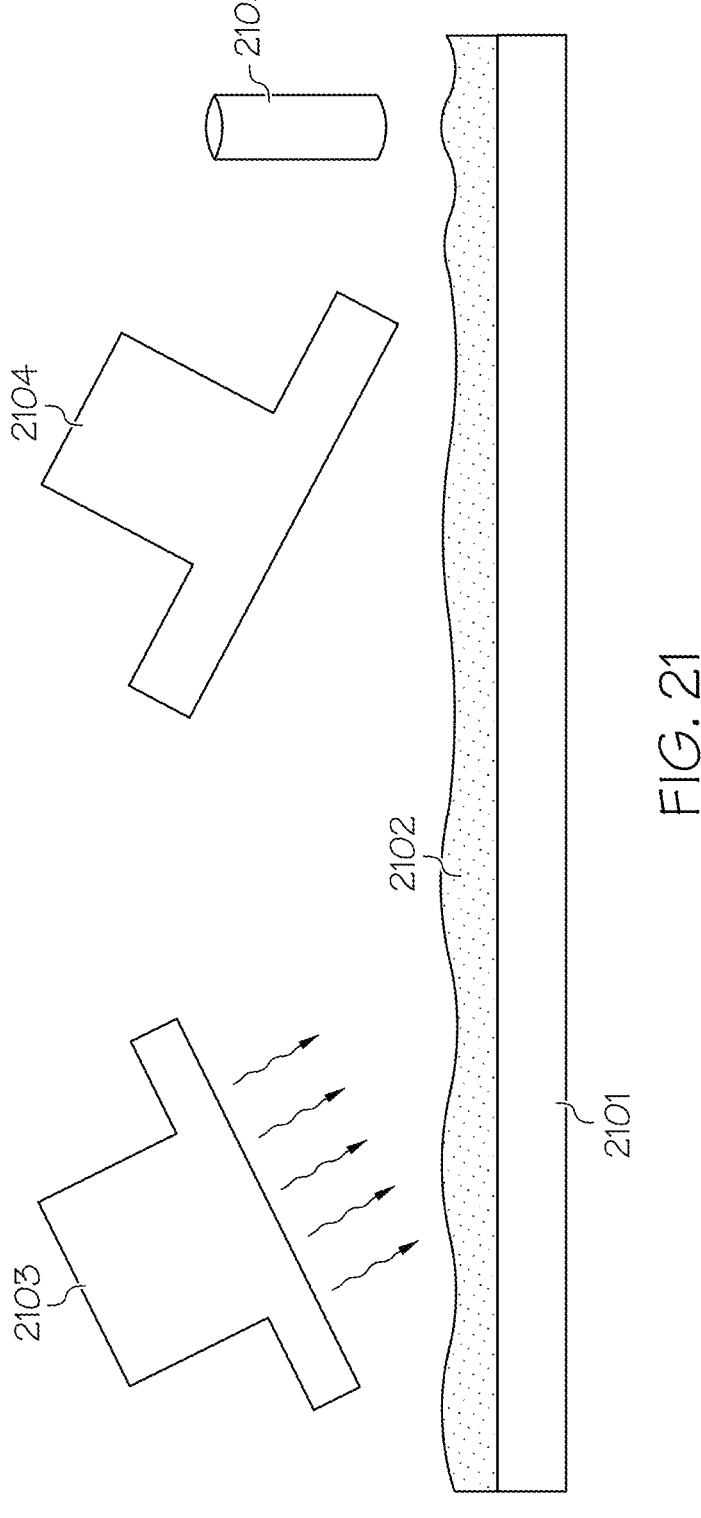
FIG. 21 is a schematic view of in-line metrology and DMD (digital micromirror device) based thermal actuation to control the resist thickness profile before entering the NIL module in accordance with an embodiment of the present invention.

FIG. 21 is a schematic view of the in-line metrology and DMD (digital micromirror device) based thermal actuation to control the resist thickness profile before entering the NIL module in accordance with an embodiment of the present invention. The DMD device is useful for spatial control of the resist thickness profile to allow imprinting of patterns with varying densities or to compensate for systematic defects in the process.

Referring to FIG. 21, IR heater 2103 is used to remove the solvent in the wet film 2102 deposited on substrate 2101 via IR radiation. The imprint resist film thickness can be controlled to mitigate non-uniformities created by the slot-die coating and evaporation process. An ellipsometer/reflecto-meter 2105 is used to measure thickness at a location. This measurement is used as a reference to calibrate charge-coupled device (CCD) camera 2104. CCD camera 2104 then provides large area film thicknesses based on thin film interference of broadband light (above yellow). The non-uniformity data collected can be used to actuate a DMD array and provide IR flux to compensate.

Feedforward models can also be built by first collecting data across several experiments and then running offline optimization routines to determine the best process conditions. Alternatively, process control can also be conducted through "machine-in-the-loop" sensing and optimization using techniques, such as neural nets, genetic algorithms, etc. After establishment of feedforward models, the use of intelligent sampling and virtual metrology techniques can be used to enable real-time automatic process control.

Spectral imaging and scatterometry are used to characterize and quantify defects after the NIL process and can be used for feedback and optimization.

Flow of a fluid in domains that have much smaller thickness than lateral length scales are adequately described by the lubrication approximation. For Marangoni, i.e., surface tension gradient, driven flows in the presence of evaporation, the lubrication approximation leads to the following equation:

$$\frac{\partial h}{\partial t} + \frac{\partial}{\partial x}\left\{\frac{h^2}{3\mu}\left[\gamma\frac{\partial^2 h}{\partial x^2} + \frac{\partial}{\partial x}\left(\frac{J^2}{\rho_v}\right)\right] + \frac{h^2}{2\mu}\frac{\partial y}{\partial x}\right\} = -\frac{J}{\rho_i}$$

where h=film thickness, t=time, x=spatial co-ordinate, $\mu$=viscosity, $\gamma$=surface tension, J=mass flux across interface, $\rho_1$=liquid density, and $\rho_v$=vapor density. In this equation, temperature controls the viscosity, surface tension, densities as well as the mass flux across the interface.

Preliminary understanding of thin film flows in the presence of evaporation and surface tension gradients can be understood with the help of a linear stability analysis. Work done in the literature suggests that, for diffusion-limited flows, i.e., flows in which the local ambient is saturated with the vapor near the interface and evaporation is limited by diffusion of the vapor, any local film thickness perturbations are damped. This implies that non-uniform films will tend to become uniform in the absence of local substrate topography. On the other hand, for transfer-limited flows, i.e., flows in which there is advection at the interface that prevents the vapor from being saturated at the interface, the flow is unstable. This implies that troughs and valleys get amplified, which renders the film increasingly non-uniform This model has been used to study and predict instabilities in the imprint resist film. In one embodiment, the thin film lubrication theory, with a surface tension boundary condition at the air-resist interface, is used. In one embodiment, the one dimensional PDE is solved using a $4^{th}$ order Range- Kutta method. Based on appropriate heat input, instabilities can be created or mitigated in a uniform/non-uniform film.

Figure 22:
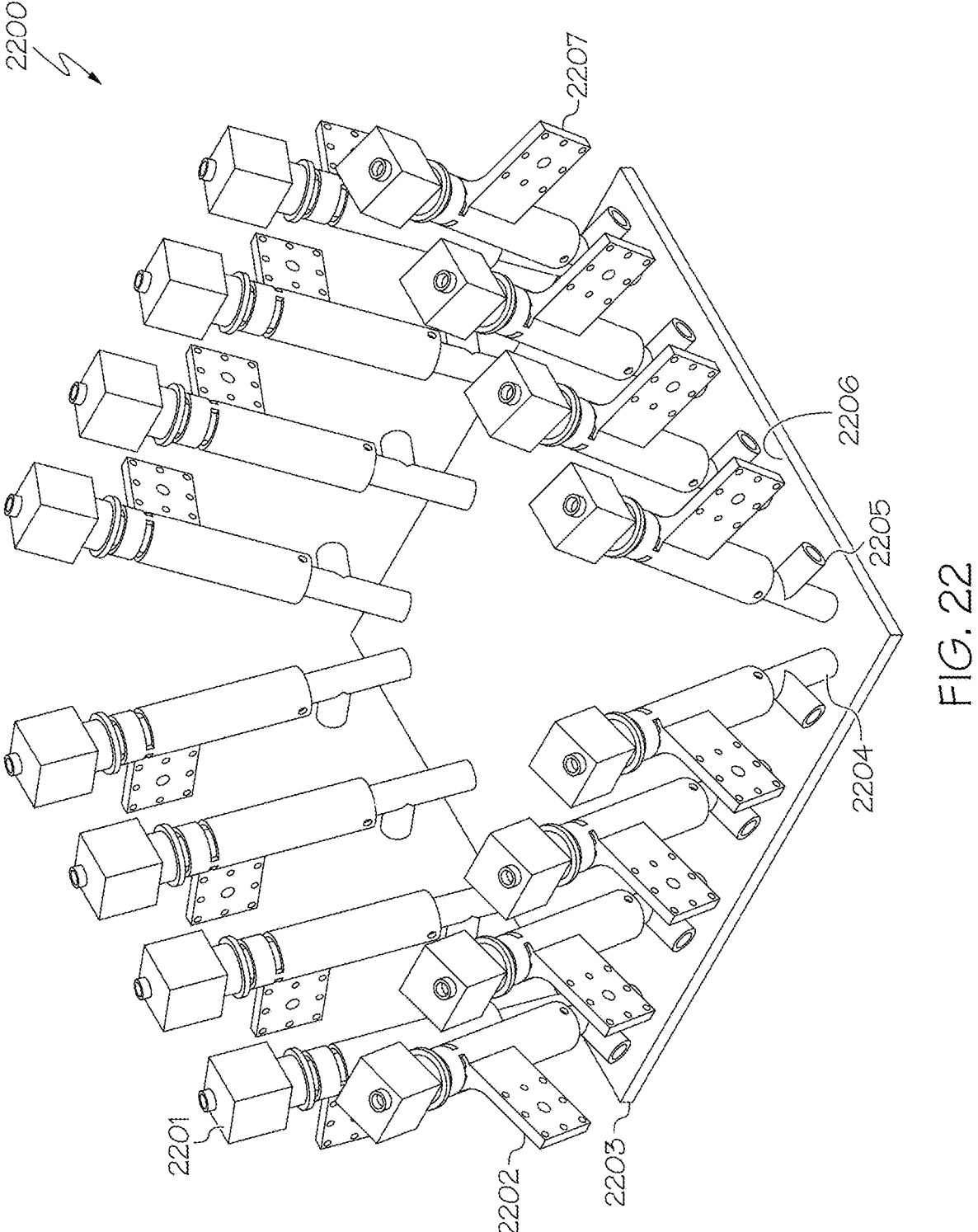
FIG. 22 illustrates an in-line overlay sensing subsystem in accordance with an embodiment of the present invention.

FIG. 22 illustrates an in-line overlay sensing subsystem 2200 in accordance with an embodiment of the present invention. Referring to FIG. 22, subsystem 2200 includes a CCD camera 2201, the edge of patterned area 2202, stainless steel substrate 2203, a microscope 2204, a light source 2205, a glass template 2206 and fixtures for microscopes 2207 (can be attached to an XY stage).

In one embodiment, in-line overlay sensing apparatus 2200 consists of Moiré microscopes aimed at the Moiré marks on the edges of the patterned area on the template and the edges of the imprinting area of the substrate. In one embodiment, the number of Moiré microscopes is between 6-24. The Moiré microscopes are appended with a light source 2205 and CCD camera 2201.

Figure 23:
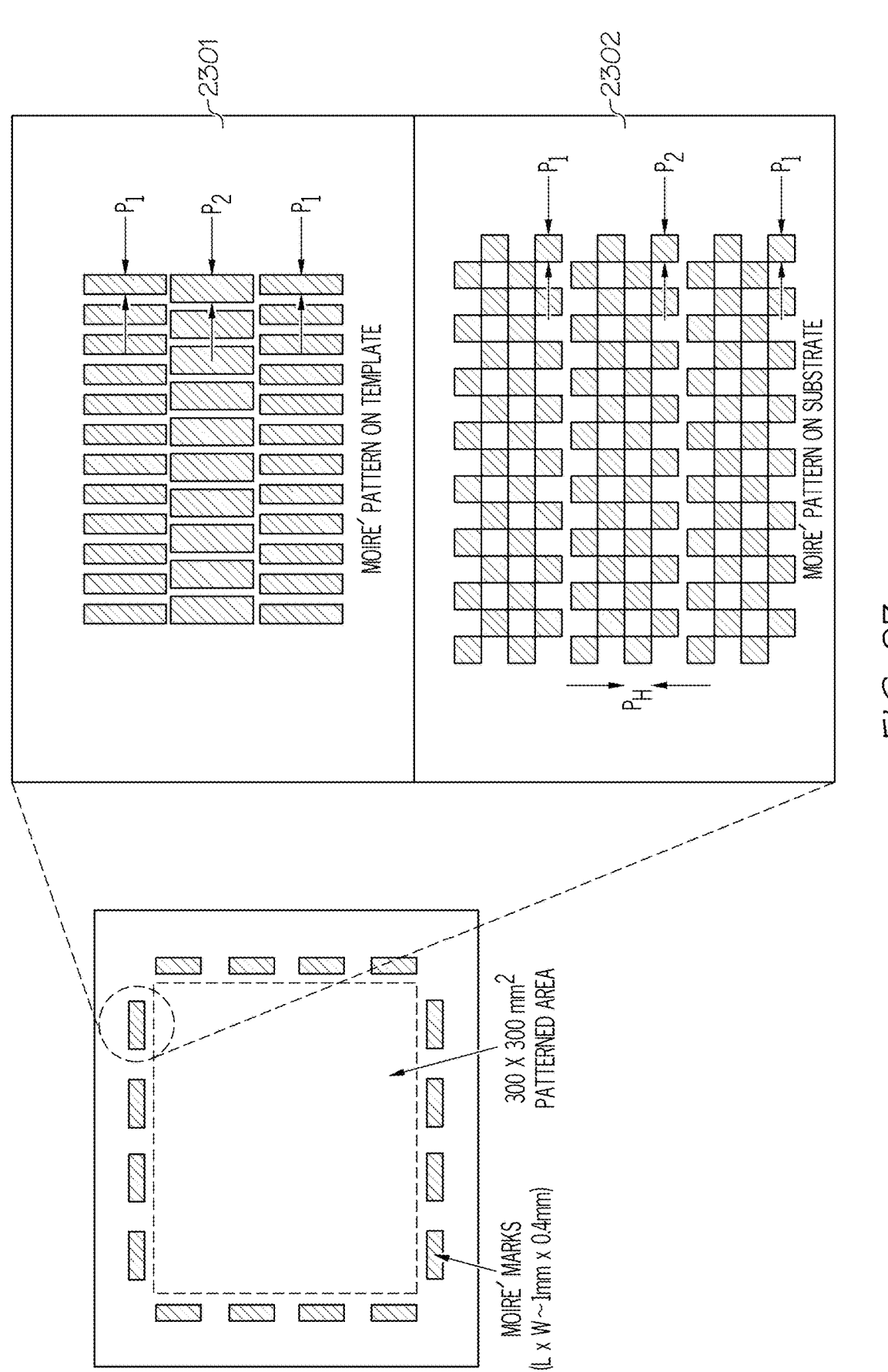
FIG. 23 is a schematic view of the Moiré alignment marks on the template and the Moiré alignment marks on the substrate in accordance with an embodiment of the present invention.

FIG. 23 is a schematic view of the Moiré alignment marks 2301 on the template and the Moiré alignment marks 2302 on the substrate in accordance with an embodiment of the present invention.

Figure 24:
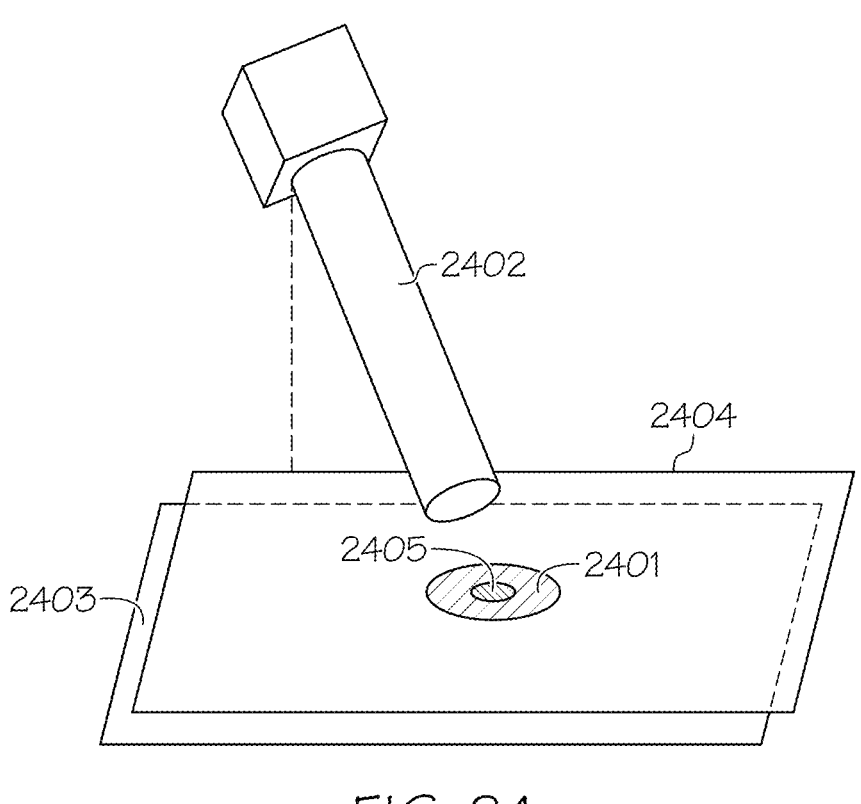
FIG. 24 is a schematic view denoting a Moiré microscope apparatus suitable for embodiments with precise web handling in accordance with an embodiment of the present invention.

FIG. 24 is a schematic view denoting a Moiré microscope apparatus suitable for embodiments with precise web handling in accordance with an embodiment of the present invention.

Referring to FIG. 24, in one embodiment, the Moiré marks are brought within the field of view 2401 of the microscopes 2402 through the web handling system. Once Moiré fringes are captured, the template housing is aligned using in-plane motion (XYθ) to achieve desired overlay. For example, given a web handling accuracy of ±10 micrometers, a 60 nm sensing resolution can be obtained using a microscope 2402 of field of view of 2 mm and $P_1$, $P_2$ and $P_H$ set as 40, 45 and 1 μm, respectively. If necessary, microscopes 2402 are placed on automated XY stages to ensure Moiré marks are in the field of view 2401 of microscopes 2402. FIG. 24 further illustrates the capture range 2405. The capture range is intended to mean the range of misalignments from the aligned position over which alignment can be achieved.

In another embodiment, large bars (equal in size to Moiré fringes) are patterned on template 2403 and substrate 2404 alongside the Moiré marks. These bars are directly viewed from microscope 2402. Moiré marks can be brought into the field of the microscopes 2402 by traversing template 2403 and substrate 2404 by observing the coarse alignment bars through microscope 2402.

Figure 25:
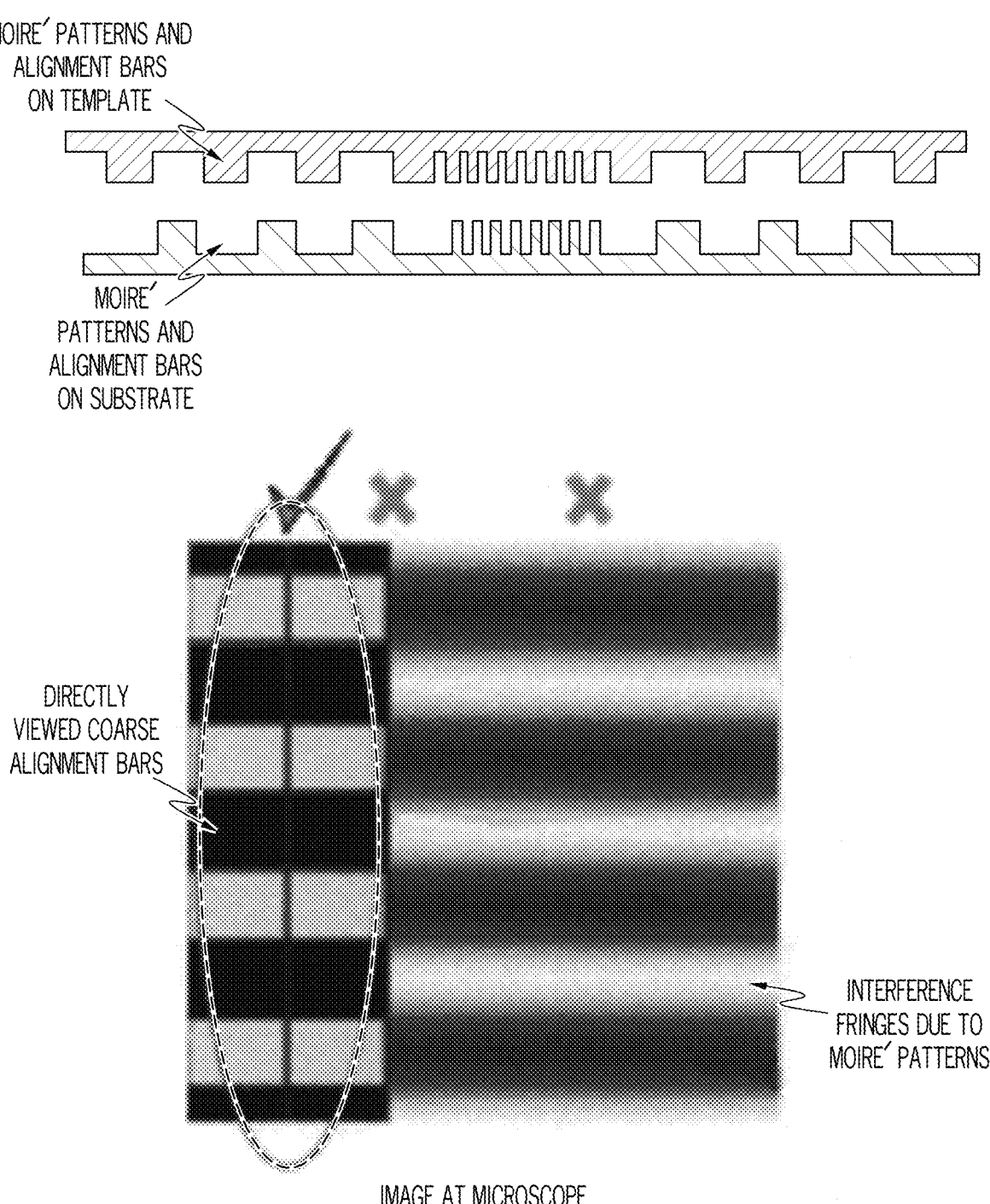
FIG. 25 is a schematic view denoting Moiré alignment marks with coarse alignment bars for embodiments without stringent web handling requirements in accordance with an embodiment of the present invention.

FIG. 25 is a schematic view denoting Moiré alignment marks with coarse alignment bars for embodiments without stringent web handling requirements in accordance with an embodiment of the present invention.

Figure 26A:
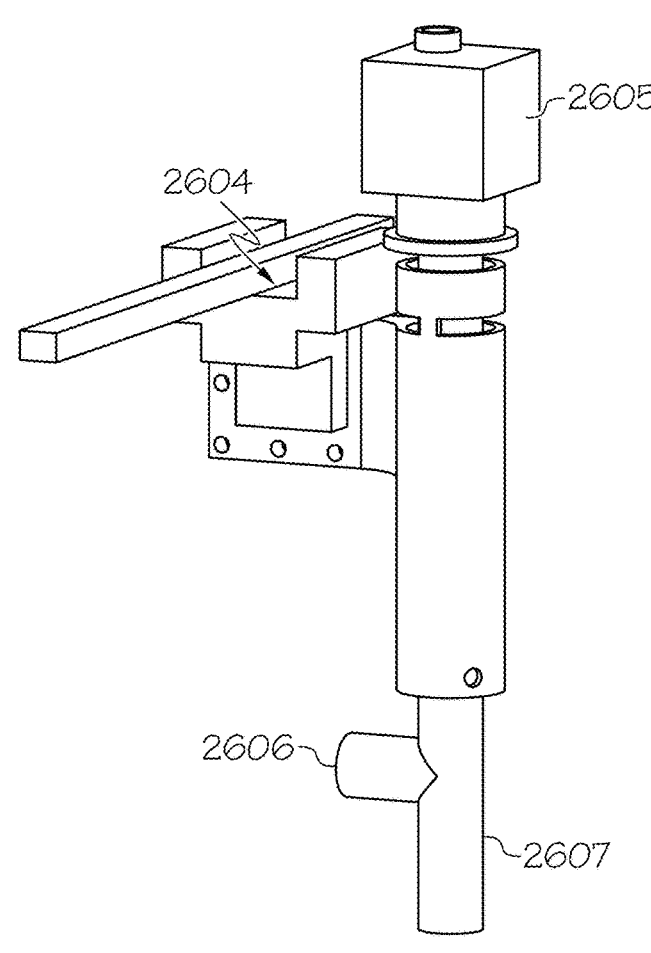
FIGS. 26A-26B illustrate the at-line overlay metrology apparatus in accordance with an embodiment of the present invention.
Figure 26B:
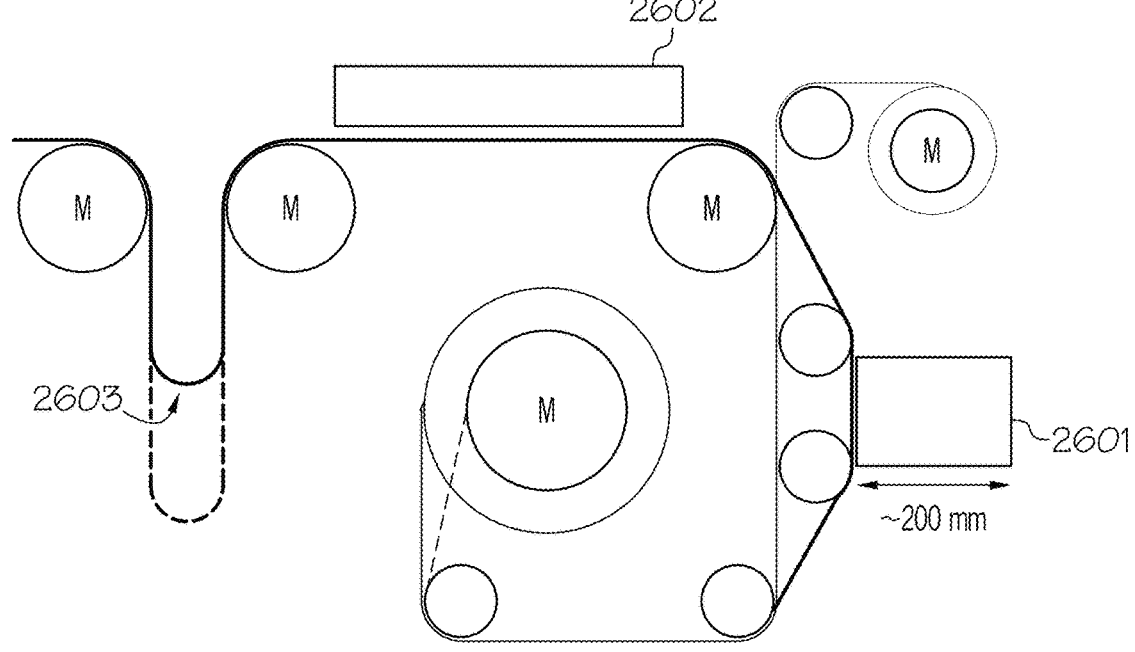

FIGS. 26A-26B illustrate at-line overlay metrology apparatus 2600 in accordance with an embodiment of the present invention.

Referring to FIGS. 26A-26B, apparatus 2600 includes an at-line overlay system 2601, an imprint module 2602, an accumulation of resist 2603 as well as an XY stage 2604 with CCD camera 2605, a light source 2606 and microscope 2607.

An at-line overlay metrology system 2601 is used to calculate the distortion of the patterned grid with respect to an ideal grid. In one embodiment, it is set up downstream of nanoimprinting module 2602. In on embodiment, the patterning cycle is temporarily deactivated for at-line overlay measurements. A large travel stage may be used to ensure the positioning of microscope 2607 on the Moiré marks across the width of the web. In one embodiment, a small travel axis is to compensate for errors due to web distortion, stage alignment inaccuracy, etc.

FIG. 27 illustrates an automated mechanism for orientating idler rollers for the template web in accordance with an embodiment of the present invention.

Referring to FIG. 27, template and substrate rollers 2701 are aligned such that their axes are planar and parallel to avoid web distortion errors due to non-uniform tension along the web. In one embodiment of the setup used to align rollers 2701 to each other, each end of rollers 2701 is attached to a passive joint 2702 compliant in the planar directions (XY). For high modulus web materials, such as stainless steel and glass, uniform tension is applied along the width of the web which minimizes strain in the system and self-aligns rollers 2701. In another embodiment, each end of roller 2701 is connected to a picomotor driven XY stage which is actively controlled to minimize misalignment. Laser tracking sensors can be used to measure misalignment between any 2 rollers in the system.

Figure 28:
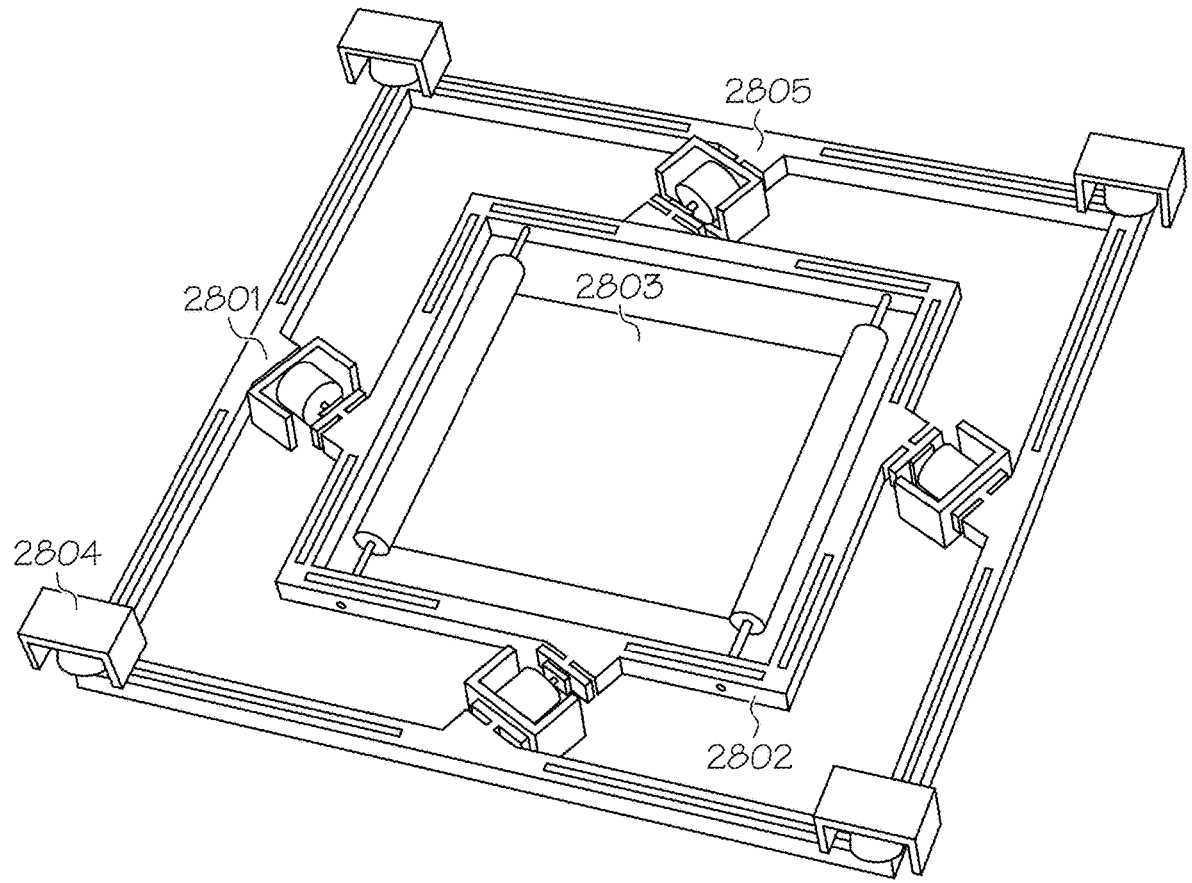
FIG. 28 is a schematic view of vertical motion roll substrate stages for overlay correction due to rigid body motion errors in accordance with an embodiment of the present invention.

Referring to FIG. 28, FIG. 28 is a schematic view of vertical motion roll substrate stages for overlay correction due to rigid body motion errors in accordance with an embodiment of the present invention.

In one embodiment of the system, the substrate rollers mounted on a rigid frame are actuated by four voice coil actuators 2801 to achieve XYθ motion. FIG. 28 further illustrates the stage 2802 for in-plane motion of XYθ for overlay. Linear actuators 2801 are connected to the substrate housing via a revolute flexure joint. In one embodiment, a prismatic flexure joint is used to constrain the direction of voice coil actuation. Based on feedback from the Moiré microscopes, the actuators are controlled to achieve desired overlay by producing rigid body planar motion of template 2803 with the substrate web fixed in place. The entire frame is connected to a larger frame for vertical motion actuation.

Furthermore, FIG. 28 illustrates four linear actuators 2804 to achieve Z motion as well as stage 2805 for motion along z for imprint and delamination.

Figure 29:
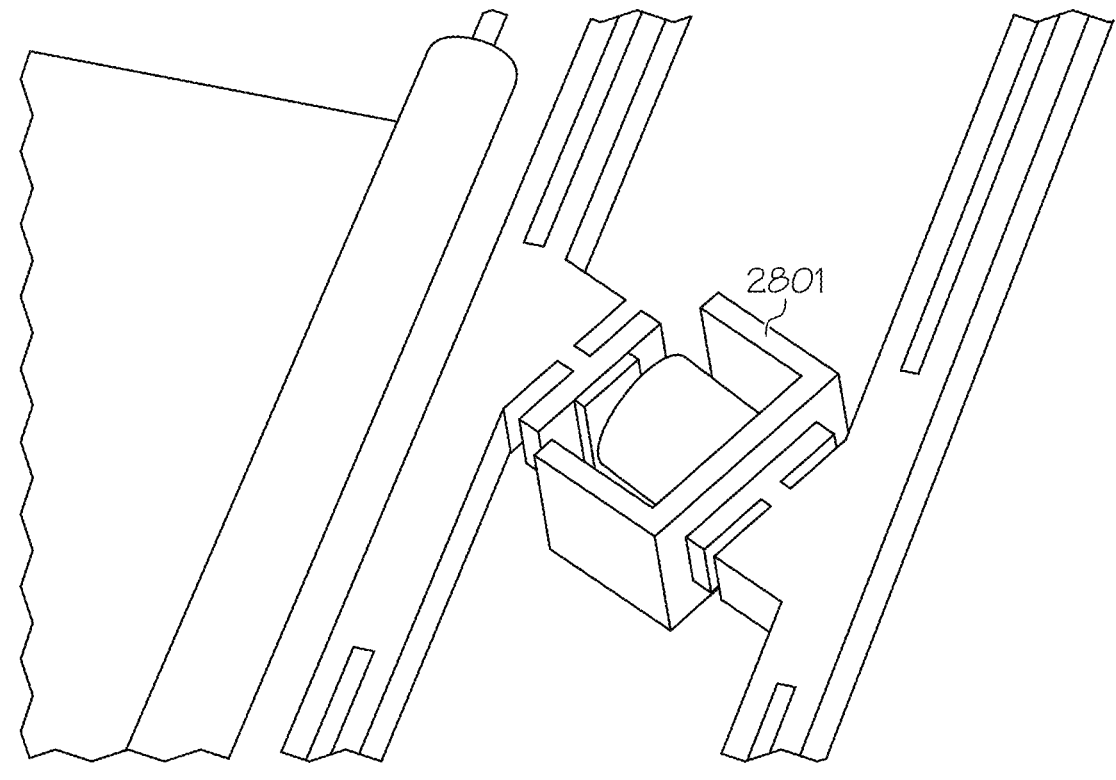
FIG. 29 illustrates a zoomed-in view of the 6 degree of the freedom flexure stage describing the compliant mechanisms deployed for overlay correction in accordance with an embodiment of the present invention.

FIG. 29 illustrates a zoomed-in view of the 6 degrees of freedom flexure stage for the roll substrate describing the compliant mechanisms deployed for overlay correction in accordance with an embodiment of the present invention.

In another embodiment of the system, each end of the substrate is controlled via voice coil actuators to achieve controlled substrate deformation along with rigid body motion. This embodiment provides shape control and magnification control of the substrate which improves overlay. The Z-head for vertical motion is the same as in the previous embodiment discussed above.

Figure 30:
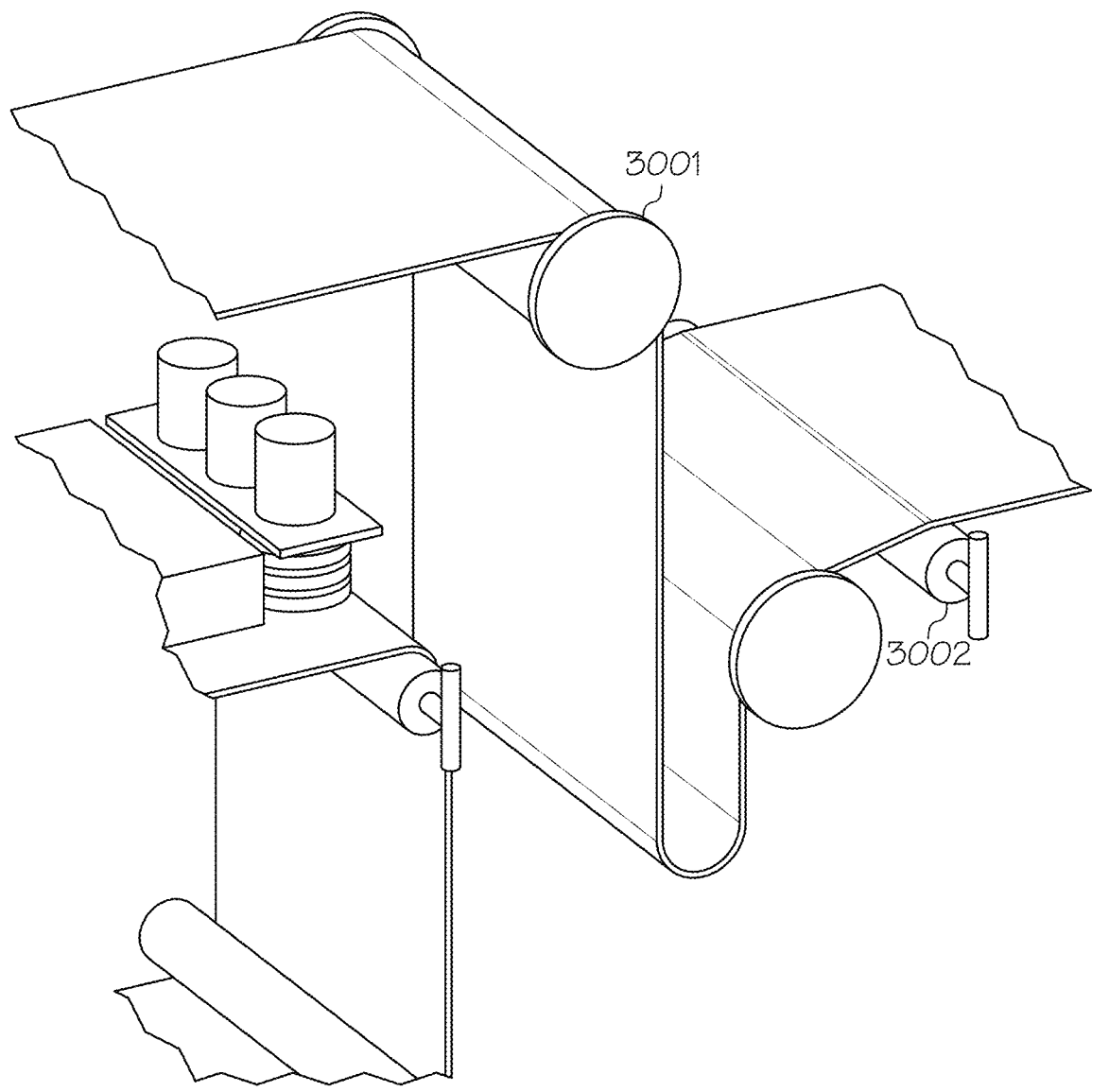
FIG. 30 is a schematic of a substrate web accumulator for embodiments involving overlay correction in accordance with an embodiment of the present invention.

FIG. 30 is a schematic of a substrate web accumulator 3001 necessary for embodiments involving overlay correction utilizing an idler roller 3002 in accordance with an embodiment of the present invention.

Because the disclosed process and system consists of several sub-modules, each with their own tension control requirements, in one embodiment, an accumulator 3001 is used to separate the coating and drying areas with the nanoimprint area. The nanoimprint area may undergo additional nanoprecise motion, especially for initiating contact and maintaining alignment and overlay, thus requiring the decoupling of tension in that step. For this purpose, in one embodiment, two accumulator rollers, akin to traction rollers, are proposed to compensate for processing speed differences and tension control between imprinting and coating. In one embodiment, the web hangs between the first and second accumulator rollers.

Substrates or film stacks, such as polycarbonate, polyethylene terephthalate (PET), etc. are nonconductive materials. These substrates or film stacks may not need precise residual layer control due to the fact that they cannot be subjected to a lot of heat during post-processing steps, such as etching and deposition, without causing undesirable distortions in the substrate. The heating of the substrates is also important to remove solvents after coating the resist film, and because of the inability of the substrates to conduct this heat, this may be transferred to the resist material setting up undesirable flow patterns and causing a loss in uniformity control. Moreover, it becomes important to heat the substrate uniformly, so that temperature gradients and consequent thermal stresses are minimized.

Substrates, such as Si, amorphous Si, stainless steel, etc. are conductive material. For such substrates, sub 1000-nm overlay is achievable with shape control through thermal actuators (e.g., a Peltier heater array). These substrates can conduct heat, and hence are more suited for post-processing steps, such as etching, thereby making residual layer control more feasible. Moreover, they can also lead to better heat conduction in the solvent evaporation step allowing the resist film to have a constant temperature substrate, thereby suppressing any undesirable temperature-induced flows.

The imprint material formulation consists of imprint resist comprising of considerable amount of components having similar volatility, dissolved in a solvent that is considerably more volatile than the rest of the components. The solvent role is to dilute the required quantity of imprint resist to higher volume thus allowing for a better way of spreading small amounts of imprint resist over the substrate and managing the final dry film thickness starting from a thicker initial wet film. Once the imprint resist solution is deposited on the substrate, the solvent evaporates first while the rest of the components evaporate at a much lower rate due to their lower volatility. This results in a mixture containing higher concentration of the other components and residual or negligible amounts of solvent. Appropriately formulated systems may perform satisfactorily under a range of compositions. Formulation design may take into account the expected amount of material that needs to be evaporated, such that the optimum range of component ratios is not disrupted. Further, certain components, such as the photoinitiator or crosslinkers, will almost always be less volatile, as seen in the table below (Table 1).

Besides solvents, an imprint resist formulation may contain a mixture of some, or all the following components: an initiator; polymerizable monomers with one active group; polymerizable monomers with more than one active group referred to in the art as crosslinkers; and surfactants. This list is not exhaustive as other components may be present according to desired performance and applications.

TABLE 1

| Role | Material | Boiling Point [° C. at 1 atm] |
|---|---|---|
| Monomers | 2-Ethylhexyl Methacrylate | 218 |
| | Cyclohexyl Methacrylate | 210 |
| | Isobornyl Methacrylate | 258 |
| | Tetrahydrofurfuryl Methacrylate | 222 |
| | Benzyl Methacrylate | 243 |
| Crosslinker | Ethylene glycol Dimethacrylate | 240 |
| Surfactant | 1H,1H,2H,2H-Perfluorodecyltriethoxysilane | 209 |
| Photoinitiators | Irgacure 184 | >300 |
| | Irgacure 819 | >300 |
| | Irgacure 2959 | >300 |

TABLE 1-continued

| Role | Material | Boiling Point [° C. at 1 atm] |
|---|---|---|
| Solvent | MIBK | 117 |
| | Ethyl acetate | 77 |

Downstream process considerations may preclude the use of UV-crosslinkable polymers. For example, most methacrylate polymers have a glass-transition temperature (Tg) of ~150° C. Any downstream thermal processing beyond 150° C. may damage the material. There are other thermoset polymers, such as polyimide, that have a much higher Tg of ~350° C. Hence, using this polymer can alleviate concerns with thermal processing. But these materials are also highly viscous, which makes them difficult to coat with substantially lower volumes. To achieve this, the polyimide material can be diluted in a solvent, which can reduce their viscosity and make the material amenable to coating. The solvent will need to be completely evaporated to minimize condensation on the substrate. This can be done by using a solvent with substantially higher volatility (e.g., methyl isobutyl ketone (MIBK), ethyl acetate) and using a heated substrate chuck or IR lamps to completely and rapidly evaporate the solvent.

The prevention of contamination is an important aspect of this tool, given that the nanoimprint lithography process is sensitive to particle contamination and is the last unit step in the proposed architecture. Typically, particle contamination can be minimized by maintaining a positive pressure inside the tool along with constant re-circulation. However, for this tool configuration, there will be areas of negative pressure (exhaust), especially where there is active evaporation of solvents and/or resist materials. For this purpose, the air handling inside the tool can be based on cross-flow, so that venting of air to the user is minimized while maintaining a positive pressure inside the tool.

A digital twin of a manufacturing tool is a model-based representation of the tool which is used to monitor and predict the performance and yield of the tool. The digital twin is often used in advanced manufacturing environments (e.g., semiconductor manufacturing) where there is availability of a substantial amount of data from the sensors in the tool. The data from the sensors is then analyzed with respect to the output of the tool (in terms of yield, performance, etc.) with the help of data analytics techniques, such that a model of the tool is constructed. This model can be completely data-based or also have a physics-based underpinning. In one embodiment, a digital twin is created for the R2P and R2R tools.

Furthermore, the principles of the present invention include novel techniques for fabricating large-area templates for display applications using J-FIL.

Display applications generally require patterning of areas significantly larger than most semiconductor applications, but allow relaxed resolution because of larger feature sizes. This permits large-area low-resolution mask-writing techniques, such as laser scribing, to be used for display photomask fabrication. Upcoming display technologies, however, pose significant challenges for the display patterning infrastructure. Developments, such as Organic Light Emitting Diodes (OLEDs), are already driving down feature resolution to sub-micrometer levels. Future developments, such as metamaterial optical elements, would most likely drive feature sizes down into the sub-50 nm regime. At this point, optical methods, such as laser scribing, would be infeasible for pattern generation. Currently, the semiconductor industry uses Electron Beam Lithography (EBL) for sub-50 nm pattern generation. However, EBL has extremely low throughput, and would be quite infeasible for making display scale masks. Additionally, large-area mask-to-substrate pattern transfer would no longer be feasible using photolithography since advanced photolithography techniques can pattern sub-50 nm features only over small areas.

Jet-and-Flash Imprint Lithography (J-FIL) is a next generation lithography technique that uses mechanical means to transfer patterns from a template mask onto a substrate. Feature sizes in J-FIL are not limited by the wavelength of the exposure source, and features, as small as 3 nm, have been demonstrated before. J-FIL is also not limited by pattern area, since it does not require large assemblies of focusing optics for pattern transfer. In fact, whole wafer (single-imprint) patterning of sub-10 nm features has been demonstrated using J-FIL before. Additionally, J-FIL can pattern 3-D structures in a single imprint; whereas, photolithography can only pattern 3-D structures as assemblies of multiple 2-D layers. J-FIL therefore appears to be a promising candidate, both for fabricating large-area templates, and for patterning large-area display substrates (using large-area templates). The description below will explore techniques for large-area template fabrication using J-FIL.

It should be noted that J-FIL, like photolithography, is simply a pattern replication method. A pattern generation technique, such as EBL, is still needed to masklessly fabricate a small unit pattern. J-FIL can then be used to tessellate a large-area template using this unit pattern, either in one sitting, or recursively.

It is worth mentioning that the following three layers in modern displays are the ones which are moving towards sub-50 nm (even sub-100 nm) feature sizes—polarizer layers, metal mesh layers (in touch-based displays) and thin film transistor layers.

Wire grid polarizers with sub-100 nm pitches are increasingly being explored for polarizer elements. Metamaterial based polarizer elements, with improved transmission efficiency, are being explored in research. Such polarizer elements would necessitate an edge-stitching precision which is some fraction of the minimum feature dimension.

For polarizer (and metal mesh) layers, when tessellating a large-area template using J-FIL, it is only necessary to ensure nano-precise edge-stitching, since imprecisely stitched edges could lead to light leaking through those edges and creating a visually unappealing display. Methods for achieving this are discussed further below.

For thin film transistor layers, large-area template fabrication using J-FIL requires registration to a global grid, instead of localized edge-stitching. Methods for achieving this are described further below.

The degree to which display applications are sensitive to edge-stitching errors depends on the feature sizes involved, and sensitivity of human vision in detecting large-area defect patterns. Photonic waveguides used in telecommunication, and recently in heads-up-displays as well, are sensitive to sub-100 nm edge-stitching errors. However, for polarizer and metal mesh layers, the loss in light transmission and contrast due to sub-100 nm stitching errors is generally not perceivable in an isolated polarizer or metal mesh element. However, when combined with other defective display layers, and varied viewing conditions (oblique angles, low light scenes, etc.) nanoscale stitching errors can result in visually perceivable defects and an overall unsatisfying viewing experience. Such minor fabrication errors, which are hard to quantify in strict optical terms, yet result in perceivable defects, are referred to as "mura." Of the many types of mura, the one which is relevant here is stitch mura.

Figure 31:
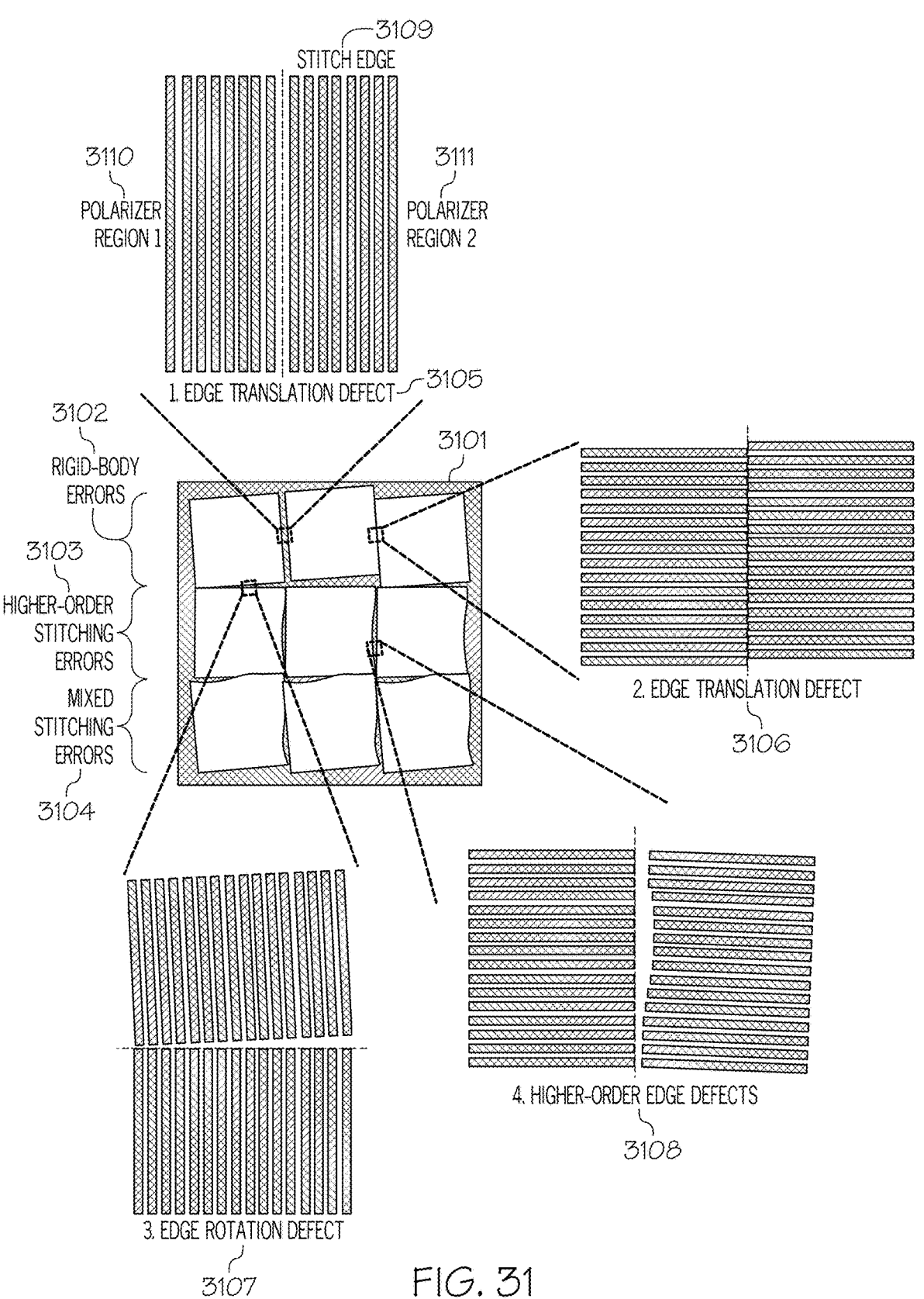
FIG. 31 is a schematic of a template composed of a 3×3 grid of imprinted patterns, showing various kinds of edge-stitching errors in accordance with an embodiment of the present invention.

FIG. 31 is a schematic of a template composed of a 3×3 grid of imprinted patterns, showing various kinds of edge-stitching errors in accordance with an embodiment of the present invention.

FIG. 31 shows a large area template 3101 with various possible stitching error modes (rigid-body errors 3102, higher-order stitching errors 3103, mixed stitching errors 3104). The extent to which such errors effect overall display performance (contrast ratio, transmission, mura) can be evaluated using human-in-the-loop experiments, and computational-electromagnetics (CEM) techniques, such as finite-difference time-domain (FDTD), Eigenmode Expansion, etc.

Furthermore, FIG. 31 shows various kinds of defects, such as the edge translation defect 3105, edge translation defect 3106, edge rotation defect 3107 and higher-order edge defects 3108. Edge translation defect 3105 corresponds to a defect along the stitch edge 3109 between polarizer region 1 3110 and polarizer region 2 3111.

Figure 32:
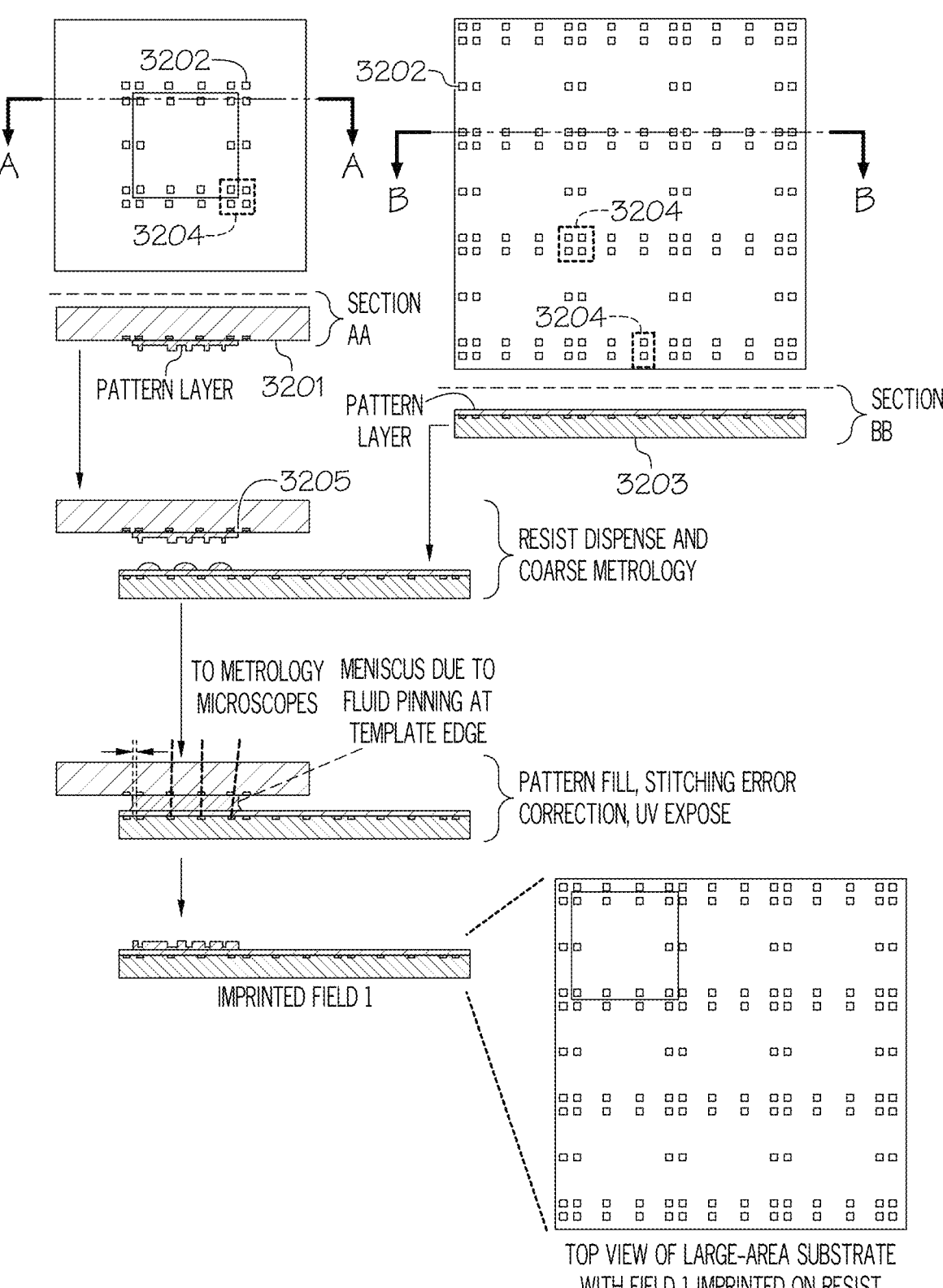
FIG. 32 is a schematic of a large-area substrate to be tessellated with a 3×3 grid of master patterns with the first field in the process of being patterned in accordance with an embodiment of the present invention.
Figure 33:
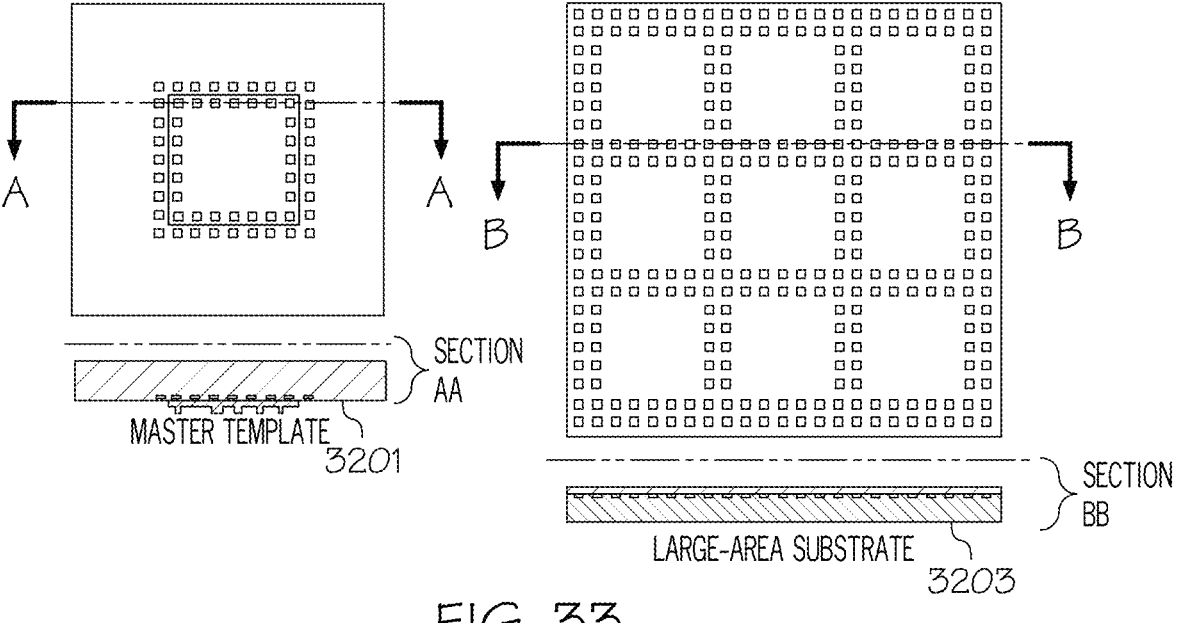
FIG. 33 is a schematic of a master template and a large-area substrate with a dense array of alignment marks in accordance with an embodiment of the present invention.

FIGS. 32 and 33 show a generic scheme for measuring and correcting stitching errors to within the bounds derived using human-in-the-loop and CEM experiments in accordance with an embodiment of the present invention.

In particular, FIG. 32 is a schematic of a large-area substrate to be tessellated with a 3×3 grid of master patterns with the first field in the process of being patterned in accordance with an embodiment of the present invention. FIG. 33 further illustrates that alignment marks are embedded in both the wafer and template and are used for nano-precise edge stitching.

Furthermore, in particular, FIG. 33 is a schematic of a master template and a large-area substrate with a dense array of alignment marks in accordance with an embodiment of the present invention.

Referring to FIGS. 32 and 33, master template 3201 contains embedded alignment marks 3202, along with the optical patterns to be imprinted. The large-area substrate 3203, which is to be tessellated with master template imprints, contains embedded alignment marks as well. Error sensing is achieved by measuring the relative displacement between pairs of embedded alignment marks. Error correction is achieved using stage actuators for rigid-body errors, and thermal actuators for higher-order errors.

The following features are worth noting about this scheme.

Embedded alignment marks do not get printed during the tessellation process. This ensures that the optically functional area is maximized, and no area is taken up by alignment marks, which might create noticeable periodic defects.

Alignment marks, in both master template 3201 and large-area substrate 3203, are patterned in groups of two or more contiguous marks 3204. This way, during an imprint step, the template alignment marks 3205 can be aligned to substrate alignment marks on an unpatterned region of the substrate. Additionally, because of contiguous placement of alignment marks at stitch-edges, even if a prior imprint is not perfectly aligned with the alignment grid, perfect edge-stitching could still be achieved by compensating for this prior imprint's misalignment in the current imprint.

In one embodiment, the master template pattern layer is index-matched to the resist, ensuring that during the in-liquid align process, patterns present underneath the alignment marks do not interfere with error measurement.

Depending on the level of edge-stitching precision needed, the density of alignment marks can be varied as shown in FIG. 33, which shows a dense alignment grid.

For successfully measuring the amount of edge mis-stitching, a first point on an edge of an imprint needs to be metrologically linked to an adjacent second point on the adjacent edge of the adjoining imprint. Since alignment marks cannot be patterned right at the edge of the master template field, a link between embedded alignment marks and the field edge is established as shown in FIG. 34.

Figure 34:
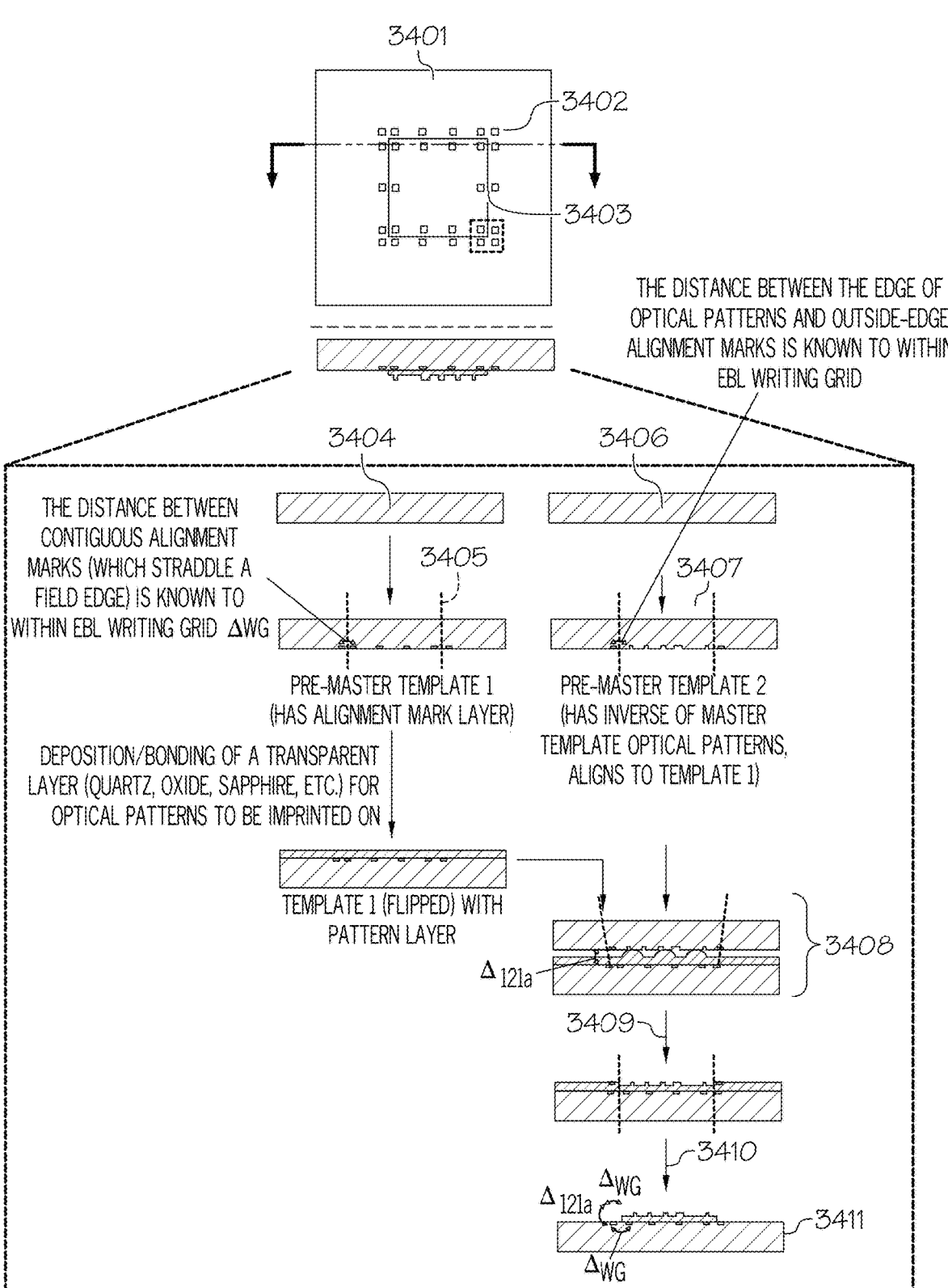
FIG. 34 illustrates an exemplar fabrication sequence for the master template in accordance with an embodiment of the present invention.

FIG. 34 illustrates an exemplar fabrication sequence for the master template 3401 in accordance with an embodiment of the present invention. Referring to FIG. 34, master template 3401 contains two layers of patterns—the first (embedded) layer contains only alignment marks 3402, and the second layer contains the actual optical patterns 3403. The first layer is patterned on a quartz blank 3404 (which subsequently becomes the master template 3405) using a direct write method, such as e-beam lithography (EBL). Each alignment mark within a contiguous group (as indicated in FIG. 32) has its relative position (to other alignment marks in the group) known to within the writing grid of the direct write tool. The second layer, which consists of optical patterns and outside-edge alignment marks, is direct written on a second quartz blank 3406. This second pre-master template 3407 can subsequently be imprinted on the first pre-master template, with the relative position of the two templates measured using the outside-edge alignment marks (see element 3408). This is followed by a pattern layer etch 3409 and an etch for field edge demarcation 3410 resulting in the master template 3411. In this way, the distance between an embedded alignment mark on the master template and its nearest edge can be derived, accurate to within $(2*\Delta_{wg}+\Delta_{121a})$.

Figure 35:
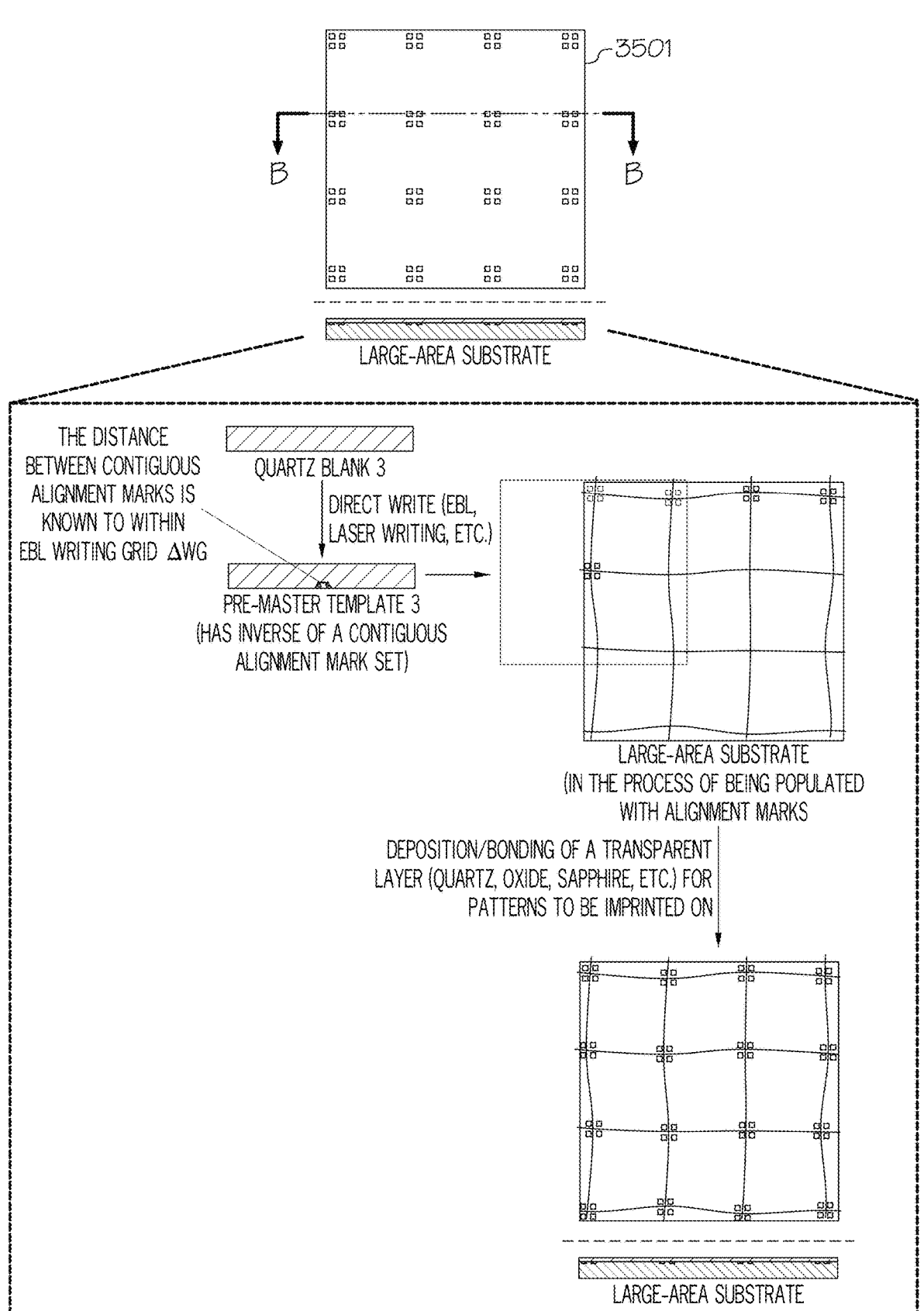
FIG. 35 illustrates an exemplar fabrication sequence for embedding alignment marks in the large area-substrate in accordance with an embodiment of the present invention.

A third (or fourth) pre-master template which contains a contiguous set of two or more alignment marks is used to pattern the embedded alignment mark layer on the substrate for the large-area template as shown in FIG. 35. FIG. 35 illustrates an exemplar fabrication sequence for embedding alignment marks in the large area-substrate 3501 in accordance with an embodiment of the present invention. It worth noting here that the precision with which the alignment grid approaches perfect rectilinearity is dependent on the stage (X,Y,θ) motion specifications.

Figure 36:
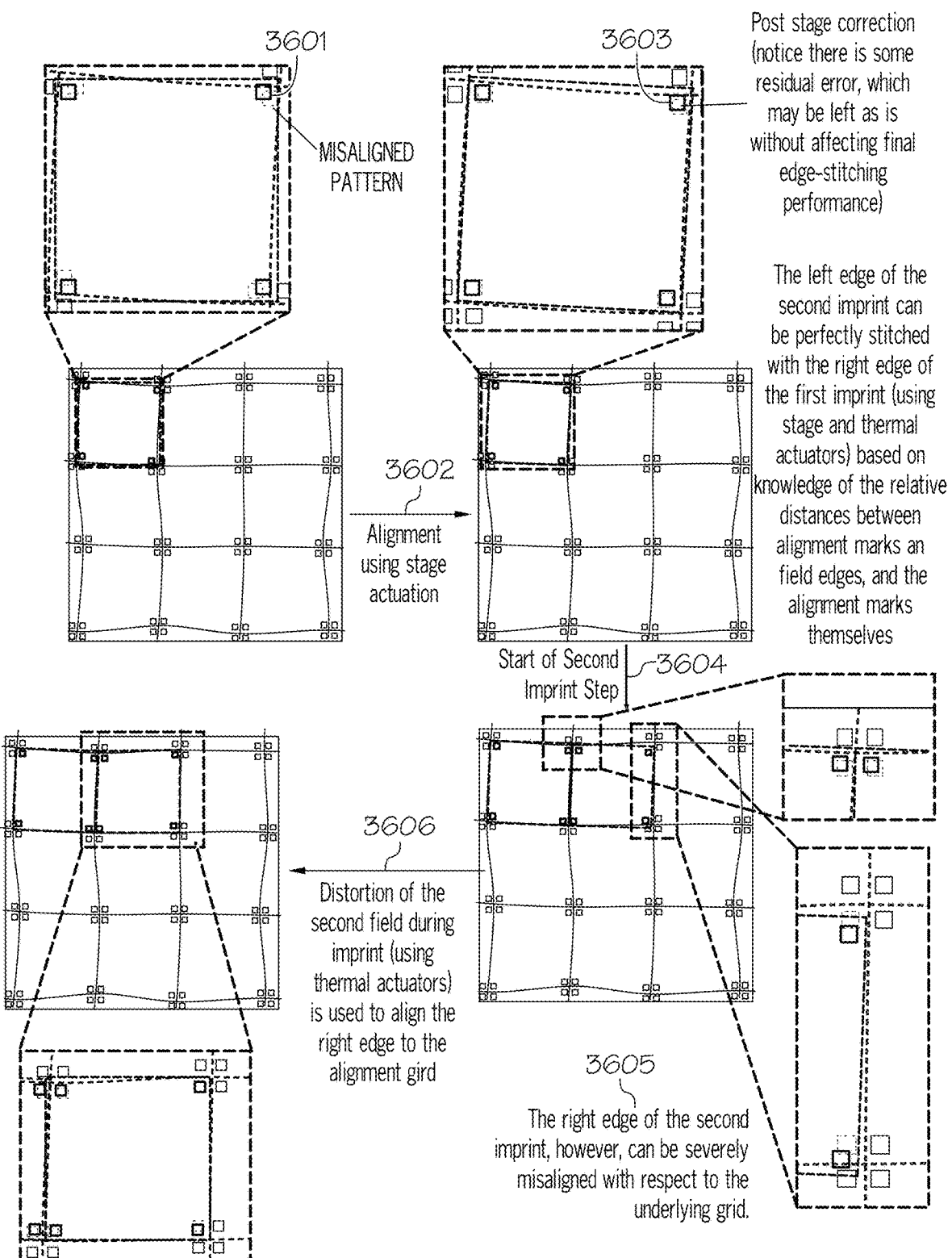
FIG. 36 illustrates an exemplar sequence for edge-stitching in a non-rectilinear substrate (alignment) grid in accordance with an embodiment of the present invention.

However, a non-rectilinear grid, due to an imprecise stage, can still be aligned using the alignment correction methods described further below. A schematic for how such an alignment scheme might work is shown in FIG. 36. FIG. 36 illustrates an exemplar sequence for edge-stitching in a non-rectilinear substrate (alignment) grid in accordance with an embodiment of the present invention.

Alignment marks are patterned on the large-area substrate in groups of two, four, or more, to ensure that adjacent marks have the same misalignment from an ideal grid, if any. This relaxes the accuracy required of the motion stage, since any misalignment measured at one alignment mark can be adjusted for in the reading of the adjacent alignment mark to ensure proper stitching.

For example, as shown in FIG. 36, the misaligned pattern 3601 is aligned using stage actuation 3602 resulting in a post stage-correction 3603. It is noted that there is some residual error, which may be left as is without affecting the final edge-stitching performance.

A second imprint step may then be started (see element 3604), where the left edge of the second imprint can be perfectly stitched with the right edge of the first imprint (using stage and thermal actuators) based on knowledge of the relative distances between alignment marks and field edges and the alignment marks themselves. The right edge of the second imprint, however, can be severely misaligned with respect to the underlying grid (see element 3605). The distortion of the second field during imprint (using thermal actuators) is used to align the right edge to the alignment grid (see element 3606).

Figure 40:
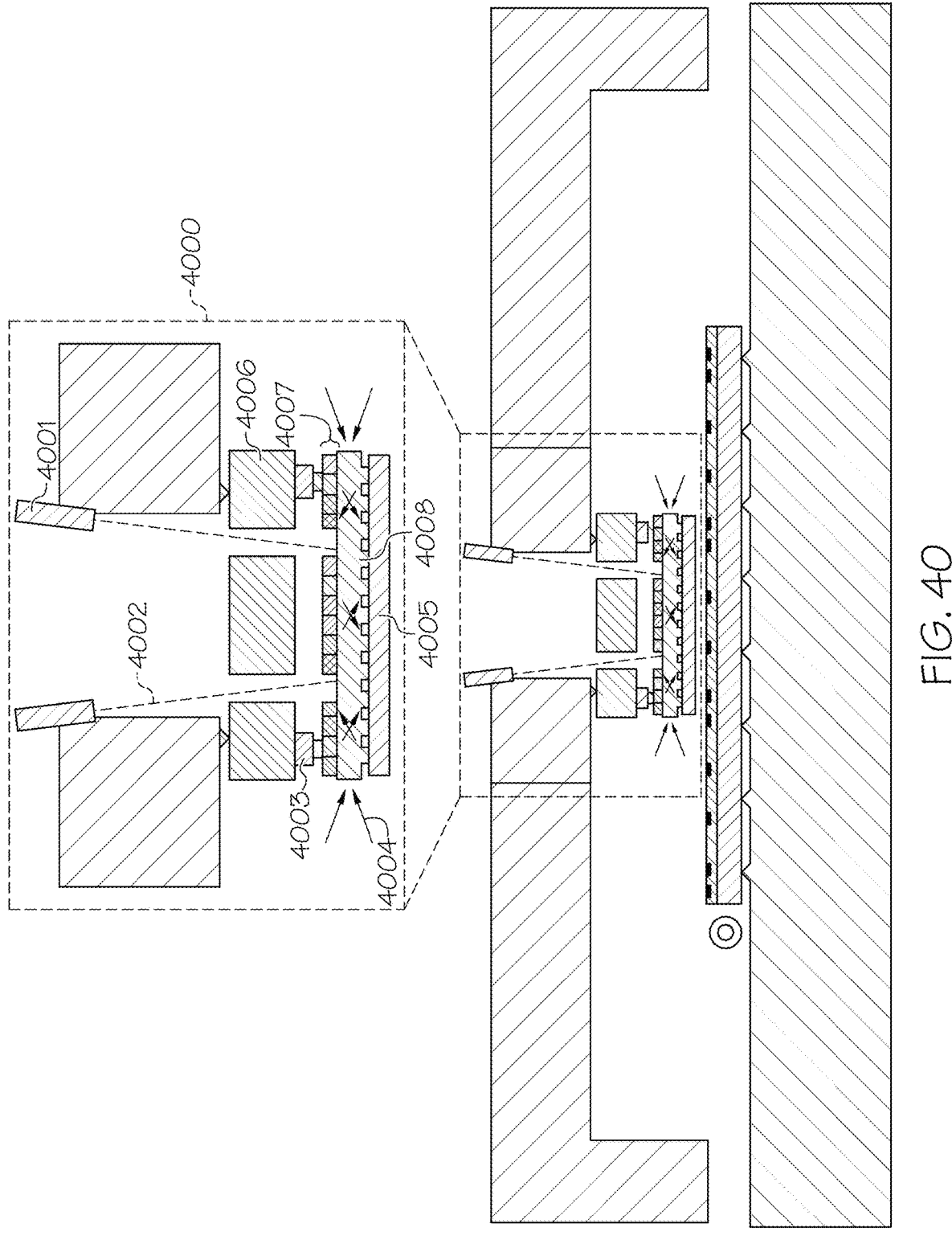
FIG. 40 illustrates an exemplar configuration for the template and substrate-side thermal actuation in accordance with an embodiment of the present invention.

However, beyond a certain limiting stage inaccuracy, the alignment method of FIG. 40 can fail, such as shown in FIG. 37. FIG. 37 illustrates exemplar scenarios where edge-stitching could fail in accordance with an embodiment of the present invention. For instance, if deviations from rectilinearity are too high, the right edge of a second imprint can simply not be within the capture range of the alignment marks (see element 3701). Additionally, thermal actuation might not be able to fully correct for large deviations of the master template alignment marks from the substrate marks, leading to residual errors which might accumulate over multiple imprints and eventually lead to a capture range based stitching failure (see element 3702). Achieving greater stage accuracy over large-areas requires not only tighter stage fabrication specifications, but also better calibration of the motion stage.

Any alignment mark capable of online alignment measurement with nanoscale precision could be used for edge mis-stitching detection. One possible choice could be the Moiré-based alignment marks, which have been previously used for sub-5 nm overlay in J-FIL.

In one embodiment, coarse stitching-error corrections can be implemented using the X, Y, θ stages.

Figure 38:
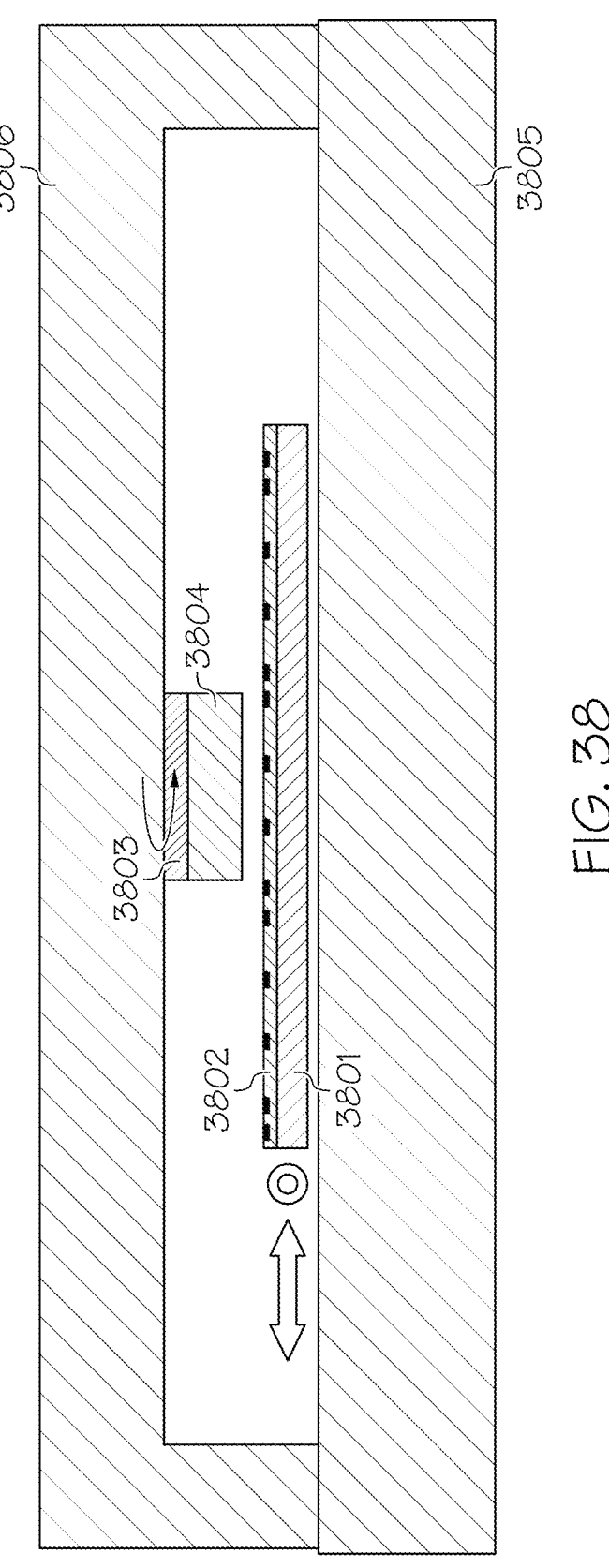
FIG. 38 illustrates the motion configuration with the large-area X, Y stage on the substrate side and the theta (θ) stage on the template side in accordance with an embodiment of the present invention.

Referring to FIG. 38, FIG. 38 illustrates the motion configuration with the large-area X, Y stage on the substrate side and the theta (θ) stage on the template side in accordance with an embodiment of the present invention.

In one embodiment, X, Y stage 3801 could be an air bearing/roller bearing/magnetic levitation stage with large-area substrate 3802 and the substrate chuck directly mounted on this stage. Theta stage 3803 for this configuration would be attached to z-head assembly 3804. Granite base 3805, in this embodiment, would be approximately twice the length and width of the large-area substrate. Furthermore, in one embodiment, a granite bridge 3806 is attached to granite base 3805. In one embodiment, UV exposure would need to happen from the template side, since UV exposure from the substrate side would necessitate an open-frame X, Y stage which would lead to large bowing of the substrate chuck and substrate.

Figure 39:
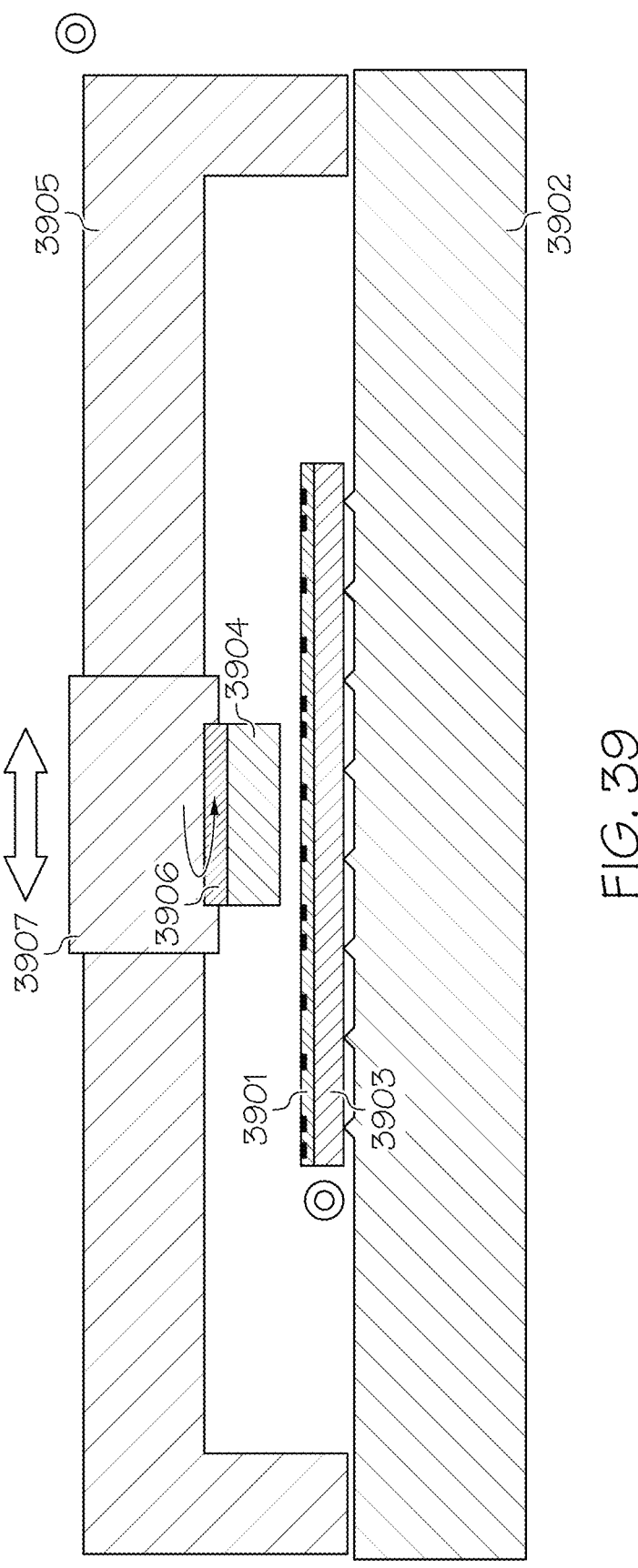
FIG. 39 illustrates an alternative embodiment for motion configuration with a gantry type X, Y stage on the template stage in accordance with an embodiment of the present invention.

FIG. 39 illustrates an alternative embodiment for motion configuration with a gantry type X, Y stage on the template stage in accordance with an embodiment of the present invention.

Referring to FIG. 39, substrate 3901 and the substrate chuck is fixed to granite base 3902 with a multi-point mount 3903 and remains stationary during imprinting. Furthermore, in one embodiment, Z-head assembly 3904 is mounted on a gantry type Y stage 3905, which could be an air bearing, roller bearing or magnetic levitation type stage. The long-stroke gantry-type stage 3905 could further have a shorter stroke stage on which z-head assembly 3904 is further mounted. In one embodiment, Z-head assembly 3904 contains mechanisms for z-axis motion and theta motion. This could be achieved either using voice coils for z-motion and a separate theta stage 3906, or in a combined form using a hexapod assembly. FIG. 39 further illustrates x stage 3907.

In one embodiment, fine stitching-error correction can be implemented using thermal actuation. This has previously been described for semiconductor applications. Essentially, discrete regions of template and/or substrate are heated and/or cooled in a precise manner to produce nanoscale shape changes.

FIG. 40 illustrates an exemplar configuration for template and substrate-side thermal actuation in accordance with an embodiment of the present invention.

Referring to FIG. 40, FIG. 40 illustrates a z-head assembly 4000 that incudes alignment microscopes 4001 with an alignment beam 4002. Furthermore, assembly 4000 includes voice coils 4003 for z motion with UV exposure 4004 from the sides of master template 4005. Additionally, assembly 4000 includes a theta stage 4006 with apertures for metrology, thermal actuators 4007 and a transparent template chuck 4008.

It would generally be more efficient from a control standpoint to have a high density of thermal actuators 4007 on the template side, and a low density of actuators 4007 on the substrate side. In one embodiment, the thermal actuator grid, as well as template chuck 4008, have apertures to allow the passage of light beams for alignment mark metrology.

Additionally, in one embodiment, template chuck 4008 is made from transparent materials (such as transparent SiC, Sapphire, etc.), with a reflective coating on top to permit UV exposure 4004 from the side.

Figure 41:
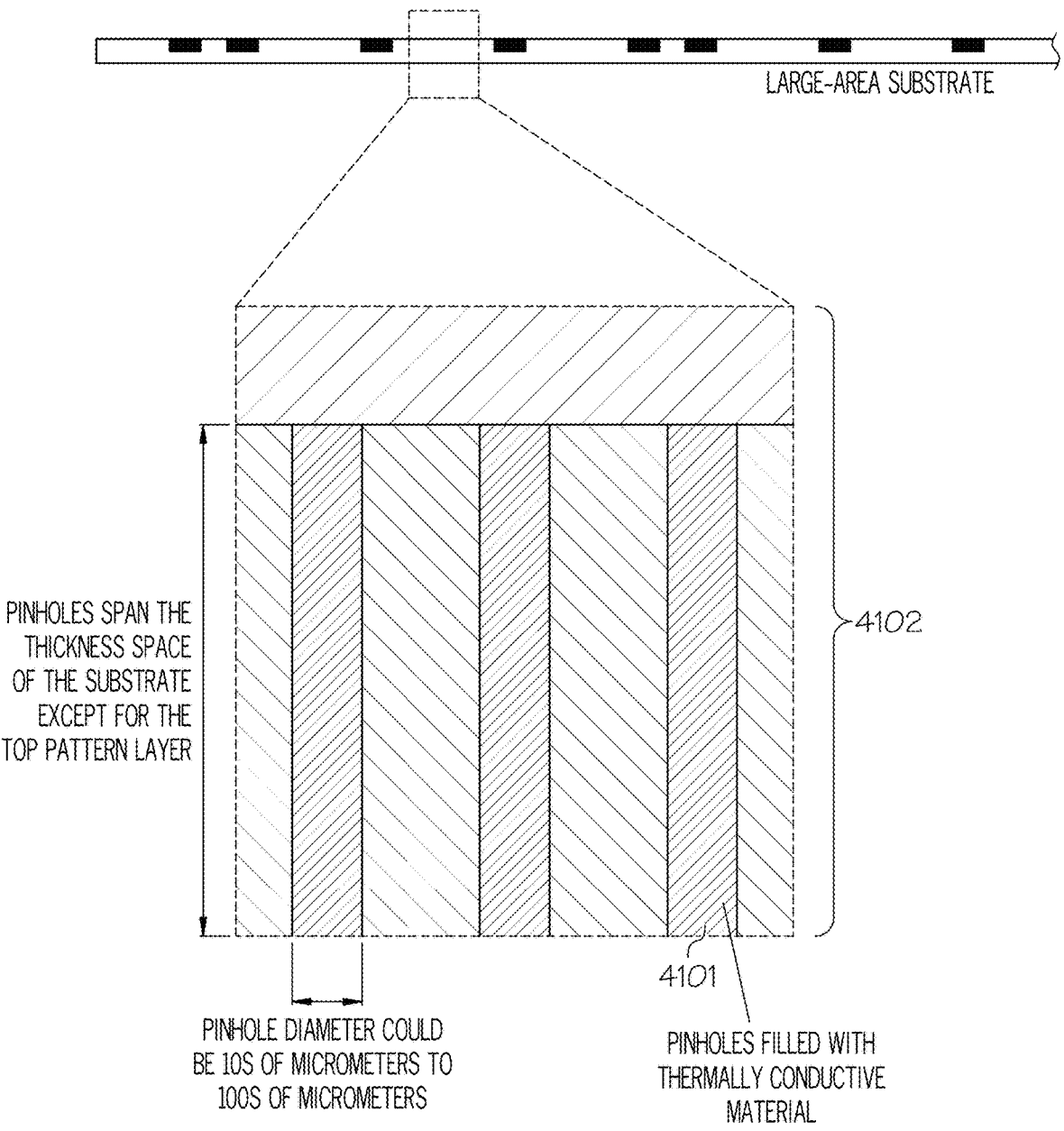
FIG. 41 illustrates an exemplar configuration for the substrate-side pinhole array to improve thermal conductivity in accordance with an embodiment of the present invention.

It should be noted that the choice of template and substrate materials is important in implementing a viable thermal actuation scheme. If the thermal conductivity of the template and/or large-area substrate is too low, the time for thermal corrections to take effect might be prohibitively high. Thermal conductivities of templates/substrates could be improved by etching pinholes and filling them with higher conductivity materials, such as silicon, sapphire, etc. as shown in FIG. 41. Such a pinhole etch, and material deposition can be achieved using standard semiconductor fabrication techniques.

FIG. 41 illustrates an exemplar configuration for a substrate-side pinhole array to improve thermal conductivity in accordance with an embodiment of the present invention.

As shown in FIG. 41, pinholes 4101 span the thickness of substrate 4102 except for the top pattern layer. Pinholes 4101 may be filled with thermally conductive material In one embodiment, the diameter of pinhole 4101 may be 10s of micrometers to 100s of micrometers.

Embodiments of the present invention also include recursive pattern transfer.

In case the master template pattern has a small extent (for instance, the tip-based masters are generally 10s of micrometers in extent), a recursive tessellation could be used to create larger and larger intermediate master templates, which could eventually be used to create patterns on meter scale substrates.

Furthermore, technologies for realizing optoelectronic devices, such as metal mesh transparent conducting electrodes, wire grid polarizers and light-trapping gratings, are limited to rigid substrates, lack the necessary patterning resolution, involve inefficient metal lift-off/etch process and/or a transfer printing steps.

The principles of the present invention provide the means for fabricating metallic structures on a variety of substrates both rigid and flexible. Precise control of material stack properties and process parameters allows for the continuous creation of arbitrary geometry lines and shapes consisting of metal over large areas with extremely high resolution. This can enable scalable fabrication of optoelectronic devices, such as metal mesh transparent conducting electrodes, wire grid polarizers and light-trapping gratings with superior optical, electrical and mechanical properties. Furthermore, various embodiments of the present invention enable fabrication of arbitrary nanopatterned metal films with a critical feature size in the nm scale by selective metallization on both rigid and compliant substrates.

Some embodiments of the present invention involve a novel combination of lithography, material stacks and process flows that incorporates interdisciplinary technologies in order to fabricate said optoelectronic devices at a commercial scale.

Transparent conducting electrodes (TCEs) are essential components in many optoelectronic and display technologies including light-emitting diodes, photovoltaics, and display touch screen panels. Transparent conducting oxides, specifically indium-doped tin oxide (ITO), are currently the industry standard TCE material due to their high electrical conductance and optical transparency. However, conventional ITO electrodes are intrinsically brittle, require high-temperature vacuum processing and suffer from fluctuating material costs making them undesirable for future generation optoelectronic and display devices and incompatible for flexible devices. As a result, many alternative TCEs have garnered significant research interest over the past few decades. Metal mesh-based electrodes have recently appeared as the most pragmatic solution to replace ITO for future flexible devices due to their highly tunable electrical and optical properties, low material cost and inherent mechanical robustness. However, metal mesh TCEs require high-resolution, ultra-large area nanoscale patterning on flexible polymer substrates which is beyond the capabilities of optical lithography. Moreover, commercial metal mesh electrodes will depend upon high throughput, scalable roll-to-roll (R2R) processing in order to meet the cost needs of the projected markets.

The present invention enables a R2R fabrication process for realizing metal nano-mesh TCEs on flexible substrates as discussed herein. In particular, embodiments of the present invention are directed to a R2R compatible fabrication process for realizing copper (CU) metal nano-mesh TCEs on flexible substrates.

Electroless Cu (ECu) deposition is a redox reaction consisting of an oxidation reaction of a reducing agent and a reduction reaction of Cu ions from the solution onto a catalytically activated surface. While ECu plating is an energetically favorable process, it requires a catalyst species deposited on a surface in order to reduce the activation energy of the reaction and initiate spontaneous decomposition of Cu. Therefore, ECu deposits nucleate at the sites of catalytic seed material, and films selectively grow on activated surfaces only where there is an exposed catalyst to the solution.

Based on exploratory experiments, it has been found that ECu is suitable for use in a R2R nanofabrication process for Cu metal nano-mesh TCEs. For example, it has been discovered that a less than 5 nm thick palladium (Pd) seed layer may be used for reliable ECu deposition of high-quality. It has further been discovered that the Pd seed layer and ECu films exhibit good adhesion to polycarbonate (PC) substrates. Additionally, it has been discovered that a Pd layer is continuous for thicknesses equal to and greater than 10 nm. Furthermore, it has been discovered that ECu films begin as isolated islands and coalesce to form a continuous layer in three distinct phases of growth: nucleation, granular merging and uniform film. Additionally, it has been discovered that the average grain size of ECu is less than 75 nm. It has further been discovered that the grain size is independent of plating time and seed layer thickness. Furthermore, it has been discovered that the deposition rate of ECu films is more than 20 nm/min. Additionally, it has been discovered that resistivity of electroless deposited copper is between ~5-30 $\mu\Omega$ cm.

In one embodiment, selective ECu metallization is achieved by using a process, referred to herein as the "etch process approach," by isolating certain areas of an activated surface from interacting with the plating solution. In the Etch process, the patterned imprint resist acts as the blocking layer material. UV irradiated polymerized imprint resist exhibits remarkable chemical resilience and is known to be insoluble in ECu plating solution. Moreover, the Etch process does not suffer from the geometric and microstructure limitations related to shadow-dependent oblique angle deposition. A description of the Etch process steps is provided below in connection with FIGS. 42 and 43A-43G.

FIG. 42 is a flowchart of a method 4200 for selective ECu metallization in accordance with an embodiment of the present invention. FIGS. 43A-43G depict the cross-sectional views for selective ECu metallization using the steps described in FIG. 42 in accordance with an embodiment of the present invention.

Referring to FIG. 42, in conjunction with FIGS. 43A-43G, in step 4201, a protection layer 4301 is deposited on a substrate 4302, such as a rigid substrate (e.g., quartz) or a flexible substrate (e.g., polycarbonate (PC)), as shown in FIGS. 43A-43B. In one embodiment, protection layer 4301 is deposited via Physical Vapor Deposition (PVD). In one embodiment, protection layer 4301 acts as a barrier between the substrate and a polymeric adhesion promoting material containing strong solvent later in the process scheme. In one embodiment, protection layer 4301 is a metal-oxide (e.g., $Al_2O_3$).

In step 4202, a palladium (Pd) seed layer 4303 is sputtered on protection layer 4301 as shown in FIG. 43C. In one embodiment, Pd is used to catalytically activate the surface of protection layer 4301 for subsequent ECu plating.

In step 4203, a polymeric adhesion promoting layer 4304 is then dispensed on Pd seed layer 4303 in order to successfully perform NIL on the Pd coated protection layer surface as shown in FIG. 43D. The adhesion layer ensures UV cured imprint resist separates from the imprint template rather than the substrate surface during the last step in J-FIL. In wafer-scale experimentation, dispersion of the adhesion layer is completed by spin-coating, but slot-die coating can accomplish the same task for R2R processing. Adhesion layer coated samples are then cured in step 4204 at temperatures below the glass transition temperature ($T_g$) of PC to evaporate off solvents as shown between FIGS. 43D and 43E.

In step 4205, nanoimprint lithography (NIL) is used to transfer trench patterns 4305 on to the substrate surface (layer 4304) as shown in FIG. 43E. In one embodiment, trenches have a height of approximately between 50 nm and 300 nm, linewidths between 100 nm and 900 nm and a pitch between 1 $\mu$m and 9 $\mu$m.

In step 4206, samples undergo exposure to the linear ion source (LIS) equipped in the Emerson & Renwick GENESIS series tool platform in order to etch the residual layer thickness (RLT) of the imprint resist layer as shown in FIG. 43F. The LIS works by bombarding a mixture of Ar and $O_2$ ions towards the substrate to allow oxidation of organics and also physically mill away material. Therefore, the Pd and protection layers 4303, 4301 should function as an etch stop in the Etch process scheme. The LIS etch exposes Pd catalyst only at the bottom of trenches in imprint resist allowing for selective ECu deposition.

In step 4207, samples are immersed in a plating solution to metallize trenches 4306 and form an interconnect embedded metal mesh electrode as shown in FIG. 43G.

FIGS. 44A-44F show results of the fabricated metal mesh on a quartz substrate using LIS exposure time and immersion in a ECu plating solution.

FIG. 44A illustrates an image of patterned quartz (insert is of fields consisting of trench grids) in accordance of an embodiment of the present invention.

Figure 44B:
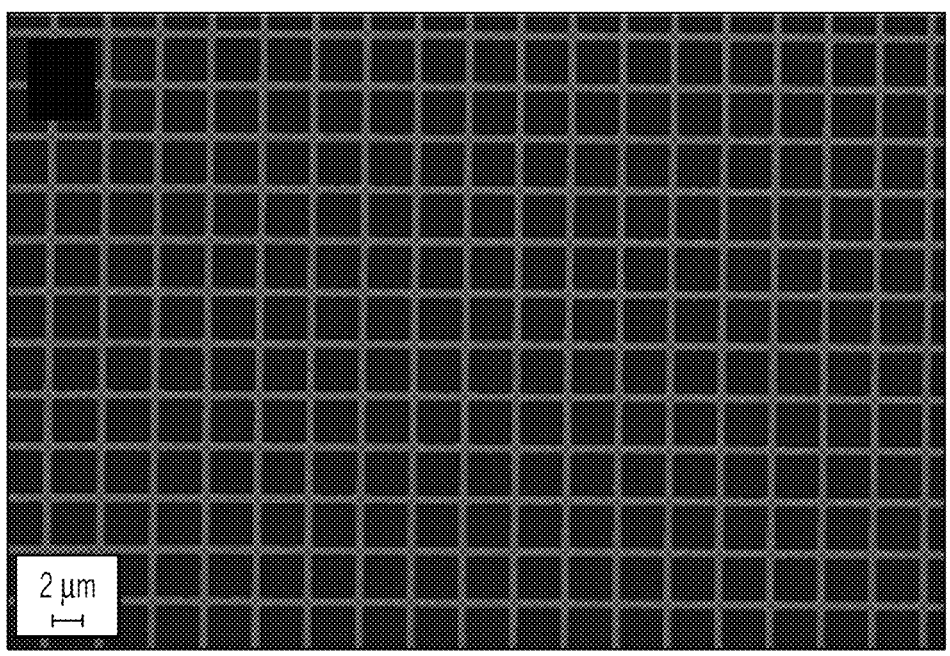
FIGS. 44B-44C are scanning electron microscope (SEM) images of the fine grid pattern in accordance of an embodiment of the present invention.
Figure 44C:
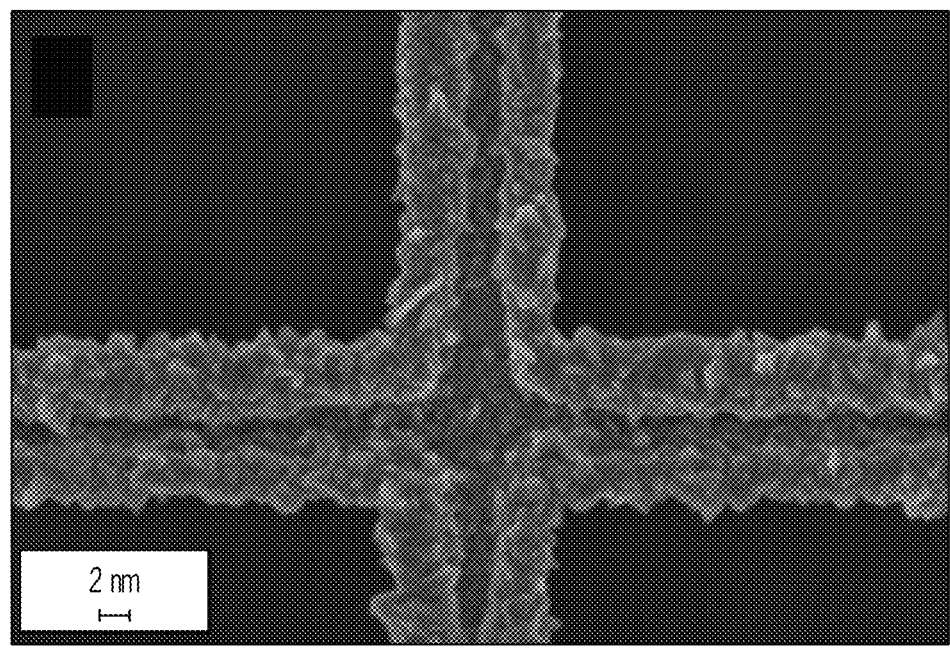

FIGS. 44B-44C are SEM images of the fine grid pattern in accordance of an embodiment of the present invention.

Figure 44D:
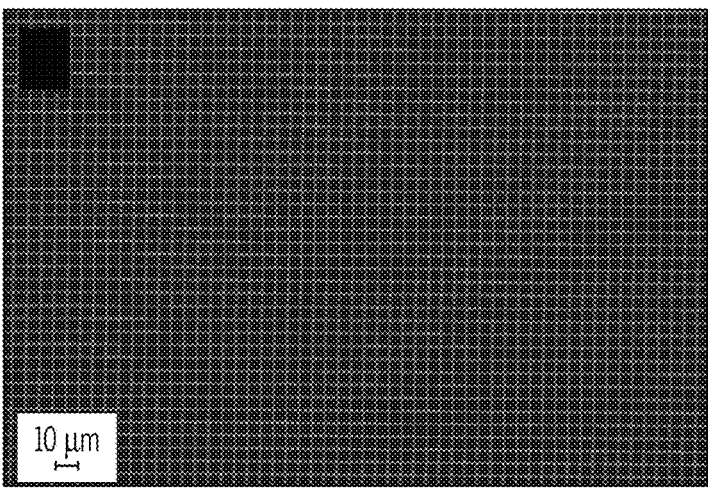
FIGS. 44D-44F are SEM images of the coarse grid pattern after 60 seconds of ECu plating in accordance of an embodiment of the present invention.
Figure 44E:
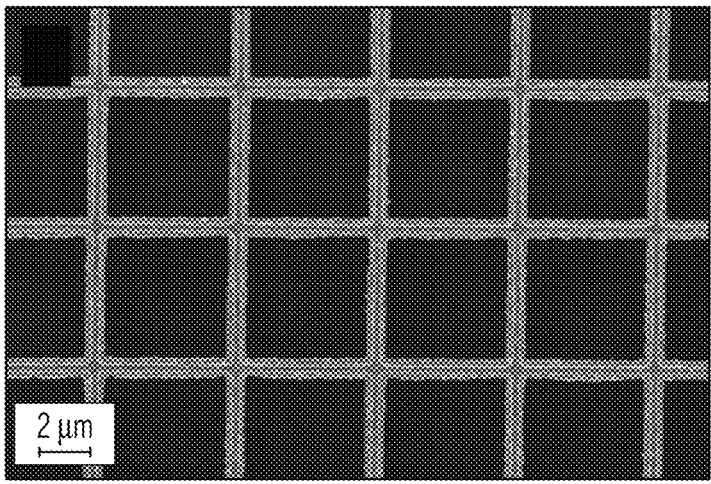
Figure 44F:
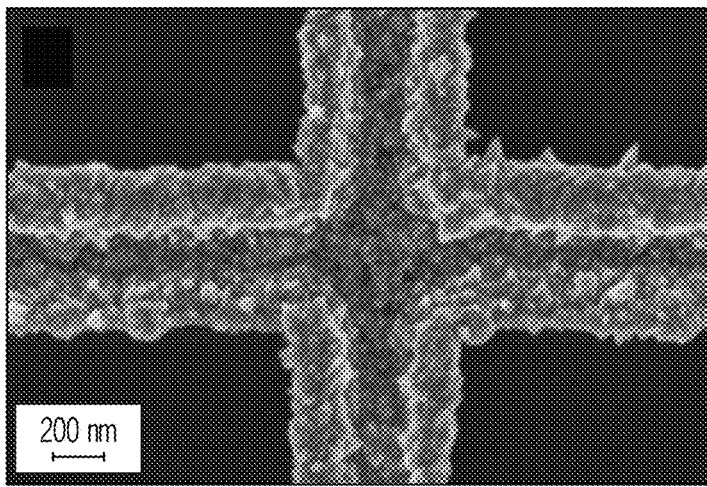

FIGS. 44D-44F are SEM images of the coarse grid pattern after 60 seconds of ECu plating in accordance of an embodiment of the present invention.

Slight Cu deposits are seen around the edge of the patterned quartz wafer in FIG. 44A since the Pd seed was sputtered over the entire face of the wafer but was mostly removed under exposure to the LIS. In both the fine and coarse grid geometries, high-quality selective ECu plating is observed and is continuous throughout the trenches. Defect density and the total number of defects are extremely low exemplifying the robustness of the Etch process approach. Furthermore, average Cu grain size is on par with other electroless plating films i.e., ~45 nm.

An alternative embodiment to method 4200 includes depositing Pd via atomic layer deposition in the trenches before ECu plating.

The LIS etch process approach discussed above has successfully demonstrated selective electroless Cu deposition of high quality and uniformity within subwavelength trench geometries. Cu metal nano-mesh grids with remarkably low defect densities may be fabricated on stiff and flexible (quartz and PC) substrates using the Etch process.

Based on experimental work using the Etch process approach discussed above, the following has been learned. The Pd catalyst is not corrupted by application of adhesion promoting polymeric material and subsequent RLT etch by LIS exposure. The Etch process flow is capable of high-quality selective electroless Cu plating within trenches. Furthermore, LIS exposure mills the Pd seed layer in addition to organic resist and adhesion promoter layers. The LIS etch is anisotropic in the vertical and horizontal directions.

Consequently, the principles of the present invention provide an imprint, etch and electroless plating process for fabricating nanoscale metal mesh TCEs on flexible substrates suitable for R2R processing. Performance of fabricated metal mesh electrodes using the proposed nanofabrication process surpasses predictive models for transmittance and conductivity with significant opportunity for optimization.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A roll-to-roll nanoimprint lithography process by patterning nanoscale features using a roll-based manufacturing template with nanoscale patterns held in a roll-to-roll (R2R) configuration on to a substrate held in a roll-to-roll configuration, the process comprising:

driving said template and said substrate to be incoming at substantially a same speed and tension;

performing speed and tension matching of said substrate and said template in an imprinting region by a single driver, wherein said substrate and said template are made to contact each other along a single line through air bearings, wherein a vertical tip tilt stage is used to mount a bottom vacuum preloaded air bearing and provide gap control and alignment;

providing tension control of said substate and said template by a pair of vacuum rollers;

coating a film of a solution of nanoimprint resist material on said substrate;

performing an in-situ alignment of said substrate with said template;

initiating a substantially point or line contact between said incoming template and said incoming substrate;

exercising control over an out-of-plane deflection profile of said substrate or said template;

crosslinking said resist material with UV light while said out-of-plane deflection profile of said template matches a surface profile of a top surface of said substrate; and separating said template from said substrate through manipulation of said substrate or said template.

2. The process as recited in claim 1, wherein said resist material is coated on said substrate using slot-die coating, tensioned-web slot-die coating, kiss gravure coating, micro-gravure coating, doctor blading, knife-edge coating, or a combination thereof to control a residual layer thickness of said resist material.

3. The process as recited in claim 1, wherein drops of said resist material are ink jetted on pre-determined locations on said film of said solution of said resist material on said substrate to control a residual layer thickness of said resist material on said substrate.

4. The process as recited in claim 1, wherein the process is start-and-stop or continuous.

5. The process as recited in claim 1, wherein a sidelay module is configured to ensure that a web does not displace laterally due to accumulating errors.

6. The process as recited in claim 1, wherein the process comprises nanoscale overlay control.

7. The process as recited in claim 1 further comprising:

performing an application of non-uniform heat flux along an imprinted area of said substrate or said template to correct higher order overlay errors.

8. The process as recited in claim 1, wherein said process is used to fabricate thin film transistor features.

\* \* \* \* \*